United States Patent
Iizuka et al.

(10) Patent No.: US 6,838,316 B2
(45) Date of Patent: Jan. 4, 2005

(54) SEMICONDUCTOR DEVICE MANUFACTURING METHOD USING ULTRASONIC FLIP CHIP BONDING TECHNIQUE

(75) Inventors: Kazuhiro Iizuka, Yokohama (JP); Shinya Takyu, Kitakatsushika-gun (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/378,862

(22) Filed: Mar. 5, 2003

(65) Prior Publication Data

US 2003/0180986 A1 Sep. 25, 2003

(30) Foreign Application Priority Data

Mar. 6, 2002 (JP) ........................................ 2002-060700

(51) Int. Cl.[7] .................... H01L 21/44; H01L 21/48; H01L 21/50
(52) U.S. Cl. .................. 438/107; 438/108; 438/120; 438/613
(58) Field of Search .................... 438/120, 108

(56) References Cited

U.S. PATENT DOCUMENTS

| | | | | |
|---|---|---|---|---|
| 4,906,011 A | * | 3/1990 | Hiyamizu et al. ............... 279/3 |
| 5,427,301 A | | 6/1995 | Pham et al. | |
| 5,683,942 A | * | 11/1997 | Kata et al. ................... 438/118 |
| 6,093,971 A | * | 7/2000 | Oppermann et al. ......... 257/783 |
| 6,269,999 B1 | * | 8/2001 | Okazaki et al. ............ 228/110.1 |
| 6,399,419 B1 | * | 6/2002 | Shibata et al. ............... 438/108 |
| 6,437,450 B1 | * | 8/2002 | Baba et al. .................. 257/778 |
| 6,544,819 B2 | * | 4/2003 | Odajima et al. ............. 438/118 |
| 6,576,499 B2 | * | 6/2003 | Funaya et al. ............... 438/125 |
| 6,650,011 B2 | * | 11/2003 | Partosa et al. ............... 257/703 |
| 2002/0048848 A1 | * | 4/2002 | Ikegami ....................... 438/108 |
| 2002/0070459 A1 | * | 6/2002 | Iwasaki et al. ............... 257/778 |

FOREIGN PATENT DOCUMENTS

| | | |
|---|---|---|
| JP | 1-123344 | 8/1989 |
| JP | 11-074315 | 3/1999 |
| JP | 11-111755 | 4/1999 |
| JP | 2001-298146 | 10/2001 |
| JP | 2002-289644 | 10/2002 |

OTHER PUBLICATIONS

Communication from Japanese Patent Office dated Jun. 22, 2004, and the English translation thereof.

* cited by examiner

Primary Examiner—John F. Niebling
Assistant Examiner—Angel Roman
(74) Attorney, Agent, or Firm—Finnegan, Henderson, Farabow, Garrett & Dunner, L.L.P.

(57) ABSTRACT

A bump is formed on at least one of a semiconductor chip and printed circuit board. A sealing material is applied to the surface of one of the semiconductor chip and printed circuit board. The printed circuit board is flip-chip-connected to the semiconductor chip via the sealing material while ultrasonic waves are applied to the printed circuit board to promote bonding by the bump.

17 Claims, 44 Drawing Sheets

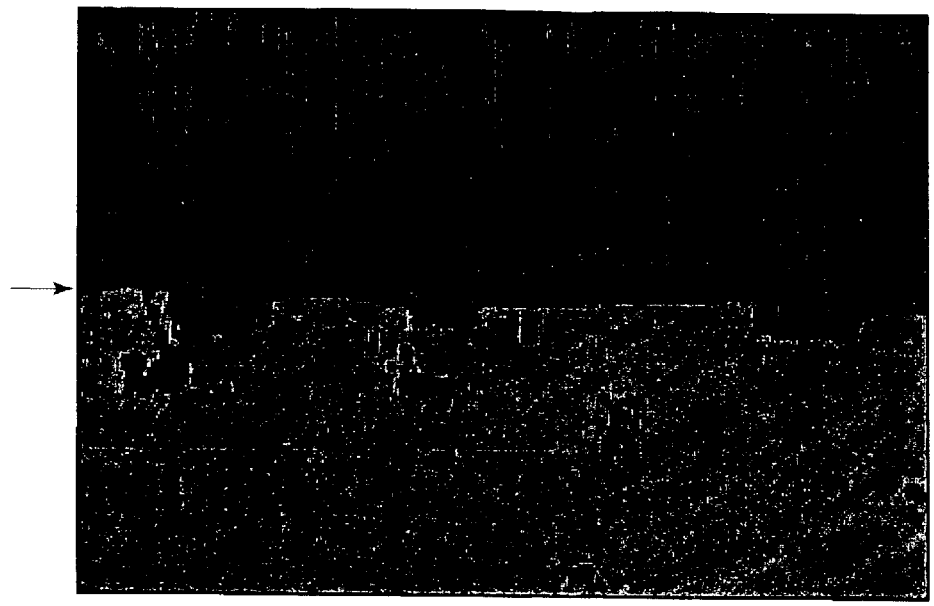
F I G. 4A
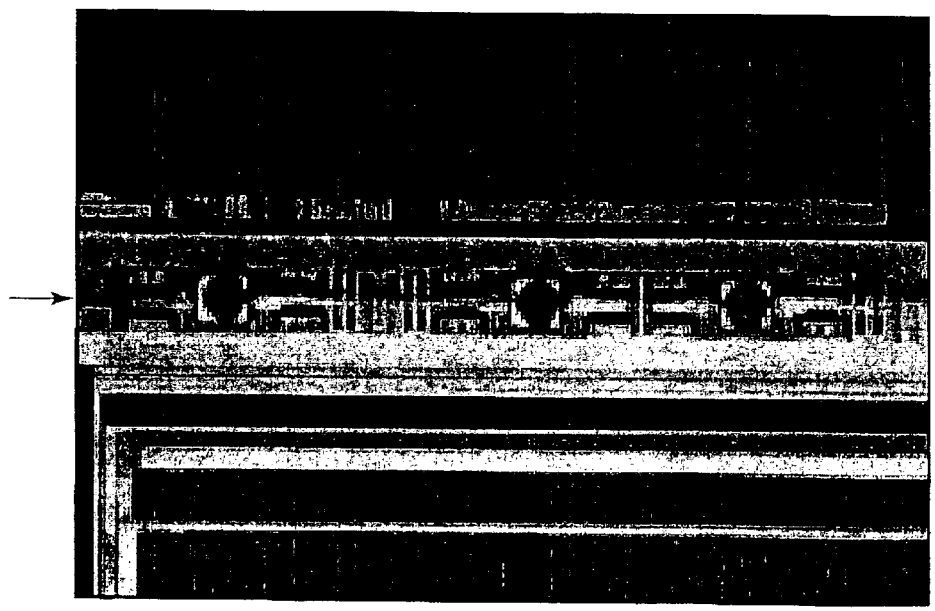
F I G. 4B

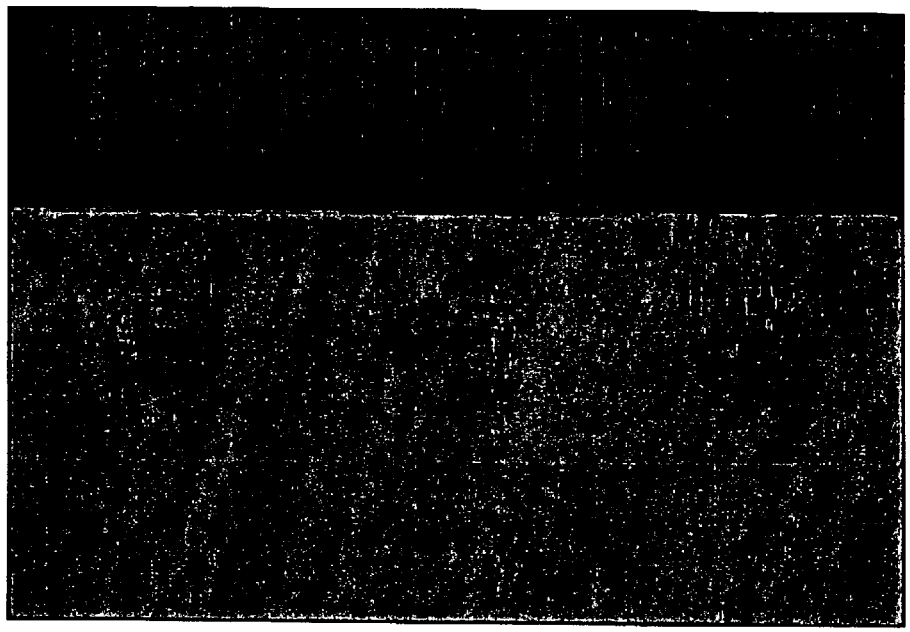
F I G. 5A
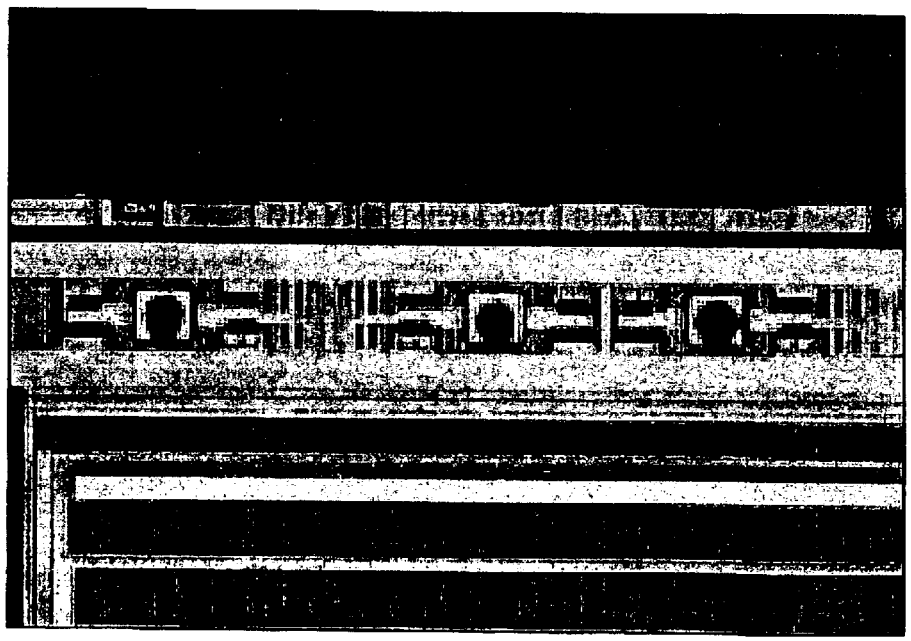
F I G. 5B

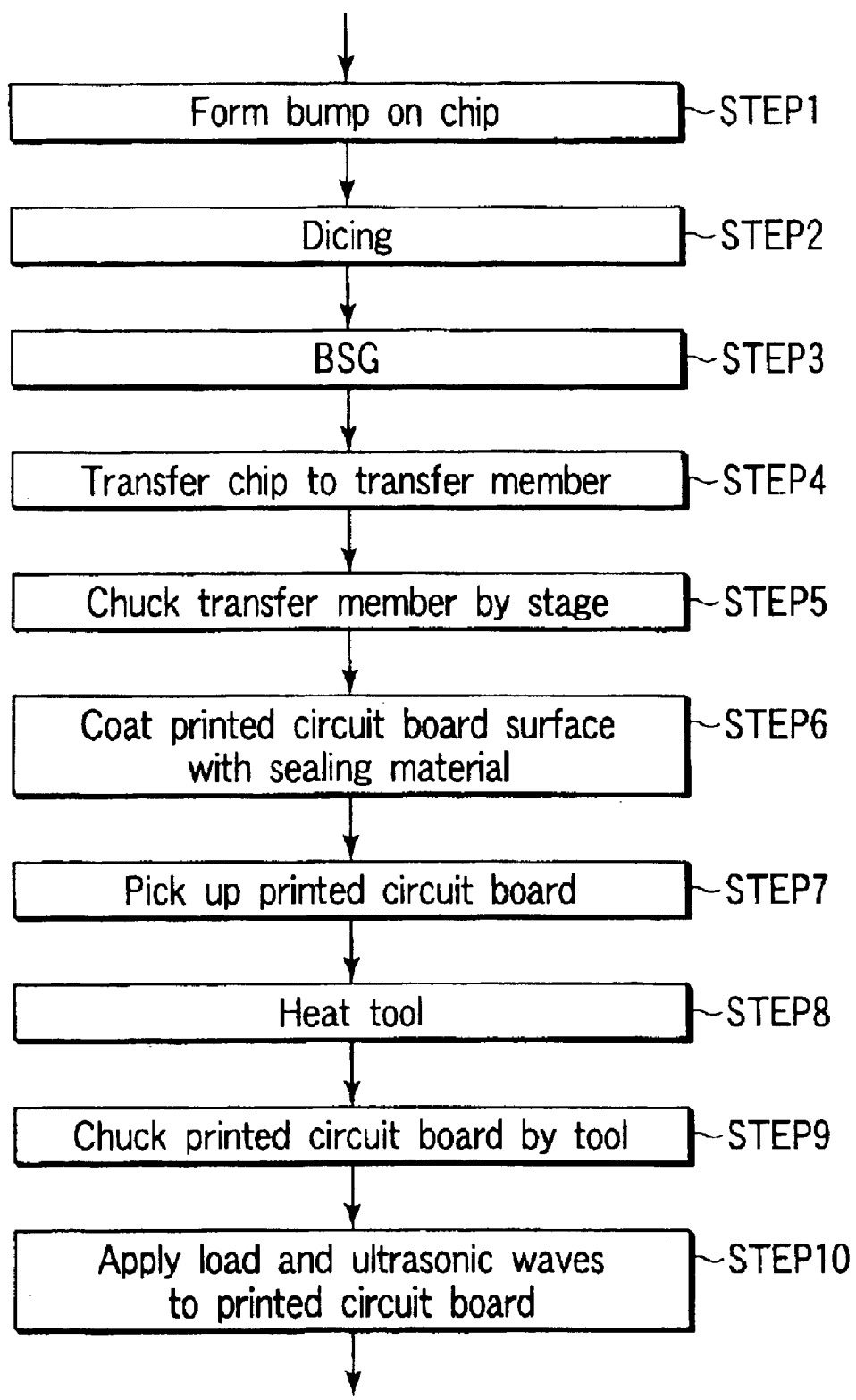
F I G. 33

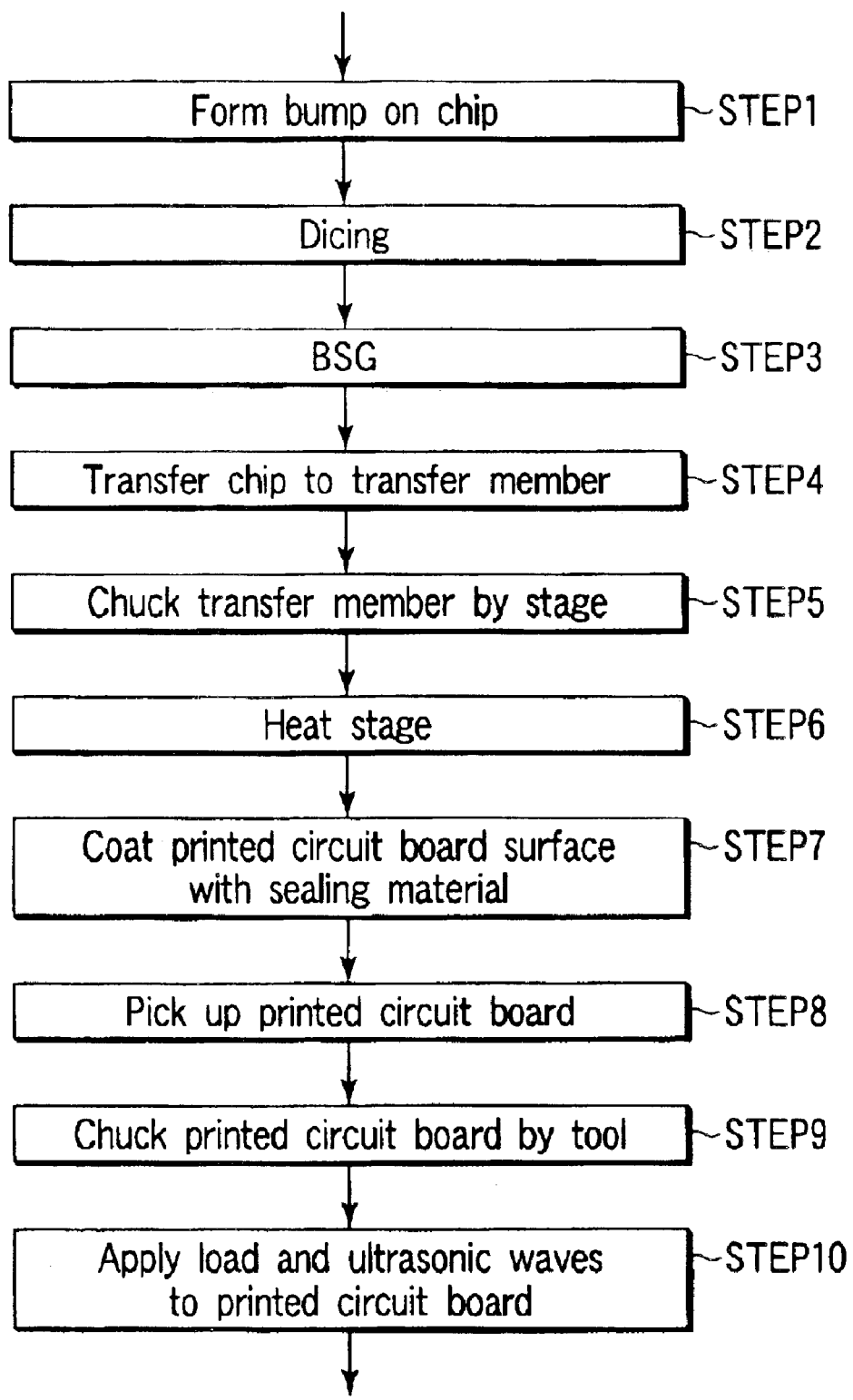
F I G. 36

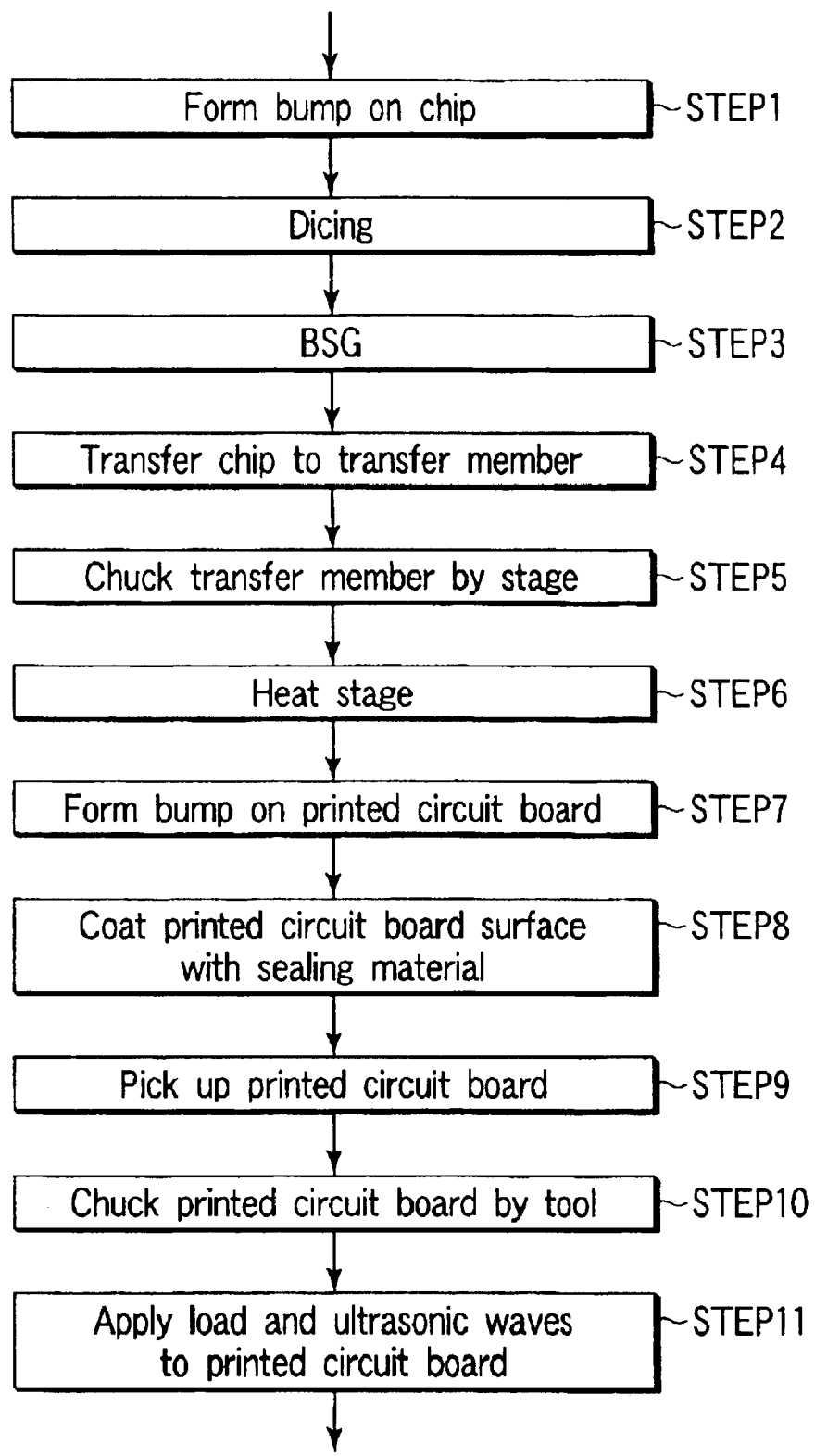
F I G. 38

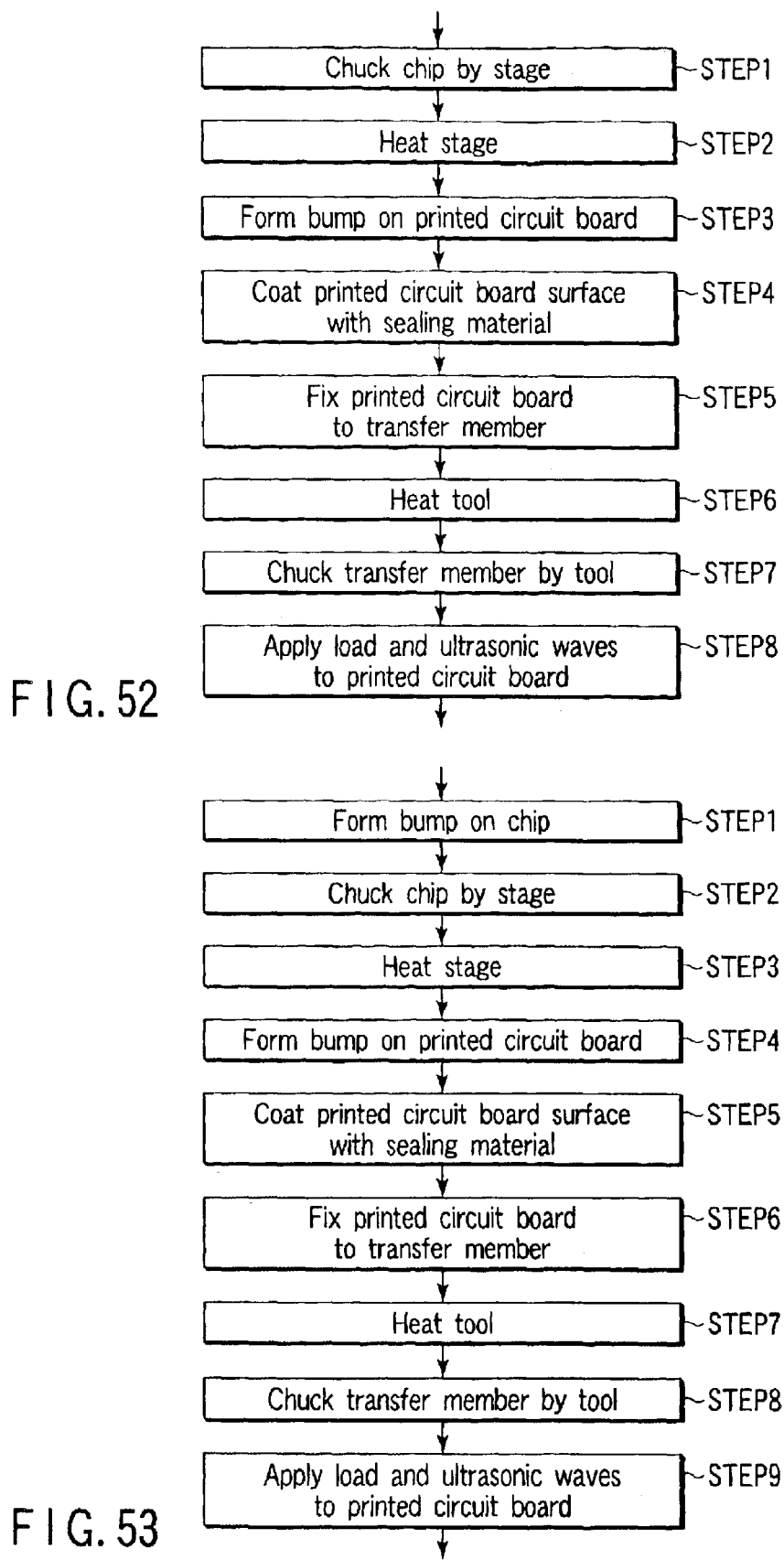

SEMICONDUCTOR DEVICE MANUFACTURING METHOD USING ULTRASONIC FLIP CHIP BONDING TECHNIQUE

CROSS-REFERENCE TO RELATED APPLICATIONS

This application is based upon and claims the benefit of priority from the prior Japanese Patent Application No. 2002-060700, filed Mar. 6, 2002, the entire contents of which are incorporated herein by reference.

BACKGROUND OF THE INVENTION

1. Field of the Invention

The present invention relates to a semiconductor device manufacturing method and, more particularly, to an ultrasonic flip chip bonding technique of packaging a flip chip.

2. Description of the Related Art

In an ultrasonic flip chip bonding technique, a printed circuit board is chucked by a heatable fixing jig called a stage. A semiconductor chip (semiconductor element) is packaged while being chucked by an apparatus having a pressure & ultrasonic application mechanism called a tool or a mechanism also using heating. At this time, the element formation surface of the semiconductor chip and the wiring electrode formation surface of the printed circuit board are faced to each other in order to bond a stud bump formed on the electrode of the semiconductor chip and a plated bump or stud bump formed on the wiring electrode of the printed circuit board. While ultrasonic waves are applied from the tool to the semiconductor chip, a load is also applied. In some cases, the semiconductor chip and printed circuit board are bonded while the tool or stage is heated to heat either or both of the semiconductor chip and printed circuit board, in addition to application of ultrasonic waves and the load.

A flip chip process using ultrasonic waves and an apparatus therefor are disclosed in, e.g., U.S. Pat. No. 5,427,301.

In the conventional semiconductor device manufacturing method, a bump formed on the electrode of a semiconductor chip does not uniformly contact a wiring electrode on the printed circuit board in case of insufficient parallelism adjustment between the tool and the stage or insufficient perpendicularity of the bonding surfaces of the tool and stage in the pressure direction of the tool. Thus, the stress concentrates on a bump which first contacts the wiring electrode. The bump readily peels or misaligns from the wiring electrode, and is bonded again to the electrode of the semiconductor chip at the misaligned position. This bonding state is less reliable, and the bump may come off the electrode of the semiconductor chip in the worst case.

To improve the connectivity and reliability in the ultrasonic flip chip bonding technique, adjustment of the parallelism and perpendicularity of the tool and stage is important. However, these adjustments require a precision of several $\mu$m, are very difficult, and take about 2 hours regardless of any state-of-the-art apparatus.

Recently, strong demands have arisen for thinner semiconductor chips in order to incorporate a semiconductor chip into, e.g., a card-like thin package. To meet this demand, the lower surface of a semiconductor wafer is ground and etched to 100 $\mu$m or less. However, a semiconductor chip as thin as 100 $\mu$m or less is damaged by ultrasonic vibrations in flip chip connection, generating a defect such as a scratch or crack.

To chuck a semiconductor chip, a chuck hole is formed in the tool for evacuation. When a sealing resin layer is interposed between a semiconductor chip and a printed circuit board and simultaneous flip chip connection including the sealing step is performed, the semiconductor chip deforms due to the resin stress concentrated in the chuck hole because of a thin semiconductor chip, damaging the semiconductor chip. For this reason, a load enough for bonding cannot be applied between the semiconductor chip and the printed circuit board.

As a measure to solve this problem, the pressure is applied for connection using a flat tool having no chuck hole after temporary fixing by low-pressure alignment. Alternatively, a semiconductor chip is chucked by porous chucking. However, the former method increases the number of manufacturing steps, whereas the latter method decreases the tool durability by ultrasonic vibrations. Either method is not a permanent measure.

As described above, it is difficult for the conventional semiconductor device manufacturing method to improve the connectivity. A thin semiconductor chip may be damaged in flip chip connection.

BRIEF SUMMARY OF THE INVENTION

According to an aspect of the present invention, there is provided a semiconductor device manufacturing method comprising forming a bump on at least one of a semiconductor chip and a printed circuit board, applying a sealing material to a surface of one of the semiconductor chip and the printed circuit board, and flip-chip-connecting the printed circuit board to the semiconductor chip via the sealing material while applying ultrasonic waves to the printed circuit board to promote bonding by the bump.

According to another aspect of the present invention, there is provided a semiconductor device manufacturing method comprising forming a bump on at least one of a semiconductor chip and a printed circuit board, applying a sealing material to a surface of one of the semiconductor chip and the printed circuit board, and flip-chip-connecting the printed circuit board to the semiconductor chip via the sealing material while applying a first ultrasonic wave to the printed circuit board and applying a second ultrasonic wave to the semiconductor chip at a power lower than a power of the first ultrasonic wave to promote bonding by the bump.

BRIEF DESCRIPTION OF THE SEVERAL VIEWS OF THE DRAWING

FIG. 4A is a view showing the photomicrograph of the lower surface of a semiconductor chip for explaining damage to a semiconductor chip in the use of a conventional method of applying ultrasonic waves to a semiconductor chip, facing down the semiconductor chip, and mounting it on a printed circuit board;

FIG. 4B is a view showing the photomicrograph of the upper surface of a semiconductor chip for explaining damage to a semiconductor chip in the use of the conventional method of applying ultrasonic waves to a semiconductor chip, facing down the semiconductor chip, and mounting it on a printed circuit board;

FIG. 5A is a view showing the photomicrograph of the lower surface of a semiconductor chip for explaining damage to a semiconductor chip in the use of a method of applying ultrasonic waves to a printed circuit board, facing down the printed circuit board, and mounting it on a semiconductor chip according to the embodiment;

FIG. 5B is a view showing the photomicrograph of the upper surface of a semiconductor chip for explaining damage to a semiconductor chip in the use of the method of applying ultrasonic waves to a printed circuit board, facing down the printed circuit board, and mounting it on a semiconductor chip according to the embodiment;

FIG. 33 is a flow chart showing a manufacturing process regarding the ultrasonic flip chip bonding technique for explaining a semiconductor device manufacturing method according to the 28th embodiment of the present invention;

FIG. 36 is a flow chart showing a manufacturing process regarding the ultrasonic flip chip bonding technique for explaining a semiconductor device manufacturing method according to the 31st embodiment of the present invention;

FIG. 38 is a flow chart showing a manufacturing process regarding the ultrasonic flip chip bonding technique for explaining a semiconductor device manufacturing method according to the 33rd embodiment of the present invention;

FIG. 52 is a flow chart showing a manufacturing process regarding the ultrasonic flip chip bonding technique for explaining a semiconductor device manufacturing method according to the 47th embodiment of the present invention;

FIG. 53 is a flow chart showing a manufacturing process regarding the ultrasonic flip chip bonding technique for explaining a semiconductor device manufacturing method according to the 48th embodiment of the present invention;

DETAILED DESCRIPTION OF THE INVENTION

Figure 1:
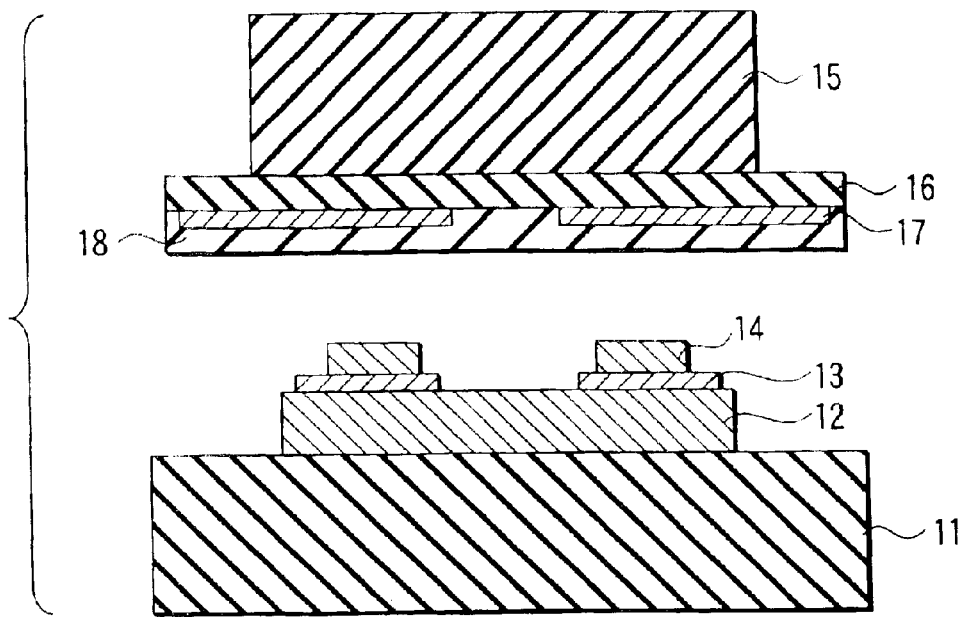
FIG. 1 is a sectional view showing a state before flip chip packaging for explaining the outline of a semiconductor device manufacturing method according to each embodiment of the present invention.
Figure 2:
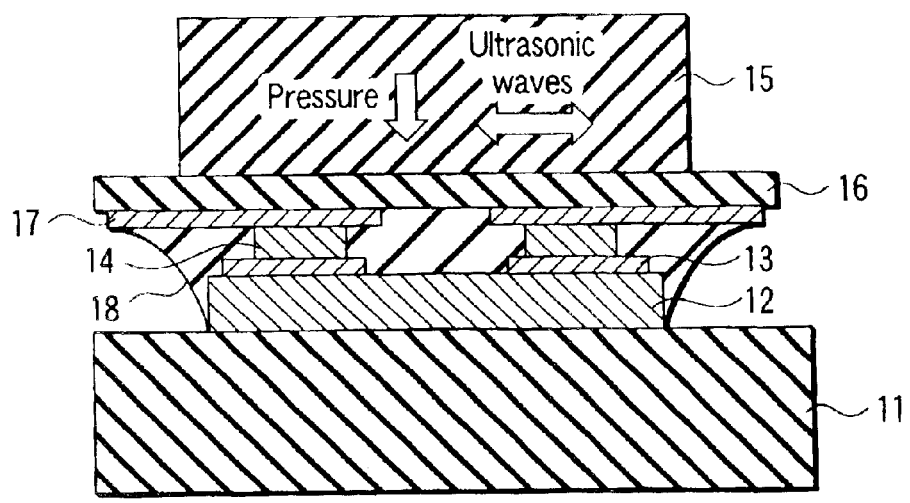
FIG. 2 is a sectional view showing a state in flip chip packaging for explaining the outline of the semiconductor device manufacturing method according to each embodiment of the present invention.

FIGS. 1 and 2 are views for explaining the outline of a semiconductor device manufacturing method according to each embodiment of the present invention. FIG. 1 shows a state before flip chip packaging, and FIG. 2 shows a state in flip chip packaging.

As shown in FIG. 1, a surface of a semiconductor chip (semiconductor element) 12 opposite to an element formation surface is chucked (porous-chucked) and fixed onto a stage (porous stage) 11 whose chucking surface is made of a porous material. An electrode 13 is formed on the element formation surface of the semiconductor chip 12, and a stud bump 14 is formed on the electrode 13.

A tool 15 chucks a surface of a printed circuit board 16 opposite to a formation surface for a wiring electrode 17. The tool 15 has a pressure & ultrasonic application mechanism. The wiring electrode 17 of the printed circuit board 16 faces the stud bump 14. The wiring electrode 17 of the printed circuit board 16 (or the element formation surface of the semiconductor chip 12) is coated with a resin layer serving as a sealing material 18.

The tool 15 and stage 11 are aligned with each other (in other words, the stud bump 14 and wiring electrode 17 are aligned with each other). As shown in FIG. 2, the tool 15 is moved down with the printed circuit board 16 facing down. In this state, ultrasonic waves are applied using the pressure & ultrasonic application mechanism while the pressure is applied. Bonding of the wiring electrode 17 and stud bump 14 is promoted to electrically connect them. At the same time, simultaneous connection including the sealing step is performed by setting the resin layer.

The porous stage 11 may be equipped with a heating mechanism, ultrasonic application mechanism, or both of them, as needed. The tool 15 may further comprise a heating mechanism for heating, in addition to the pressure & ultrasonic application mechanism. One or both of the porous stage 11 and tool 15 are heated, or ultrasonic waves are applied to not only the tool 15 but also the porous stage 11 (note that ultrasonic waves are applied to the stage 11 at a power lower than that of ultrasonic waves applied to the tool 15 so as to prevent any damage such as a scratch or crack to the semiconductor chip 12). A flip chip can be connected while ultrasonic vibrations are applied to both the printed circuit board and semiconductor chip. In this case, the stud bump 14 is formed on the electrode 13 of the semiconductor chip 12, but may be formed on the wiring electrode 17 of the printed circuit board 16 or on both the electrode 13 and wiring electrode 17, as needed.

Figure 3:
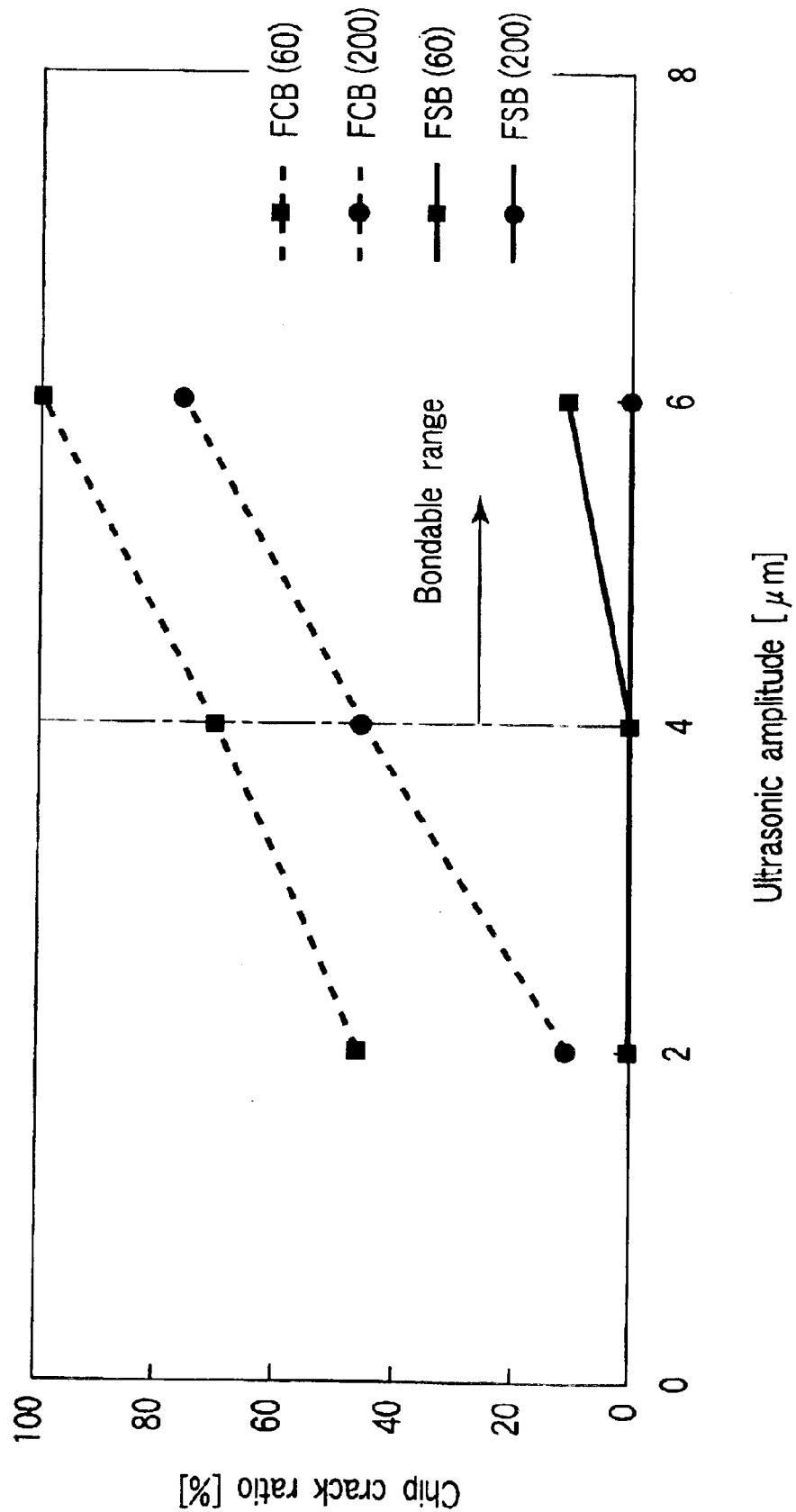
FIG. 3 is a diagram for explaining the relationship between the chip thickness and the chip crack ratio depending on differences in manufacturing method and ultrasonic wave amplitude.

FIG. 3 shows the relationship between the chip crack ratio [%] and the ultrasonic amplitude [μm] applied to the printed circuit board 16 in flip chip connection. FCB(60) represents a chip crack ratio in bonding by a conventional method in which ultrasonic waves are applied to a 60-μm thick semiconductor chip and the semiconductor chip is faced down and mounted on a printed circuit board. FCB(200) represents a chip crack ratio in bonding by the conventional method in which ultrasonic waves are applied to a 200-μm thick semiconductor chip and the semiconductor chip is faced down and mounted on a printed circuit board. FSB(60) represents a chip crack ratio in bonding by the method of the embodiment in which ultrasonic waves are applied to a printed circuit board and the printed circuit board is faced down and mounted on a 60-μm thick semiconductor chip. FSB(200) represents a chip crack ratio in bonding by the method of the embodiment in which ultrasonic waves are applied to a printed circuit board and the printed circuit board is faced down and mounted on a 200-μm thick semiconductor chip.

As is apparent from FIG. 3, even a relatively thick 200-μm semiconductor chip readily cracks when ultrasonic waves are applied to the semiconductor chip and the semiconductor chip is mounted in a face-down state. Particularly in a range of an ultrasonic amplitude of 4 μm or more where a sufficient bonding strength is considered to be obtained, nearly 50% of 200-μm thick semiconductor chips and 70% of 60-μm thick semiconductor chips crack. If the semiconductor chip is damaged to a scratch or the like even without any crack, a crack may occur from this scratch in a subsequent step or in use.

To the contrary, the method of the embodiment can attain a sufficient bonding strength. In the range of an ultrasonic amplitude of 4 μm or more, both 200- and 60-μm thick semiconductor chips hardly crack. In a range of an ultrasonic amplitude of 4 μm or more, e.g., an ultrasonic amplitude of 6 μm, merely 10% of 60-μm thin semiconductor chips crack.

Experiments by the present inventors reveal that ultrasonic conditions suitable for bonding are a frequency of 40 kHz and a power of 2,480 W or more.

FIGS. 4A and 4B are views for explaining damage to a semiconductor chip in the use of the conventional method of applying ultrasonic waves to a semiconductor chip, facing down the semiconductor chip., and mounting it on a printed circuit board. FIG. 4A shows the photomicrograph of the lower surface of the semiconductor chip. FIG. 4B shows the photomicrograph of the upper surface of the semiconductor chip. FIGS. 5A and 5B are views for explaining damage to a semiconductor chip in the use of the method of applying ultrasonic waves to a printed circuit board, facing down the printed circuit board, and mounting it on a semiconductor chip according to the embodiment. FIG. 5A shows the photomicrograph of the lower surface of the semiconductor chip. FIG. 5B shows the photomicrograph of the upper surface of the semiconductor chip.

When ultrasonic waves are applied to a semiconductor chip, and the semiconductor chip is faced down and mounted, the lower surface of the semiconductor chip is damaged and cracks at a position indicated by arrows, as shown in FIGS. 4A and 4B. In contrast, when ultrasonic waves are applied to a printed circuit board, and the printed circuit board is faced down and mounted, no crack occurs, and damage such as a scratch is hardly generated, as shown in FIGS. 5A and 5B.

Detailed examples and various modifications of the semiconductor device manufacturing method described with reference to FIGS. 1 and 2 will be explained by the first to 60th embodiments.

[First Embodiment]

Figure 6:
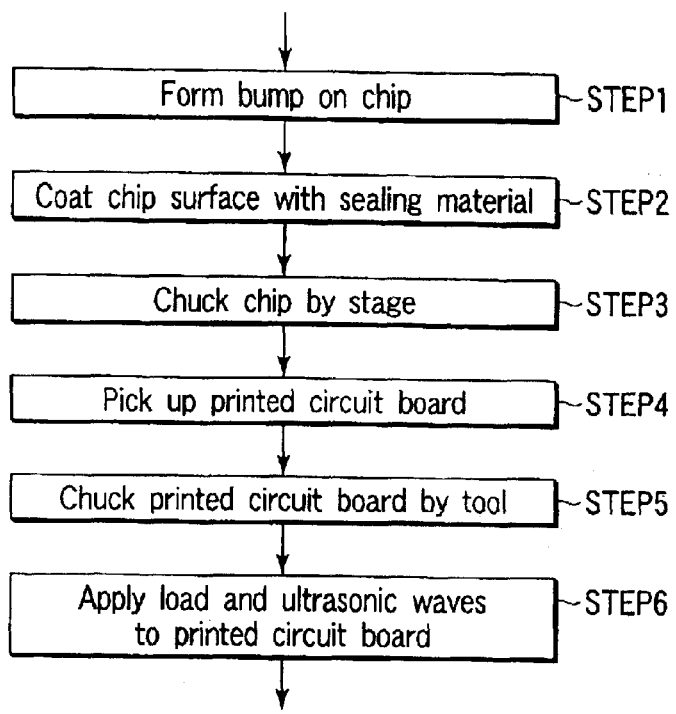
FIG. 6 is a flow chart showing a manufacturing process regarding an ultrasonic flip chip bonding technique for explaining a semiconductor device manufacturing method according to the first embodiment of the present invention.

FIG. 6 is a flow chart showing a manufacturing process regarding the ultrasonic flip chip bonding technique for explaining a semiconductor device manufacturing method according to the first embodiment of the present invention. Various elements are formed in a semiconductor substrate (wafer) by a known process. The wafer is then diced into chips along the dicing line or scribe line of the wafer by using a diamond scriber, diamond blade, laser scriber, or the like, thereby forming a semiconductor chip 12.

A stud bump 14 is formed on an electrode 13 of the chip 12 (STEP 1). The element formation surface (upper chip surface) of the chip 12 is coated with a sealing material 18 by spin-coating, e.g., a liquid resin (STEP 2). The sealing material 18 can also be formed by adhering a resin sheet. The lower surface of the chip 12 is chucked and fixed onto a porous stage 11 (STEP 3).

A printed circuit board 16 for mounting the chip 12 is picked up (STEP 4). A surface of the printed circuit board 16 opposite to a formation surface for a wiring electrode 17 is chucked by a tool 15 (STEP 5).

The tool 15 is moved above the porous stage 11 which holds the chip 12, and aligned (this state corresponds to FIG. 1). As shown in FIG. 2, the tool 15 is moved down with the printed circuit board 16 facing down. While a load is applied to the printed circuit board 16, ultrasonic waves are applied at, e.g., a frequency of 40 kHz and a power of 2,480 W, mounting the printed circuit board 16 on the chip 12 (STEP 6). At this time, the space between the chip 12 and the printed circuit board 16 is filled with the sealing material 18, performing simultaneous flip chip connection including the sealing step.

According to this manufacturing method, ultrasonic waves are applied to the printed circuit board 16 more flexible than the chip 12. A defect in the chip 12 such as a scratch or crack can be suppressed to reduce damage in flip chip connection. Further, a sufficient load and ultrasonic waves having a power and frequency (amplitude) suitable for ultrasonic bonding can be applied, suppressing bump misalignment and improving the connectivity.

Since the chip 12 is chucked by the porous stage 11, damage to the chip in the use of a chuck hole can be avoided. Simultaneous connection including not only electrical connection between the chip 12 and the printed circuit board 16 but also the sealing step by setting of a sealing resin (liquid resin or resin sheet) can be realized.

Since the entire lower surface of the chip 12 is chucked and fixed using the porous stage 11, the chip warpage can be straightened. In fixing using a chuck hole, the corner of the chip 12 cannot be fully straightened. However, the use of a porous material enables perfect warpage straightening.

[Second Embodiment]

Figure 7:
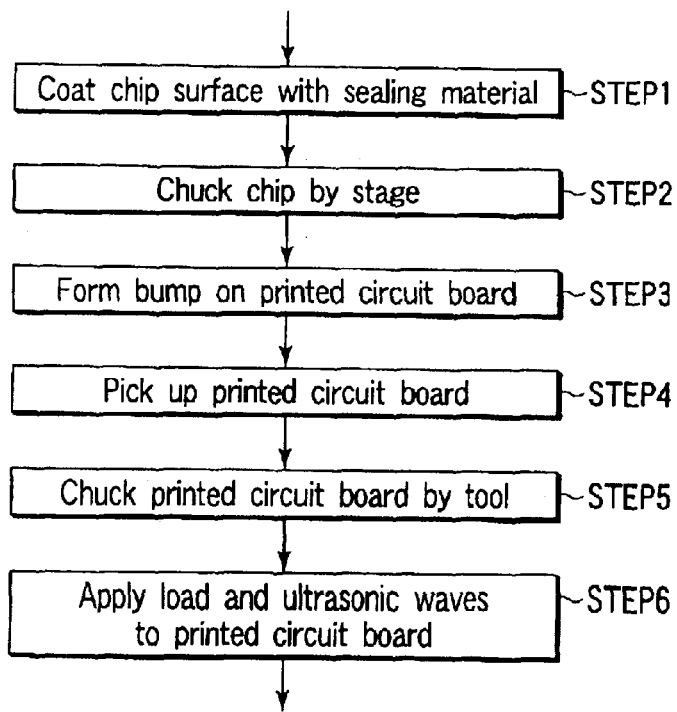
FIG. 7 is a flow chart showing a manufacturing process regarding the ultrasonic flip chip bonding technique for explaining a semiconductor device manufacturing method according to the second embodiment of the present invention.

FIG. 7 is a flow chart showing a manufacturing process regarding the ultrasonic flip chip bonding technique for explaining a semiconductor device manufacturing method according to the second embodiment of the present invention. Various elements are formed in a semiconductor substrate (wafer) by a known process. The wafer is then diced into chips along the dicing line or scribe line of the wafer by using a diamond scriber, diamond blade, laser scriber, or the like, thereby forming a semiconductor chip 12.

The element formation surface (upper chip surface) of the chip 12 is coated with a sealing material 18 by spin-coating, e.g., a liquid resin (STEP 1). The sealing material 18 can also be formed by adhering a resin sheet. The chip 12 is chucked and fixed onto a porous stage 11 (STEP 2). A stud bump is formed on a wiring electrode 17 of a printed circuit board 16 (STEP 3).

The printed circuit board 16 for mounting the chip 12 is picked up (STEP 4). A surface of the printed circuit board 16 opposite to a formation surface for the wiring electrode 17 is chucked by a tool 15 (STEP 5).

The tool 15 is moved above the porous stage 11 which holds the chip 12, and aligned (this state corresponds to FIG. 1). As shown in FIG. 2, the tool 15 is moved down with the printed circuit board 16 facing down. While a load is applied to the printed circuit board 16, ultrasonic waves are applied at, e.g., a frequency of 40 kHz and a power of 2,480 W, mounting the printed circuit board 16 on the chip 12 (STEP 6). At this time, the space between the chip 12 and the printed circuit board 16 is filled with the sealing material 18, performing simultaneous flip chip connection including the sealing step.

According to this manufacturing method, ultrasonic waves are applied to the printed circuit board 16 more flexible than the chip 12. A defect in the chip 12 such as a scratch or crack can be suppressed to reduce damage in flip chip connection. Further, a sufficient load and ultrasonic waves having a power and frequency (amplitude) suitable for ultrasonic bonding can be applied, suppressing bump misalignment and improving the connectivity.

Since the chip 12 is chucked by the porous stage 11, damage to the chip in the use of a chuck hole can be avoided. Simultaneous connection including not only electrical connection between the chip 12 and the printed circuit board 16 but also the sealing step by setting of a sealing resin (liquid resin or resin sheet) can be realized.

Since the entire lower surface of the chip 12 is chucked and fixed using the porous stage 11, the chip warpage can be straightened. In fixing using a chuck hole, the corner of the chip 12 cannot be fully straightened. However, the use of a porous material enables perfect warpage straightening.

[Third Embodiment]

Figure 8:
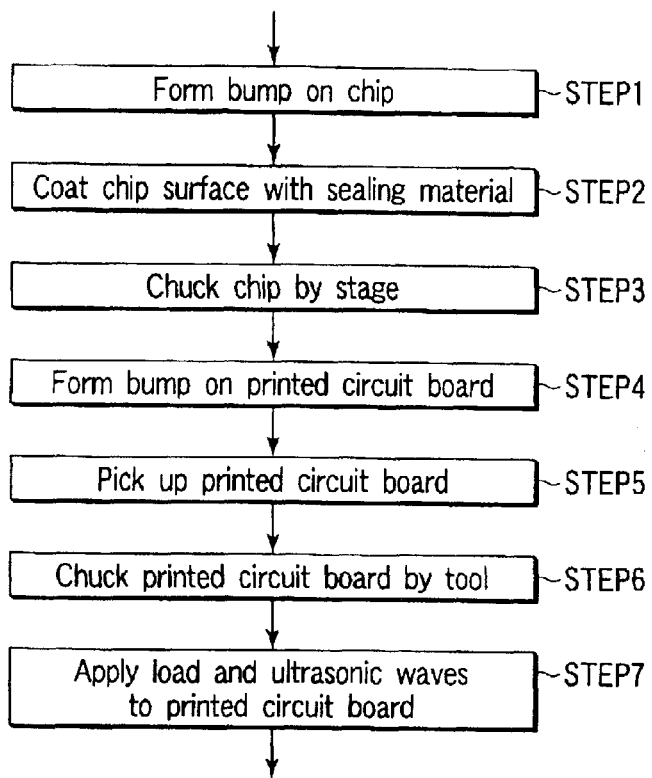
FIG. 8 is a flow chart showing a manufacturing process regarding the ultrasonic flip chip bonding technique for explaining a semiconductor device manufacturing method according to the third embodiment of the present invention.

FIG. 8 is a flow chart showing a manufacturing process regarding the ultrasonic flip chip bonding technique for explaining a semiconductor device manufacturing method according to the third embodiment of the present invention. Various elements are formed in a semiconductor substrate (wafer) by a known process. The wafer is then diced into chips along the dicing line or scribe line of the wafer by using a diamond scriber, diamond blade, laser scriber, or the like, thereby forming a semiconductor chip 12.

A stud bump 14 is formed on an electrode 13 of the chip 12 (STEP 1). The element formation surface (upper chip surface) of the chip 12 is coated with a sealing material 18 by spin-coating, e.g., a liquid resin (STEP 2). The sealing material 18 can also be formed by adhering a resin sheet. The lower surface of the chip 12 is chucked and fixed onto a porous stage 11 (STEP 3).

A stud bump is formed on a wiring electrode 17 of a printed circuit board 16 (STEP 4).

The printed circuit board 16 for mounting the chip 12 is picked up (STEP 5). A surface of the printed circuit board 16 opposite to a formation surface for the wiring electrode 17 is chucked by a tool 15 (STEP 6).

The tool 15 is moved above the porous stage 11 which holds the chip 12, and aligned (this state corresponds to FIG. 1). As shown in FIG. 2, the tool 15 is moved down with the printed circuit board 16 facing down. While a load is applied to the printed circuit board 16, ultrasonic waves are applied at, e.g., a frequency of 40 kHz and a power of 2,480 W, mounting the printed circuit board 16 on the chip 12 (STEP 7). At this time, the space between the chip 12 and the printed circuit board 16 is filled with the sealing material 18, performing simultaneous flip chip connection including the sealing step.

According to this manufacturing method, ultrasonic waves are applied to the printed circuit board 16 more flexible than the chip 12. A defect in the chip 12 such as a scratch or crack can be suppressed to reduce damage in flip chip connection. Further, a sufficient load and ultrasonic waves having a power and frequency (amplitude) suitable for ultrasonic bonding can be applied, suppressing bump misalignment and improving the connectivity.

Since the chip 12 is chucked by the porous stage 11, damage to the chip in the use of a chuck hole can be avoided. Simultaneous connection including not only electrical connection between the chip 12 and the printed circuit board 16 but also the sealing step by setting of a sealing resin (liquid resin or resin sheet) can be realized.

Since the entire lower surface of the chip 12 is chucked and fixed using the porous stage 11, the chip warpage can be straightened. In fixing using a chuck hole, the corner of the chip 12 cannot be fully straightened. However, the use of a porous material enables perfect warpage straightening.

[Fourth Embodiment]

Figure 9:
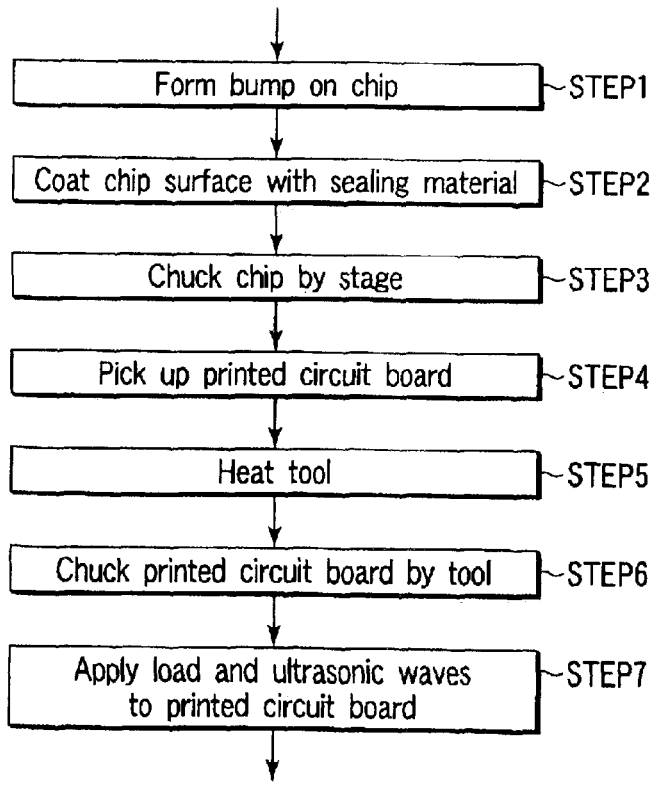
FIG. 9 is a flow chart showing a manufacturing process regarding the ultrasonic flip chip bonding technique for explaining a semiconductor device manufacturing method according to the fourth embodiment of the present invention.

FIG. 9 is a flow chart showing a manufacturing process regarding the ultrasonic flip chip bonding technique for explaining a semiconductor device manufacturing method according to the fourth embodiment of the present invention. Various elements are formed in a semiconductor substrate (wafer) by a known process. The wafer is then diced into chips along the dicing line or scribe line of the wafer by using a diamond scriber, diamond blade, laser scriber, or the like, thereby forming a semiconductor chip 12.

A stud bump 14 is formed on an electrode 13 of the chip 12 (STEP 1). The element formation surface (upper chip surface) of the chip 12 is coated with a sealing material 18 by spin-coating, e.g., a liquid resin (STEP 2). The sealing material 18 can also be formed by adhering a resin sheet. The lower surface of the chip 12 is chucked and fixed onto a porous stage 11 (STEP 3).

A printed circuit board 16 for mounting the chip 12 is picked up (STEP 4).

A tool 15 is heated (STEP 5), and a surface of the printed circuit board 16 opposite to a formation surface for a wiring electrode 17 is chucked by the tool 15 (STEP 6).

The tool 15 is moved above the porous stage 11 which holds the chip 12, and aligned (this state corresponds to FIG. 1). As shown in FIG. 2, the tool 15 is moved down with the printed circuit board 16 facing down. While a load is applied to the printed circuit board 16, ultrasonic waves are applied at, e.g., a frequency of 40 kHz and a power of 2,480 W, mounting the printed circuit board 16 on the chip 12 (STEP 7). At this time, the space between the chip 12 and the printed circuit board 16 is filled with the sealing material 18, performing simultaneous flip chip connection including the sealing step.

According to this manufacturing method, ultrasonic waves are applied to the printed circuit board 16 more flexible than the chip 12. A defect in the chip 12 such as a scratch or crack can be suppressed to reduce damage in flip chip connection. Further, a sufficient load and ultrasonic waves having a power and frequency (amplitude) suitable for ultrasonic bonding can be applied, suppressing bump misalignment and improving the connectivity.

Since the chip 12 is chucked by the porous stage 11, damage to the chip in the use of a chuck hole can be avoided. Simultaneous connection including not only electrical connection between the chip 12 and the printed circuit board 16 but also the sealing step by setting of a sealing resin (liquid resin or resin sheet) can be realized.

Since the entire lower surface of the chip 12 is chucked and fixed using the porous stage 11, any warpage can be straightened. In fixing using a chuck hole, the corner of the chip 12 cannot be fully straightened. However, the use of a porous material enables perfect warpage straightening.

Flip chip connection performed while heating the tool 15 can further promote and improve bonding.

[Fifth Embodiment]

Figure 10:
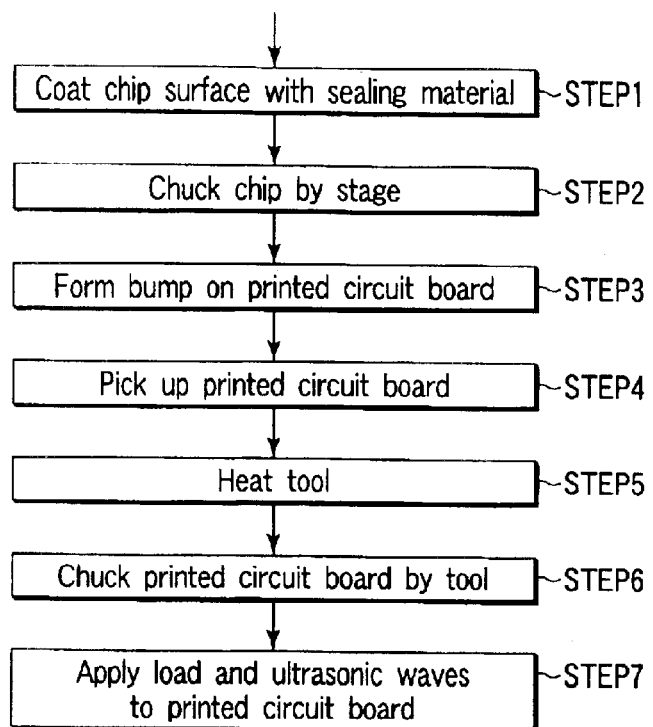
FIG. 10 is a flow chart showing a manufacturing process regarding the ultrasonic flip chip bonding technique for explaining a semiconductor device manufacturing method according to the fifth embodiment of the present invention.

FIG. 10 is a flow chart showing a manufacturing process regarding the ultrasonic flip chip bonding technique for explaining a semiconductor device manufacturing method according to the fifth embodiment of the present invention. Various elements are formed in a semiconductor substrate (wafer) by a known process. The wafer is then diced into chips along the dicing line or scribe line of the wafer by using a diamond scriber, diamond blade, laser scriber, or the like, thereby forming a semiconductor chip 12.

The element formation surface (upper chip surface) of the chip 12 is coated with a sealing material 18 by spin-coating, e.g., a liquid resin (STEP 1). The sealing material 18 can also be formed by adhering a resin sheet. The lower surface of the chip 12 is chucked and fixed onto a porous stage 11 (STEP 2).

A stud bump is formed on a wiring electrode 17 of a printed circuit board 16 (STEP 3), and the printed circuit board 16 is picked up (STEP 4).

A tool 15 is heated (STEP 5), and a surface of the printed circuit board 16 opposite to a formation surface for the wiring electrode 17 is chucked by the tool 15 (STEP 6).

The tool 15 is moved above the porous stage 11 which holds the chip 12, and aligned (this state corresponds to FIG. 1). As shown in FIG. 2, the tool 15 is moved down with the printed circuit board 16 facing down. While a load is applied to the printed circuit board 16, ultrasonic waves are applied at, e.g., a frequency of 40 kHz and a power of 2,480 W, mounting the printed circuit board 16 on the chip 12 (STEP 7). At this time, the space between the chip 12 and the printed circuit board 16 is filled with the sealing material 18, performing simultaneous flip chip connection including the sealing step.

According to this manufacturing method, ultrasonic waves are applied to the printed circuit board 16 more flexible than the chip 12. A defect in the chip 12 such as a scratch or crack can be suppressed to reduce damage in flip chip connection. Further, a sufficient load and ultrasonic waves having a power and frequency (amplitude) suitable for ultrasonic bonding can be applied, suppressing bump misalignment and improving the connectivity.

Since the chip 12 is chucked by the porous stage 11, damage to the chip in the use of a chuck hole can be avoided. Simultaneous connection including not only electrical connection between the chip 12 and the printed circuit board 16 but also the sealing step by setting of a sealing resin (liquid resin or resin sheet) can be realized.

Since the entire lower surface of the chip 12 is chucked and fixed using the porous stage 11, the chip warpage can be straightened. In fixing using a chuck hole, the corner of the chip 12 cannot be fully straightened. However, the use of a porous material enables perfect warpage straightening.

Flip chip connection performed while heating the tool 15 can further promote and improve bonding.

[Sixth Embodiment]

Figure 11:
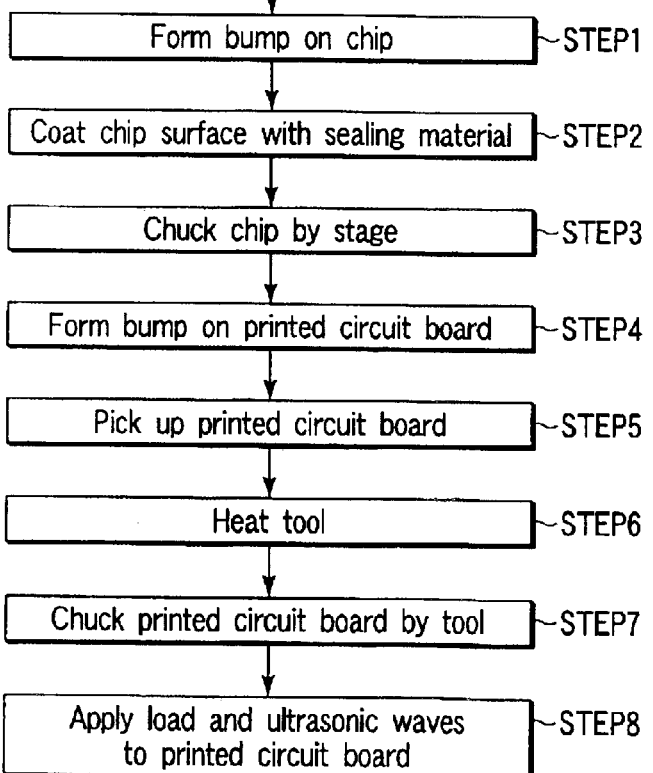
FIG. 11 is a flow chart showing a manufacturing process regarding the ultrasonic flip chip bonding technique for explaining a semiconductor device manufacturing method according to the sixth embodiment of the present invention.

FIG. 11 is a flow chart showing a manufacturing process regarding the ultrasonic flip chip bonding technique for explaining a semiconductor device manufacturing method according to the sixth embodiment of the present invention. Various elements are formed in a semiconductor substrate (wafer) by a known process. The wafer is then diced into chips along the dicing line or scribe line of the wafer by using a diamond scriber, diamond blade, laser scriber, or the like, thereby forming a semiconductor chip 12.

A stud bump 14 is formed on an electrode 13 of the chip 12 (STEP 1). The element formation surface (upper chip surface) of the chip 12 is coated with a sealing material 18 by spin-coating, e.g., a liquid resin (STEP 2). The sealing material 18 can also be formed by adhering a resin sheet.

The lower surface of the chip 12 is chucked and fixed onto a porous stage 11 (STEP 3).

A stud bump is formed on a wiring electrode 17 of a printed circuit board 16 (STEP 4).

The printed circuit board 16 bearing the stud bump is picked up (STEP 5).

A tool 15 is heated (STEP 6), and a surface of the printed circuit board 16 opposite to a formation surface for the wiring electrode 17 is chucked by the tool 15 (STEP 7).

The tool 15 is moved above the porous stage 11 which holds the chip 12, and aligned (this state corresponds to FIG. 1). As shown in FIG. 2, the tool 15 is moved down with the printed circuit board 16 facing down. While a load is applied to the printed circuit board 16, ultrasonic waves are applied at, e.g., a frequency of 40 kHz and a power of 2,480 W, mounting the printed circuit board 16 on the chip 12 (STEP 8). At this time, the space between the chip 12 and the printed circuit board 16 is filled with the sealing material 18, performing simultaneous flip chip connection including the sealing step.

According to this manufacturing method, ultrasonic waves are applied to the printed circuit board 16 more flexible than the chip 12. A defect in the chip 12 such as a scratch or crack can be suppressed to reduce damage in flip chip connection. Further, a sufficient load and ultrasonic waves having a power and frequency (amplitude) suitable for ultrasonic bonding can be applied, suppressing bump misalignment and improving the connectivity.

Since the chip 12 is chucked by the porous stage 11, damage to the chip in the use of a chuck hole can be avoided. Simultaneous connection including not only electrical connection between the chip 12 and the printed circuit board 16 but also the sealing step by setting of a sealing resin (liquid resin or resin sheet) can be realized.

Since the entire lower surface of the chip 12 is chucked and fixed using the porous stage 11, the chip warpage can be straightened. In fixing using a chuck hole, the corner of the chip 12 cannot be fully straightened. However, the use of a porous material enables perfect warpage straightening.

Flip chip connection performed while heating the tool 15 can further promote and improve bonding.

[Seventh Embodiment]

Figure 12:
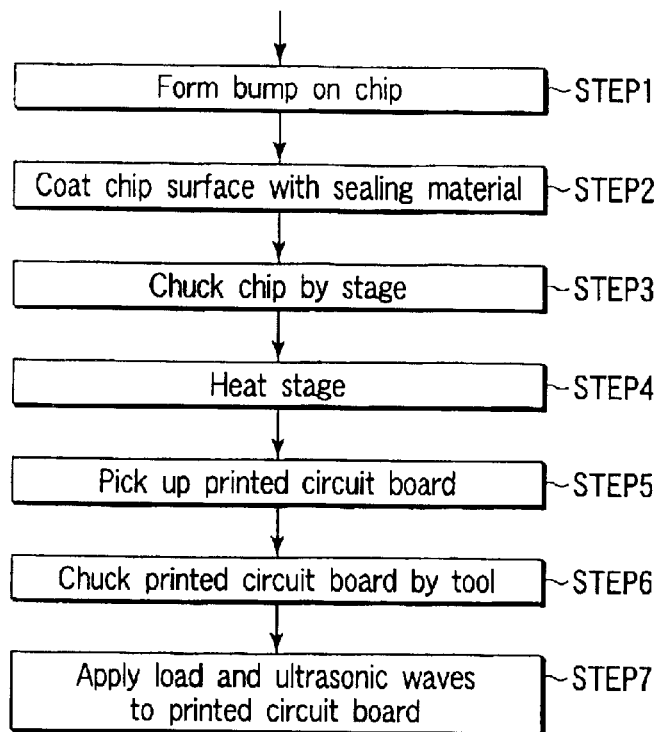
FIG. 12 is a flow chart showing a manufacturing process regarding the ultrasonic flip chip bonding technique for explaining a semiconductor device manufacturing method according to the seventh embodiment of the present invention.

FIG. 12 is a flow chart showing a manufacturing process regarding the ultrasonic flip chip bonding technique for explaining a semiconductor device manufacturing method according to the seventh embodiment of the present invention. Various elements are formed in a semiconductor substrate (wafer) by a known process. The wafer is then diced into chips along the dicing line or scribe line of the wafer by using a diamond scriber, diamond blade, laser scriber, or the like, thereby forming a semiconductor chip 12.

A stud bump 14 is formed on an electrode 13 of the chip 12 (STEP 1). The element formation surface (upper chip surface) of the chip 12 is coated with a sealing material 18 by spin-coating, e.g., a liquid resin (STEP 2). The sealing material 18 can also be formed by adhering a resin sheet. The lower surface of the chip 12 bearing the stud bump 14 and sealing material 18 is chucked and fixed onto a porous stage 11 (STEP 3). In this state, the porous stage 11 is heated (STEP 4).

A printed circuit board 16 for mounting the chip 12 is picked up (STEP 5). A surface of the printed circuit board 16 opposite to a formation surface for a wiring electrode 17 is chucked by the tool 15 (STEP 6).

The tool 15 is moved above the porous stage 11 which holds the chip 12, and aligned (this state corresponds to FIG. 1). As shown in FIG. 2, the tool 15 is moved down with the printed circuit board 16 facing down. While a load is applied to the printed circuit board 16, ultrasonic waves are applied at, e.g., a frequency of 40 kHz and a power of 2,480 W, mounting the printed circuit board 16 on the chip 12 (STEP 7). At this time, the space between the chip 12 and the printed circuit board 16 is filled with the sealing material 18, performing simultaneous flip chip connection including the sealing step.

According to this manufacturing method, ultrasonic waves are applied to the printed circuit board 16 more flexible than the chip 12. A defect in the chip 12 such as a scratch or crack can be suppressed to reduce damage in flip chip connection. Further, a sufficient load and ultrasonic waves having a power and frequency (amplitude) suitable for ultrasonic bonding can be applied, suppressing bump misalignment and improving the connectivity.

Since the chip 12 is chucked by the porous stage 11, damage to the chip in the use of a chuck hole can be avoided. Simultaneous connection including not only electrical connection between the chip 12 and the printed circuit board 16 but also the sealing step by setting of a sealing resin (liquid resin or resin sheet) can be realized.

Since the entire lower surface of the chip 12 is chucked and fixed using the porous stage 11, the chip warpage can be straightened. In fixing using a chuck hole, the corner of the chip 12 cannot be fully straightened. However, the use of a porous material enables perfect warpage straightening.

Flip chip connection performed while heating the porous stage 11 can promote and improve bonding.

[Eighth Embodiment]

Figure 13:
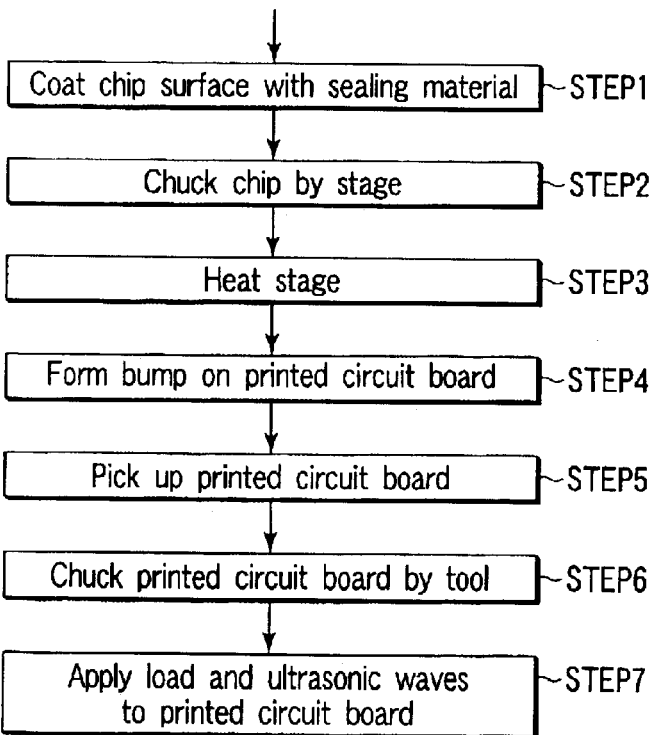
FIG. 13 is a flow chart showing a manufacturing process regarding the ultrasonic flip chip bonding technique for explaining a semiconductor device manufacturing method according to the eighth embodiment of the present invention.

FIG. 13 is a flow chart showing a manufacturing process regarding the ultrasonic flip chip bonding technique for explaining a semiconductor device manufacturing method according to the eighth embodiment of the present invention. Various elements are formed in a semiconductor substrate (wafer) by a known process. The wafer is then diced into chips along the dicing line or scribe line of the wafer by using a diamond scriber, diamond blade, laser scriber, or the like, thereby forming a semiconductor chip 12.

The element formation surface (upper chip surface) of the chip 12 is coated with a sealing material 18 by spin-coating, e.g., a liquid resin (STEP 1). The sealing material 18 can also be formed by adhering a resin sheet. The chip 12 is chucked and fixed onto a porous stage 11 (STEP 2). In this state, the porous stage 11 is heated (STEP 3).

A stud bump is formed on a wiring electrode 17 of a printed circuit board 16 (STEP 4).

A printed circuit board 16 bearing the stud bump is picked up (STEP 5). A surface of the printed circuit board 16 opposite to a formation surface for the wiring electrode 17 is chucked by a tool 15 (STEP 6).

The tool 15 is moved above the porous stage 11 which holds the chip 12, and aligned (this state corresponds to FIG. 1). As shown in FIG. 2, the tool 15 is moved down with the printed circuit board 16 facing down. While a load is applied to the printed circuit board 16, ultrasonic waves are applied at, e.g., a frequency of 40 kHz and a power of 2,480 W, mounting the printed circuit board 16 on the chip 12 (STEP 7). At this time, the space between the chip 12 and the printed circuit board 16 is filled with the sealing material 18, performing simultaneous flip chip connection including the sealing step.

According to this manufacturing method, ultrasonic waves are applied to the printed circuit board 16 more flexible than the chip 12. A defect in the chip 12 such as a scratch or crack can be suppressed to reduce damage in flip chip connection. Further, a sufficient load and ultrasonic waves having a power and frequency (amplitude) suitable for ultrasonic bonding can be applied, suppressing bump misalignment and improving the connectivity.

Since the chip 12 is chucked by the porous stage 11, damage to the chip in the use of a chuck hole can be avoided. Simultaneous connection including not only electrical connection between the chip 12 and the printed circuit board 16 but also the sealing step by setting of a sealing resin (liquid resin or resin sheet) can be realized.

Since the entire lower surface of the chip 12 is chucked and fixed using the porous stage 11, the chip warpage can be straightened. In fixing using a chuck hole, the corner of the chip 12 cannot be fully straightened. The use of a porous material enables perfect warpage straightening.

Flip chip connection performed while heating the porous stage 11 can promote and improve bonding.

[Ninth Embodiment]

Figure 14:
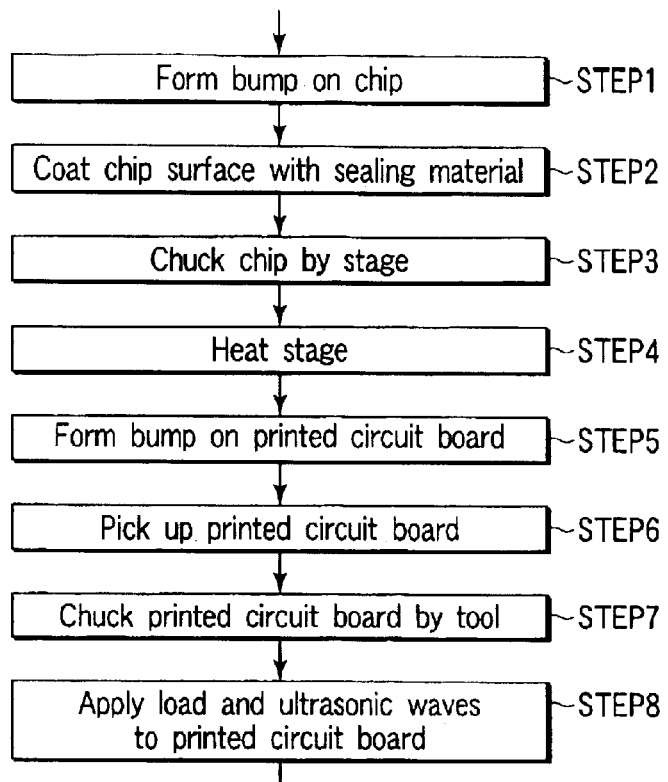
FIG. 14 is a flow chart showing a manufacturing process regarding the ultrasonic flip chip bonding technique for explaining a semiconductor device manufacturing method according to the ninth embodiment of the present invention.

FIG. 14 is a flow chart showing a manufacturing process regarding the ultrasonic flip chip bonding technique for explaining a semiconductor device manufacturing method according to the ninth embodiment of the present invention. Various elements are formed in a semiconductor substrate (wafer) by a known process. The wafer is then diced into chips along the dicing line or scribe line of the wafer by using a diamond scriber, diamond blade, laser scriber, or the like, thereby forming a semiconductor chip 12.

A stud bump 14 is formed on an electrode 13 of the chip 12 (STEP 1). The element formation surface (upper chip surface) of the chip 12 is coated with a sealing material 18 by spin-coating, e.g., a liquid resin (STEP 2). The sealing material 18 can also be formed by adhering a resin sheet. The lower surface of the chip 12 is chucked and fixed onto a porous stage 11 (STEP 3). In this state, the porous stage 11 is heated (STEP 4).

A stud bump is formed on a wiring electrode 17 of a printed circuit board 16 (STEP 5).

The printed circuit board 16 bearing the stud bump is picked up (STEP 6). A surface of the printed circuit board 16 opposite to a formation surface for the wiring electrode 17 is chucked by a tool 15 (STEP 7).

The tool 15 is moved above the porous stage 11 which holds the chip 12, and aligned (this state corresponds to FIG. 1). As shown in FIG. 2, the tool 15 is moved down with the printed circuit board 16 facing down. While a load is applied to the printed circuit board 16, ultrasonic waves are applied at, e.g., a frequency of 40 kHz and a power of 2,480 W, mounting the printed circuit board 16 on the chip 12 (STEP 8). At this time, the space between the chip 12 and the printed circuit board 16 is filled with the sealing material 18, performing simultaneous flip chip connection including the sealing step.

According to this manufacturing method, ultrasonic waves are applied to the printed circuit board 16 more flexible than the chip 12. A defect in the chip 12 such as a scratch or crack can be suppressed to reduce damage in flip chip connection. Further, a sufficient load and ultrasonic waves having a power and frequency (amplitude) suitable for ultrasonic bonding can be applied, suppressing bump misalignment and improving the connectivity.

Since the chip 12 is chucked by the porous stage 11, damage to the chip in the use of a chuck hole can be avoided. Simultaneous connection including not only electrical connection between the chip 12 and the printed circuit board 16 but also the sealing step by setting of a sealing resin (liquid resin or resin sheet) can be realized.

Since the entire lower surface of the chip 12 is chucked and fixed using the porous stage 11, the chip warpage can be straightened. In fixing using a chuck hole, the corner of the chip 12 cannot be fully straightened. However, the use of a porous material enables perfect warpage straightening.

Flip chip connection performed while heating the porous stage 11 can promote and improve bonding.

[10th Embodiment]

Figure 15:
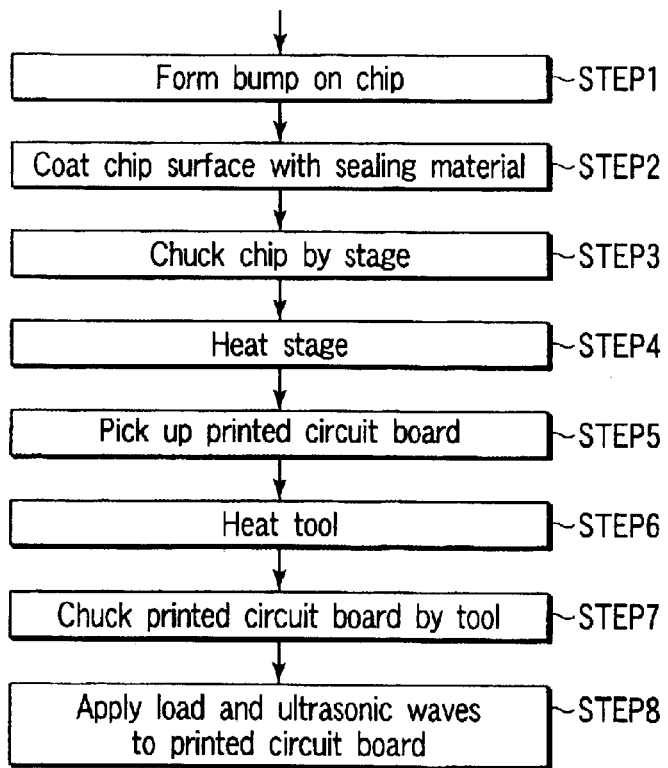
FIG. 15 is a flow chart showing a manufacturing process regarding the ultrasonic flip chip bonding technique for explaining a semiconductor device manufacturing method according to the 10th embodiment of the present invention.

FIG. 15 is a flow chart showing a manufacturing process regarding the ultrasonic flip chip bonding technique for explaining a semiconductor device manufacturing method according to the 10th embodiment of the present invention. Various elements are formed in a semiconductor substrate (wafer) by a known process. The wafer is then diced into chips along the dicing line or scribe line of the wafer by using a diamond scriber, diamond blade, laser scriber, or the like, thereby forming a semiconductor chip 12.

A stud bump 14 is formed on an electrode 13 of the chip 12 (STEP 1). The element formation surface (upper chip surface) of the chip 12 is coated with a sealing material 18 by spin-coating, e.g., a liquid resin (STEP 2). The sealing material 18 can also be formed by adhering a resin sheet. The lower surface of the chip 12 is chucked and fixed onto a porous stage 11 (STEP 3). In this state, the porous stage 11 is heated (STEP 4).

A printed circuit board 16 for mounting the chip 12 is picked up (STEP 5).

A tool 15 is heated (STEP 6), and a surface of the printed circuit board 16 opposite to a formation surface for a wiring electrode 17 is chucked by the tool 15 (STEP 7).

The tool 15 is moved above the porous stage 11 which holds the chip 12, and aligned (this state corresponds to FIG. 1). As shown in FIG. 2, the tool 15 is moved down with the printed circuit board 16 facing down. While a load is applied to the printed circuit board 16, ultrasonic waves are applied at, e.g., a frequency of 40 kHz and a power of 2,480 W, mounting the printed circuit board 16 on the chip 12 (STEP 8). At this time, the space between the chip 12 and the printed circuit board 16 is filled with the sealing material 18, performing simultaneous flip chip connection including the sealing step.

According to this manufacturing method, ultrasonic waves are applied to the printed circuit board 16 more flexible than the chip 12. A defect in the chip 12 such as a scratch or crack can be suppressed to reduce damage in flip chip connection. Further, a sufficient load and ultrasonic waves having a power and frequency (amplitude) suitable for ultrasonic bonding can be applied, suppressing bump misalignment and improving the connectivity.

Since the chip 12 is chucked by the porous stage 11, damage to the chip in the use of a chuck hole can be avoided. Simultaneous connection including not only electrical connection between the chip 12 and the printed circuit board 16 but also the sealing step by setting of a sealing resin (liquid resin or resin sheet) can be realized.

Since the entire lower surface of the chip 12 is chucked and fixed using the porous stage 11, the chip warpage can be straightened. In fixing using a chuck hole, the corner of the chip 12 cannot be fully straightened. However, the use of a porous material enables perfect warpage straightening.

Since both the porous stage 11 and tool 15 are heated, bonding can be further improved.

[11th Embodiment]

Figures 16, 17:
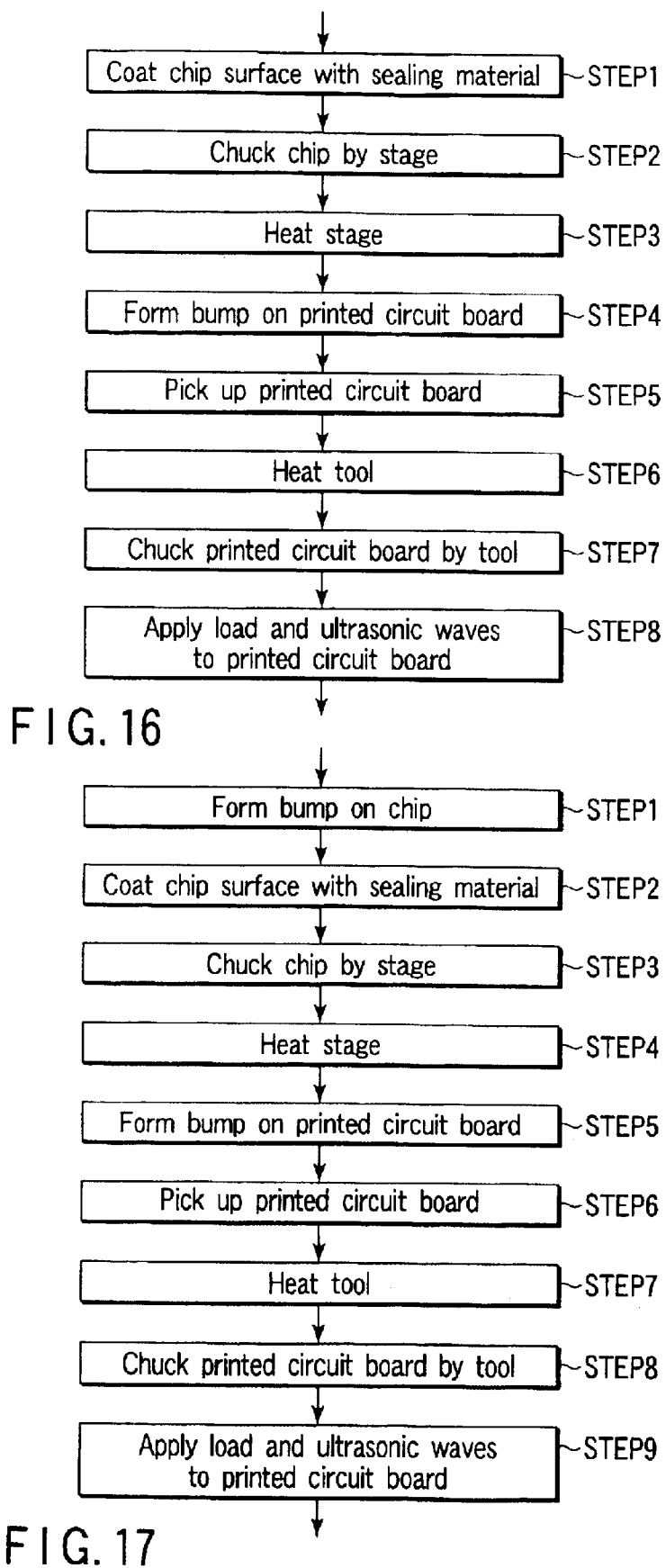
FIG. 16 is a flow chart showing a manufacturing process regarding the ultrasonic flip chip bonding technique for explaining a semiconductor device manufacturing method according to the 11th embodiment of the present invention.
FIG. 17 is a flow chart showing a manufacturing process regarding the ultrasonic flip chip bonding technique for explaining a semiconductor device manufacturing method according to the 12th embodiment of the present invention.

FIG. 16 is a flow chart showing a manufacturing process regarding the ultrasonic flip chip bonding technique for explaining a semiconductor device manufacturing method according to the 11th embodiment of the present invention. Various elements are formed in a semiconductor substrate (wafer) by a known process. The wafer is then diced into chips along the dicing line or scribe line of the wafer by using a diamond scriber, diamond blade, laser scriber, or the like, thereby forming a semiconductor chip 12.

The element formation surface (upper chip surface) of the chip 12 is coated with a sealing material 18 by spin-coating, e.g., a liquid resin (STEP 1). The sealing material 18 can also be formed by adhering a resin sheet. The chip 12 is chucked and fixed onto a porous stage 11 (STEP 2). In this state, the porous stage 11 is heated (STEP 3).

A stud bump is formed on a wiring electrode 17 of a printed circuit board 16 (STEP 4).

The printed circuit board 16 bearing the stud bump is picked up (STEP 5).

A tool 15 is heated (STEP 6), and a surface of the printed circuit board 16 opposite to a formation surface for the wiring electrode 17 is chucked by the tool 15 (STEP 7).

The tool 15 is moved above the porous stage 11 which holds the chip 12, and aligned (this state corresponds to FIG. 1). As shown in FIG. 2, the tool 15 is moved down with the printed circuit board 16 facing down. While a load is applied to the printed circuit board 16, ultrasonic waves are applied at, e.g., a frequency of 40 kHz and a power of 2,480 W, mounting the printed circuit board 16 on the chip 12 (STEP 8). At this time, the space between the chip 12 and the printed circuit board 16 is filled with the sealing material 18, performing simultaneous flip chip connection including the sealing step.

According to this manufacturing method, ultrasonic waves are applied to the printed circuit board 16 more flexible than the chip 12. A defect in the chip 12 such as a scratch or crack can be suppressed to reduce damage in flip chip connection. Further, a sufficient load and ultrasonic waves having a power and frequency (amplitude) suitable for ultrasonic bonding can be applied, suppressing bump misalignment and improving the connectivity.

Since the chip 12 is chucked by the porous stage 11, damage to the chip in the use of a chuck hole can be avoided. Simultaneous connection including not only electrical connection between the chip 12 and the printed circuit board 16 but also the sealing step by setting of a sealing resin (liquid resin or resin sheet) can be realized.

Since the entire lower surface of the chip 12 is chucked and fixed using the porous stage 11, the chip warpage can be straightened. In fixing using a chuck hole, the corner of the chip 12 cannot be fully straightened. However, the use of a porous material enables perfect warpage straightening.

Since both the porous stage 11 and tool 15 are heated, bonding can be further improved.

[12th Embodiment]

FIG. 17 is a flow chart showing a manufacturing process regarding the ultrasonic flip chip bonding technique for explaining a semiconductor device manufacturing method according to the 12th embodiment of the present invention. Various elements are formed in a semiconductor substrate (wafer) by a known process. The wafer is then diced into chips along the dicing line or scribe line of the wafer by using a diamond scriber, diamond blade, laser scriber, or the like, thereby forming a semiconductor chip 12.

A stud bump 14 is formed on an electrode 13 of the chip 12 (STEP 1). The element formation surface (upper chip surface) of the chip 12 is coated with a sealing material 18 by spin-coating, e.g., a liquid resin (STEP 2). The sealing material 18 can also be formed by adhering a resin sheet. The lower surface of the chip 12 is chucked and fixed onto a porous stage 11 (STEP 3). In this state, the porous stage 11 is heated (STEP 4).

A stud bump is formed on a wiring electrode 17 of a printed circuit board 16 for mounting the chip 12 (STEP 5). The printed circuit board 16 is picked up (STEP 6).

A tool 15 is heated (STEP 7), and a surface of the printed circuit board 16 opposite to a formation surface for the wiring electrode 17 is chucked by the tool 15 (STEP 8).

The tool 15 is moved above the porous stage 11 which holds the chip 12, and aligned (this state corresponds to FIG. 1). As shown in FIG. 2, the tool 15 is moved down with the printed circuit board 16 facing down. While a load is applied to the printed circuit board 16, ultrasonic waves are applied at, e.g., a frequency of 40 kHz and a power of 2,480 W, mounting the printed circuit board 16 on the chip 12 (STEP 9). At this time, the space between the chip 12 and the printed circuit board 16 is filled with the sealing material 18, performing simultaneous flip chip connection including the sealing step.

According to this manufacturing method, ultrasonic waves are applied to the printed circuit board 16 more flexible than the chip 12. A defect in the chip 12 such as a scratch or crack can be suppressed to reduce damage in flip chip connection. Further, a sufficient load and ultrasonic waves having a power and frequency (amplitude) suitable for ultrasonic bonding can be applied, suppressing bump misalignment and improving the connectivity.

Since the chip 12 is chucked by the porous stage 11, damage to the chip in the use of a chuck hole can be avoided. Simultaneous connection including not only electrical connection between the chip 12 and the printed circuit board 16 but also the sealing step by setting of a sealing resin (liquid resin or resin sheet) can be realized.

Since the entire lower surface of the chip 12 is chucked and fixed using the porous stage 11, the chip warpage can be straightened. In fixing using a chuck hole, the corner of the chip 12 cannot be fully straightened. However, the use of a porous material enables perfect warpage straightening.

Since both the porous stage 11 and tool 15 are heated, bonding can be further improved.

[13th Embodiment]

Figure 18:
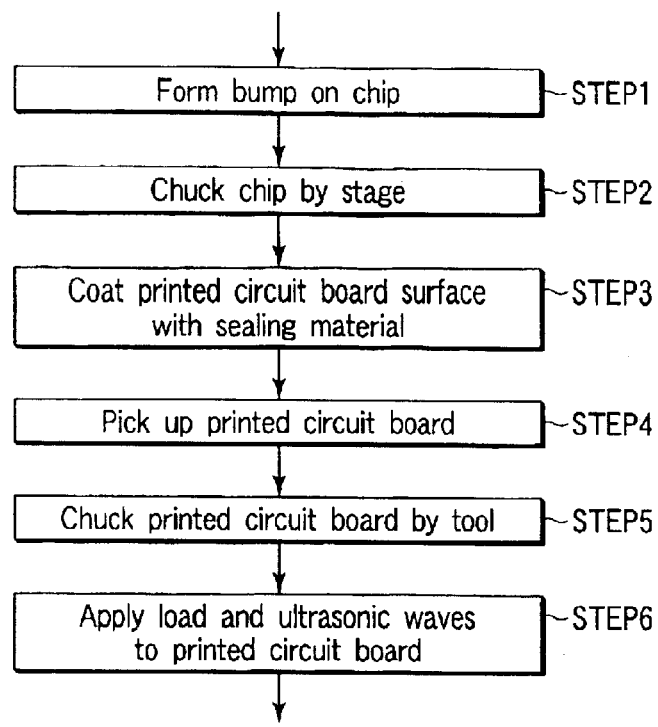
FIG. 18 is a flow chart showing a manufacturing process regarding the ultrasonic flip chip bonding technique for explaining a semiconductor device manufacturing method according to the 13th embodiment of the present invention.

FIG. 18 is a flow chart showing a manufacturing process regarding the ultrasonic flip chip bonding technique for explaining a semiconductor device manufacturing method according to the 13th embodiment of the present invention. Various elements are formed in a semiconductor substrate (wafer) by a known process. The wafer is then diced into chips along the dicing line or scribe line of the wafer by using a diamond scriber, diamond blade, laser scriber, or the like, thereby forming a semiconductor chip 12.

A stud bump 14 is formed on the element formation surface (upper chip surface) of the chip 12 (STEP 1). The lower surface of the chip 12 is chucked and fixed onto a porous stage 11 (STEP 2).

A surface of a printed circuit board 16 on a wiring electrode 17 side is coated with a sealing material 18 (STEP 3).

The printed circuit board 16 coated with the sealing material 18 is picked up (STEP 4).

A surface of the printed circuit board 16 opposite to a formation surface for the wiring electrode 17 is chucked by a tool 15 (STEP 5).

The tool 15 is moved above the porous stage 11 which holds the chip 12, and aligned (this state corresponds to FIG. 1). As shown in FIG. 2, the tool 15 is moved down with the printed circuit board 16 facing down. While a load is applied to the printed circuit board 16, ultrasonic waves are applied at, e.g., a frequency of 40 kHz and a power of 2,480 W, mounting the printed circuit board 16 on the chip 12 (STEP 6). At this time, the space between the chip 12 and the printed circuit board 16 is filled with the sealing material 18, performing simultaneous flip chip connection including the sealing step.

According to this manufacturing method, ultrasonic waves are applied to the printed circuit board 16 more flexible than the chip 12. A defect in the chip 12 such as a scratch or crack can be suppressed to reduce damage in flip chip connection. Further, a sufficient load and ultrasonic waves having a power and frequency (amplitude) suitable for ultrasonic bonding can be applied, suppressing bump misalignment and improving the connectivity.

Since the chip 12 is chucked by the porous stage 11, damage to the chip in the use of a chuck hole can be avoided. Simultaneous connection including not only electrical connection between the chip 12 and the printed circuit board 16 but also the sealing step by setting of a sealing resin (liquid resin or resin sheet) can be realized.

Since the entire lower surface of the chip 12 is chucked and fixed using the porous stage 11, the chip warpage can be straightened. In fixing using a chuck hole, the corner of the chip 12 cannot be fully straightened. However, the use of a porous material enables perfect warpage straightening.

[14th Embodiment]

Figure 19:
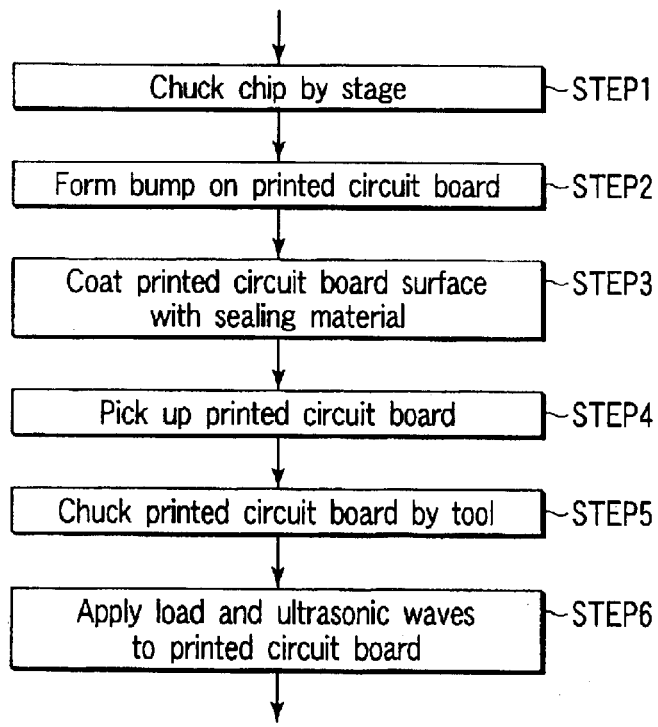
FIG. 19 is a flow chart showing a manufacturing process regarding the ultrasonic flip chip bonding technique for explaining a semiconductor device manufacturing method according to the 14th embodiment of the present invention.

FIG. 19 is a flow chart showing a manufacturing process regarding the ultrasonic flip chip bonding technique for explaining a semiconductor device manufacturing method according to the 14th embodiment of the present invention. Various elements are formed in a semiconductor substrate (wafer) by a known process. The wafer is then diced into chips along the dicing line or scribe line of the wafer by using a diamond scriber, diamond blade, laser scriber, or the like, thereby forming a semiconductor chip 12.

A surface of the chip 12 opposite to an element formation surface is chucked and fixed onto a porous stage 11 (STEP 1). A stud bump 14 is formed on an electrode 13 of the chip 12 (STEP 2).

A surface of a printed circuit board 16 on a wiring electrode 17 side is coated with a sealing material 18 (STEP 3).

The printed circuit board 16 coated with the sealing material 18 is picked up (STEP 4).

A surface of the printed circuit board 16 opposite to a formation surface for the wiring electrode 17 is chucked by a tool 15 (STEP 5).

The tool 15 is moved above the porous stage 11 which holds the chip 12, and aligned (this state corresponds to FIG. 1). As shown in FIG. 2, the tool 15 is moved down with the printed circuit board 16 facing down. While a load is applied to the printed circuit board 16, ultrasonic waves are applied at, e.g., a frequency of 40 kHz and a power of 2,480 W, mounting the printed circuit board 16 on the chip 12 (STEP 6). At this time, the space between the chip 12 and the printed circuit board 16 is filled with the sealing material 18, performing simultaneous flip chip connection including the sealing step.

According to this manufacturing method, ultrasonic waves are applied to the printed circuit board 16 more flexible than the chip 12. A defect in the chip 12 such as a scratch or crack can be suppressed to reduce damage in flip chip connection. Further, a sufficient load and ultrasonic waves having a power and frequency (amplitude) suitable for ultrasonic bonding can be applied, suppressing bump misalignment and improving the connectivity.

Since the chip 12 is chucked by the porous stage 11, damage to the chip in the use of a chuck hole can be avoided. Simultaneous connection including not only electrical connection between the chip 12 and the printed circuit board 16 but also the sealing step by setting of a sealing resin (liquid resin or resin sheet) can be realized.

Since the entire lower surface of the chip 12 is chucked and fixed using the porous stage 11, the chip warpage can be straightened. In fixing using a chuck hole, the corner of the chip 12 cannot be fully straightened. However, the use of a porous material enables perfect warpage straightening.

[15th Embodiment]

Figure 20:
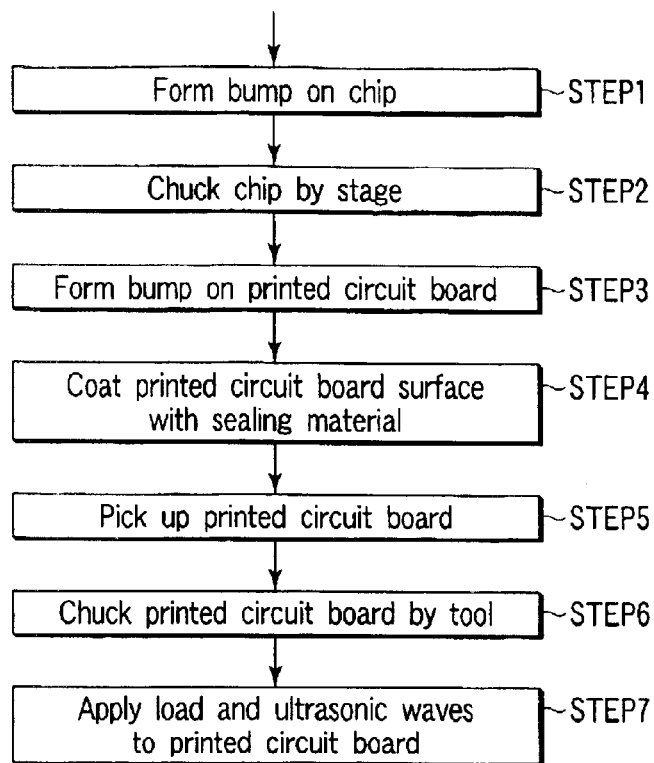
FIG. 20 is a flow chart showing a manufacturing process regarding the ultrasonic flip chip bonding technique for explaining a semiconductor device manufacturing method according to the 15th embodiment of the present invention.

FIG. 20 is a flow chart showing a manufacturing process regarding the ultrasonic flip chip bonding technique for explaining a semiconductor device manufacturing method according to the 15th embodiment of the present invention. Various elements are formed in a semiconductor substrate (wafer) by a known process. The wafer is then diced into chips along the dicing line or scribe line of the wafer by using a diamond scriber, diamond blade, laser scriber, or the like, thereby forming a semiconductor chip 12.

A stud bump 14 is formed on an electrode 13 on the element formation surface (upper chip surface) of the chip 12 (STEP 1). The lower surface of the chip 12 is chucked and fixed onto a porous stage 11 (STEP 2).

A stud bump is formed on a wiring electrode 17 of a printed circuit board 16 (STEP 3). A surface of the printed circuit board 16 on the wiring electrode 17 side is coated with a sealing material 18 (STEP 4).

The printed circuit board 16 coated with the sealing material 18 is picked up (STEP 5). A surface of the printed circuit board 16 opposite to the formation surface for the wiring electrode 17 is chucked by a tool 15 (STEP 6).

The tool 15 is moved above the porous stage 11 which holds the chip 12, and aligned (this state corresponds to FIG. 1). As shown in FIG. 2, the tool 15 is moved down with the printed circuit board 16 facing down. While a load is applied to the printed circuit board 16, ultrasonic waves are applied at, e.g., a frequency of 40 kHz and a power of 2,480 W, mounting the printed circuit board 16 on the chip 12 (STEP 7). At this time, the space between the chip 12 and the printed circuit board 16 is filled with the sealing material 18, performing simultaneous flip chip connection including the sealing step.

According to this manufacturing method, ultrasonic waves are applied to the printed circuit board 16 more flexible than the chip 12. A defect in the chip 12 such as a scratch or crack can be suppressed to reduce damage in flip chip connection. Further, a sufficient load and ultrasonic waves having a power and frequency (amplitude) suitable for ultrasonic bonding can be applied, suppressing bump misalignment and improving the connectivity.

Since the chip 12 is chucked by the porous stage 11, damage to the chip in the use of a chuck hole can be avoided. Simultaneous connection including not only electrical connection between the chip 12 and the printed circuit board 16 but also the sealing step by setting of a sealing resin (liquid resin or resin sheet) can be realized.

Since the entire lower surface of the chip 12 is chucked and fixed using the porous stage 11, the chip warpage can be straightened. In fixing using a chuck hole, the corner of the chip 12 cannot be fully straightened. However, the use of a porous material enables perfect warpage straightening.

[16th Embodiment]

Figure 21:
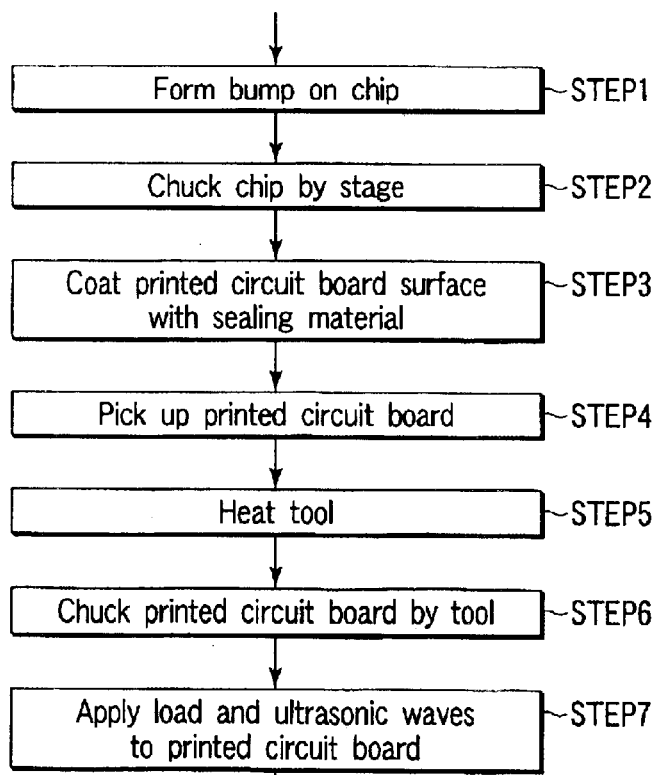
FIG. 21 is a flow chart showing a manufacturing process regarding the ultrasonic flip chip bonding technique for explaining a semiconductor device manufacturing method according to the 16th embodiment of the present invention.

FIG. 21 is a flow chart showing a manufacturing process regarding the ultrasonic flip chip bonding technique for explaining a semiconductor device manufacturing method according to the 16th embodiment of the present invention.

Various elements are formed in a semiconductor substrate (wafer) by a known process. The wafer is then diced into chips along the dicing line or scribe line of the wafer by using a diamond scriber, diamond blade, laser scriber, or the like, thereby forming a semiconductor chip 12.

A stud bump 14 is formed on an electrode 13 of the chip 12 (STEP 1). The lower surface of the chip 12 is chucked and fixed onto a porous stage 11 (STEP 2).

A surface of a printed circuit board 16 on a wiring electrode 17 side is coated with a sealing material 18 (STEP 3).

The printed circuit board 16 coated with the sealing material 18 is picked up (STEP 4).

A tool 15 is heated (STEP 5), and a surface of the printed circuit board 16 opposite to a formation surface for the wiring electrode 17 is chucked by the tool 15 (STEP 6).

The tool 15 is moved above the porous stage 11 which holds the chip 12, and aligned (this state corresponds to FIG. 1). As shown in FIG. 2, the tool 15 is moved down with the printed circuit board 16 facing down. While a load is applied to the printed circuit board 16, ultrasonic waves are applied at, e.g., a frequency of 40 kHz and a power of 2,480 W, mounting the printed circuit board 16 on the chip 12 (STEP 7). At this time, the space between the chip 12 and the printed circuit board 16 is filled with the sealing material 18, performing simultaneous flip chip connection including the sealing step.

According to this manufacturing method, ultrasonic waves are applied to the printed circuit board 16 more flexible than the chip 12. A defect in the chip 12 such as a scratch or crack can be suppressed to reduce damage in flip chip connection. Further, a sufficient load and ultrasonic waves having a power and frequency (amplitude) suitable for ultrasonic bonding can be applied, suppressing bump misalignment and improving the connectivity.

Since the chip 12 is chucked by the porous stage 11, damage to the chip in the use of a chuck hole can be avoided. Simultaneous connection including not only electrical connection between the chip 12 and the printed circuit board 16 but also the sealing step by setting of a sealing resin (liquid resin or resin sheet) can be realized.

Since the entire lower surface of the chip 12 is chucked and fixed using the porous stage 11, the chip warpage can be straightened. In fixing using a chuck hole, the corner of the chip 12 cannot be fully straightened. However, the use of a porous material enables perfect warpage straightening.

[17th Embodiment]

Figure 22:
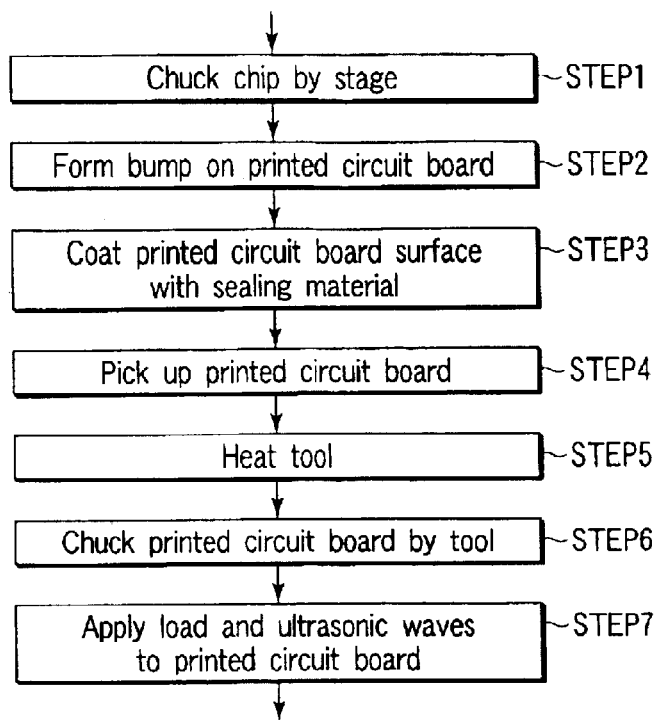
FIG. 22 is a flow chart showing a manufacturing process regarding the ultrasonic flip chip bonding technique for explaining a semiconductor device manufacturing method according to the 17th embodiment of the present invention.

FIG. 22 is a flow chart showing a manufacturing process regarding the ultrasonic flip chip bonding technique for explaining a semiconductor device manufacturing method according to the 17th embodiment of the present invention. Various elements are formed in a semiconductor substrate (wafer) by a known process. The wafer is then diced into chips along the dicing line or scribe line of the wafer by using a diamond scriber, diamond blade, laser scriber, or the like, thereby forming a semiconductor chip 12.

A surface of the chip 12 opposite to an element formation surface is chucked and fixed onto a porous stage 11 (STEP 1).

A stud bump is formed on a wiring electrode 17 of a printed circuit board 16 (STEP 2). A surface of the printed circuit board 16 on the wiring electrode 17 side is coated with a sealing material 18 (STEP 3).

The printed circuit board 16 coated with the sealing material 18 is picked up (STEP 4).

A tool 15 is heated (STEP 5), and a surface of the printed circuit board 16 opposite to the formation surface for the wiring electrode 17 is chucked by a tool 15 (STEP 6).

The tool 15 is moved above the porous stage 11 which holds the chip 12, and aligned (this state corresponds to FIG. 1). As shown in FIG. 2, the tool 15 is moved down with the printed circuit board 16 facing down. While a load is applied to the printed circuit board 16, ultrasonic waves are applied at, e.g., a frequency of 40 kHz and a power of 2,480 W, mounting the printed circuit board 16 on the chip 12 (STEP 7). At this time, the space between the chip 12 and the printed circuit board 16 is filled with the sealing material 18, performing simultaneous flip chip connection including the sealing step.

According to this manufacturing method, ultrasonic waves are applied to the printed circuit board 16 more flexible than the chip 12. A defect in the chip 12 such as a scratch or crack can be suppressed to reduce damage in flip chip connection. Further, a sufficient load and ultrasonic waves having a power and frequency (amplitude) suitable for ultrasonic bonding can be applied, suppressing bump misalignment and improving the connectivity.

Since the chip 12 is chucked by the porous stage 11, damage to the chip in the use of a chuck hole can be avoided. Simultaneous connection including not only electrical connection between the chip 12 and the printed circuit board 16 but also the sealing step by setting of a sealing resin (liquid resin or resin sheet) can be realized.

Since the entire lower surface of the chip 12 is chucked and fixed using the porous stage 11, the chip warpage can be straightened. In fixing using a chuck hole, the corner of the chip 12 cannot be fully straightened. However, the use of a porous material enables perfect warpage straightening.

[18th Embodiment]

Figure 23:
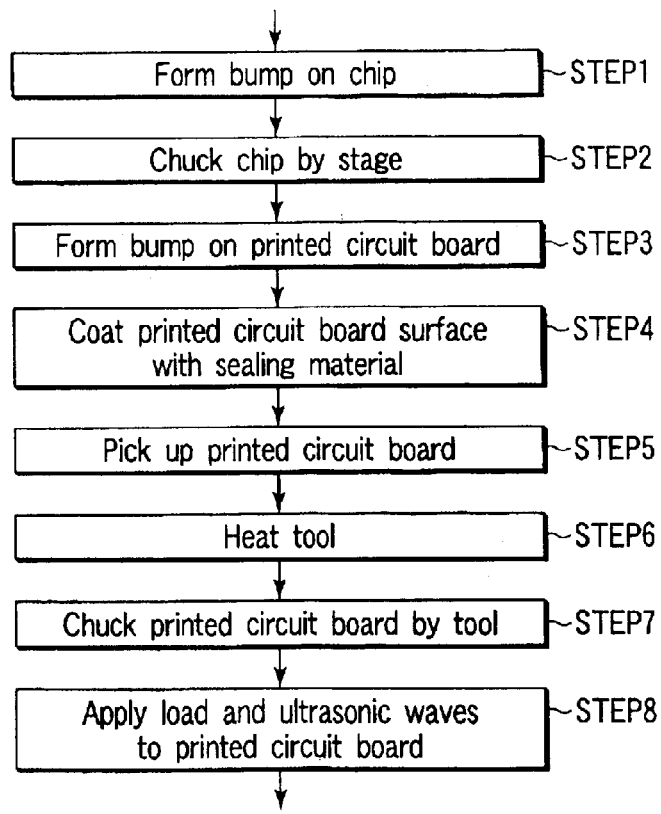
FIG. 23 is a flow chart showing a manufacturing process regarding the ultrasonic flip chip bonding technique for explaining a semiconductor device manufacturing method according to the 18th embodiment of the present invention.

FIG. 23 is a flow chart showing a manufacturing process regarding the ultrasonic flip chip bonding technique for explaining a semiconductor device manufacturing method according to the 18th embodiment of the present invention. Various elements are formed in a semiconductor substrate (wafer) by a known process. The wafer is then diced into chips along the dicing line or scribe line of the wafer by using a diamond scriber, diamond blade, laser scriber, or the like, thereby forming a semiconductor chip 12.

A bump 14 is formed on an electrode 13 of the chip 12 (STEP 1). The lower surface of the chip 12 is chucked and fixed onto a porous stage 11 (STEP 2).

A stud bump is formed on a wiring electrode 17 of a printed circuit board 16 (STEP 3). A surface of the printed circuit board 16 on the wiring electrode 17 side is coated with a sealing material 18 (STEP 4).

The printed circuit board 16 coated with the sealing material 18 is picked up (STEP 5).

A tool 15 is heated (STEP 6), and a surface of the printed circuit board 16 opposite to the formation surface for the wiring electrode 17 is chucked by the tool 15 (STEP 7).

The tool 15 is moved above the porous stage 11 which holds the chip 12, and aligned (this state corresponds to FIG. 1). As shown in FIG. 2, the tool 15 is moved down with the printed circuit board 16 facing down. While a load is applied to the printed circuit board 16, ultrasonic waves are applied at, e.g., a frequency of 40 kHz and a power of 2,480 W, mounting the printed circuit board 16 on the chip 12 (STEP 8). At this time, the space between the chip 12 and the printed circuit board 16 is filled with the sealing material 18, performing simultaneous flip chip connection including the sealing step.

According to this manufacturing method, ultrasonic waves are applied to the printed circuit board 16 more flexible than the chip 12. A defect in the chip 12 such as a scratch or crack can be suppressed to reduce damage in flip chip connection. Further, a sufficient load and ultrasonic waves having a power and frequency (amplitude) suitable for ultrasonic bonding can be applied, suppressing bump misalignment and improving the connectivity.

Since the chip 12 is chucked by the porous stage 11, damage to the chip in the use of a chuck hole can be avoided. Simultaneous connection including not only electrical connection between the chip 12 and the printed circuit board 16 but also the sealing step by setting of a sealing resin (liquid resin or resin sheet) can be realized.

Since the entire lower surface of the chip 12 is chucked and fixed using the porous stage 11, the chip warpage can be straightened. In fixing using a chuck hole, the corner of the chip 12 cannot be fully straightened. However, the use of a porous material enables perfect warpage straightening.

Flip chip connection performed while heating the tool 15 can further promote and improve bonding.

[19th Embodiment]

Figure 24:
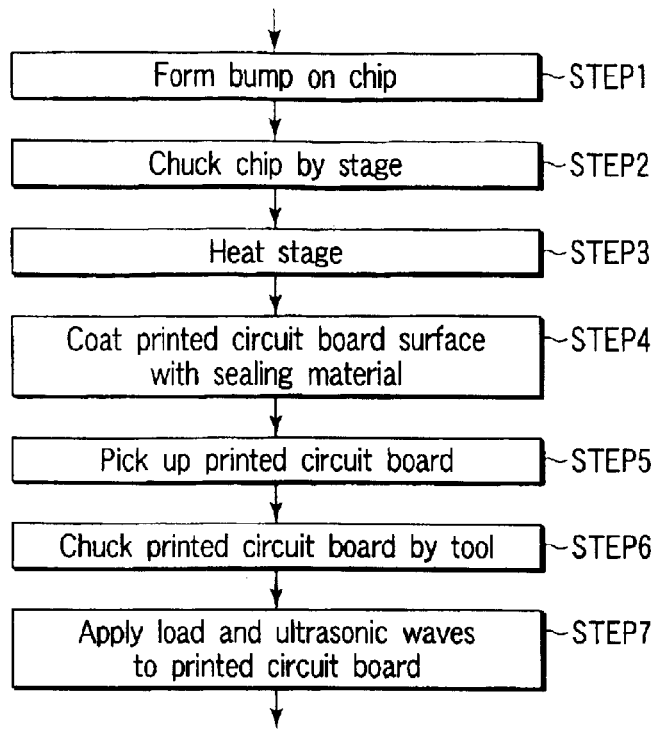
FIG. 24 is a flow chart showing a manufacturing process regarding the ultrasonic flip chip bonding technique for explaining a semiconductor device manufacturing method according to the 19th embodiment of the present invention.

FIG. 24 is a flow chart showing a manufacturing process regarding the ultrasonic flip chip bonding technique for explaining a semiconductor device manufacturing method according to the 19th embodiment of the present invention. Various elements are formed in a semiconductor substrate (wafer) by a known process. The wafer is then diced into chips along the dicing line or scribe line of the wafer by using a diamond scriber, diamond blade, laser scriber, or the like, thereby forming a semiconductor chip 12.

A stud bump 14 is formed on an electrode 13 of the chip 12 (STEP 1). The lower surface of the chip 12 is chucked and fixed onto a porous stage 11 (STEP 2). After that, the porous stage 11 is heated (STEP 3).

A surface of a printed circuit board 16 on a wiring electrode 17 side is coated with a sealing material 18 (STEP 4).

The printed circuit board 16 coated with the sealing material 18 is picked up (STEP 5). A surface of the printed circuit board 16 opposite to a formation surface for the wiring electrode 17 is chucked by a tool 15 (STEP 6).

The tool 15 is moved above the porous stage 11 which holds the chip 12, and aligned (this state corresponds to FIG. 1). As shown in FIG. 2, the tool 15 is moved down with the printed circuit board 16 facing down. While a load is applied to the printed circuit board 16, ultrasonic waves are applied at, e.g., a frequency of 40 kHz and a power of 2,480 W, mounting the printed circuit board 16 on the chip 12 (STEP 7). At this time, the space between the chip 12 and the printed circuit board 16 is filled with the sealing material 18, performing simultaneous flip chip connection including the sealing step.

According to this manufacturing method, ultrasonic waves are applied to the printed circuit board 16 more flexible than the chip 12. A defect in the chip 12 such as a scratch or crack can be suppressed to reduce damage in flip chip connection. Further, a sufficient load and ultrasonic waves having a power and frequency (amplitude) suitable for ultrasonic bonding can be applied, suppressing bump misalignment and improving the connectivity.

Since the chip 12 is chucked by the porous stage 11, damage to the chip in the use of a chuck hole can be avoided. Simultaneous connection including not only electrical connection between the chip 12 and the printed circuit board 16 but also the sealing step by setting of a sealing resin (liquid resin or resin sheet) can be realized.

Since the entire lower surface of the chip 12 is chucked and fixed using the porous stage 11, the chip warpage can be straightened. In fixing using a chuck hole, the corner of the chip 12 cannot be fully straightened. However, the use of a porous material enables perfect warpage straightening.

Flip chip connection performed while heating the porous stage 11 can promote and improve bonding.

[20th Embodiment]

Figure 25:
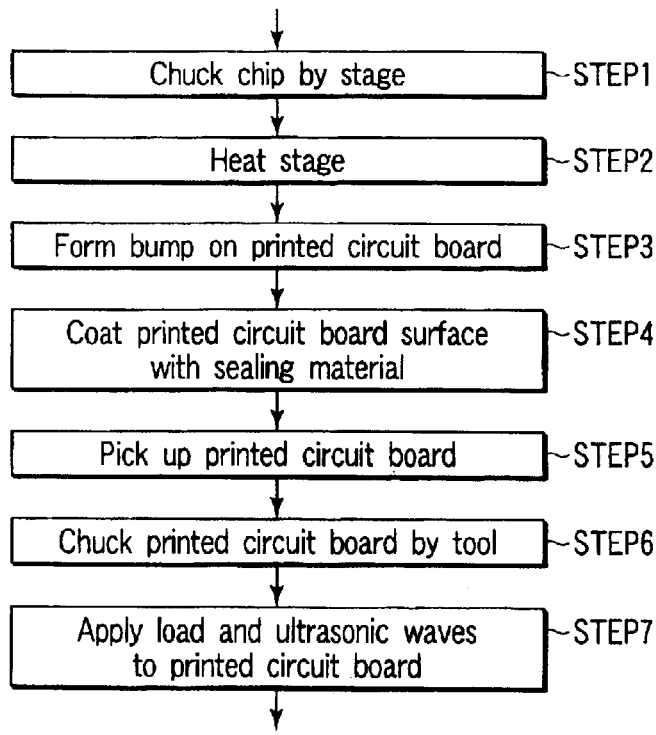
FIG. 25 is a flow chart showing a manufacturing process regarding the ultrasonic flip chip bonding technique for explaining a semiconductor device manufacturing method according to the 20th embodiment of the present invention.

FIG. 25 is a flow chart showing a manufacturing process regarding the ultrasonic flip chip bonding technique for explaining a semiconductor device manufacturing method according to the 20th embodiment of the present invention. Various elements are formed in a semiconductor substrate (wafer) by a known process. The wafer is then diced into chips along the dicing line or scribe line of the wafer by using a diamond scriber, diamond blade, laser scriber, or the like, thereby forming a semiconductor chip 12.

A surface of the chip 12 opposite to an element formation surface is chucked and fixed onto a porous stage 11 (STEP 1). In this state, the porous stage 11 is heated (STEP 2).

A stud bump is formed on a wiring electrode 17 of a printed circuit board 16 for mounting the chip 12 (STEP 3). A surface of the printed circuit board 16 on the wiring electrode 17 side is coated with a sealing material 18 (STEP 4).

The printed circuit board 16 coated with the sealing material 18 is picked up (STEP 5). A surface of the printed circuit board 16 opposite to the formation surface for the wiring electrode 17 is chucked by a tool 15 (STEP 6).

The tool 15 is moved above the porous stage 11 which holds the chip 12, and aligned (this state corresponds to FIG. 1). As shown in FIG. 2, the tool 15 is moved down with the printed circuit board 16 facing down. While a load is applied to the printed circuit board 16, ultrasonic waves are applied at, e.g., a frequency of 40 kHz and a power of 2,480 W, mounting the printed circuit board 16 on the chip 12 (STEP 7). At this time, the space between the chip 12 and the printed circuit board 16 is filled with the sealing material 18, performing simultaneous flip chip connection including the sealing step.

According to this manufacturing method, ultrasonic waves are applied to the printed circuit board 16 more flexible than the chip 12. A defect in the chip 12 such as a scratch or crack can be suppressed to reduce damage in flip chip connection. Further, a sufficient load and ultrasonic waves having a power and frequency (amplitude) suitable for ultrasonic bonding can be applied, suppressing bump misalignment and improving the connectivity.

Since the chip 12 is chucked by the porous stage 11, damage to the chip in the use of a chuck hole can be avoided. Simultaneous connection including not only electrical connection between the chip 12 and the printed circuit board 16 but also the sealing step by setting of a sealing resin (liquid resin or resin sheet) can be realized.

Since the entire lower surface of the chip 12 is chucked and fixed using the porous stage 11, the chip warpage can be straightened. In fixing using a chuck hole, the corner of the chip 12 cannot be fully straightened. However, the use of a porous material enables perfect warpage straightening.

Flip chip connection performed while heating the porous stage 11 can promote and improve bonding.

[21st Embodiment]

Figure 26:
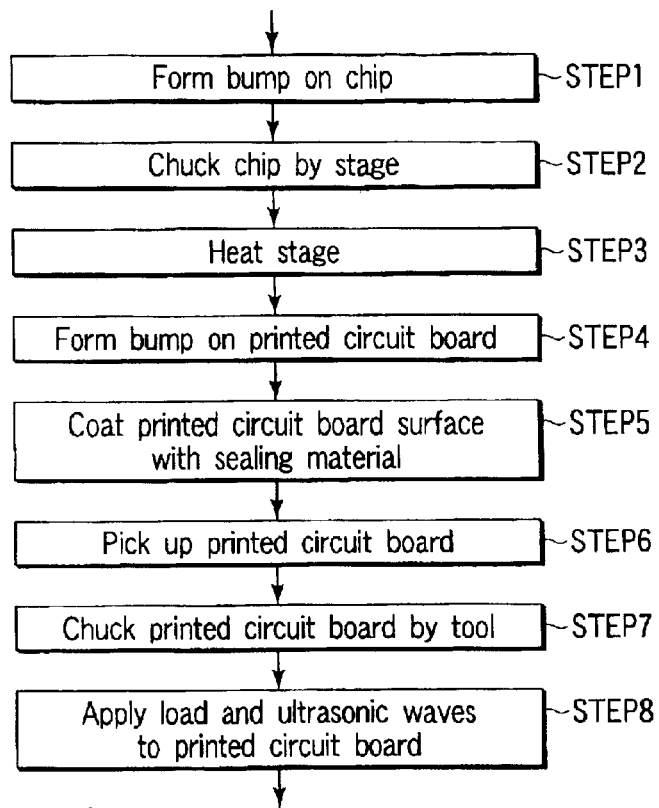
FIG. 26 is a flow chart showing a manufacturing process regarding the ultrasonic flip chip bonding technique for explaining a semiconductor device manufacturing method according to the 21st embodiment of the present invention.

FIG. 26 is a flow chart showing a manufacturing process regarding the ultrasonic flip chip bonding technique for explaining a semiconductor device manufacturing method according to the 21st embodiment of the present invention. Various elements are formed in a semiconductor substrate (wafer) by a known process. The wafer is then diced into chips along the dicing line or scribe line of the wafer by using a diamond scriber, diamond blade, laser scriber, or the like, thereby forming a semiconductor chip 12.

A stud bump 14 is formed on an electrode 13 of the chip 12 (STEP 1). A surface of the chip 12 opposite to an element formation surface is chucked and fixed onto a porous stage 11 (STEP 2). In this state, the porous stage 11 is heated (STEP 3).

A stud bump is formed on a wiring electrode 17 of a printed circuit board 16 for mounting the chip 12 (STEP 4). A surface of the printed circuit board 16 on the wiring electrode 17 side is coated with a sealing material 18 (STEP 5).

The printed circuit board 16 coated with the sealing material 18 is picked up (STEP 6). A surface of the printed circuit board 16 opposite to the formation surface for the wiring electrode 17 is chucked by a tool 15 (STEP 7).

The tool 15 is moved above the porous stage 11 which holds the chip 12, and aligned (this state corresponds to FIG. 1). As shown in FIG. 2, the tool 15 is moved down with the printed circuit board 16 facing down. While a load is applied to the printed circuit board 16, ultrasonic waves are applied at, e.g., a frequency of 40 kHz and a power of 2,480 W, mounting the printed circuit board 16 on the chip 12 (STEP 8). At this time, the space between the chip 12 and the printed circuit board 16 is filled with the sealing material 18, performing simultaneous flip chip connection including the sealing step.

According to this manufacturing method, ultrasonic waves are applied to the printed circuit board 16 more flexible than the chip 12. A defect in the chip 12 such as a scratch or crack can be suppressed to reduce damage in flip chip connection. Further, a sufficient load and ultrasonic waves having a power and frequency (amplitude) suitable for ultrasonic bonding can be applied, suppressing bump misalignment and improving the connectivity.

Since the chip 12 is chucked by the porous stage 11, damage to the chip in the use of a chuck hole can be avoided. Simultaneous connection including not only electrical connection between the chip 12 and the printed circuit board 16 but also the sealing step by setting of a sealing resin (liquid resin or resin sheet) can be realized.

Since the entire lower surface of the chip 12 is chucked and fixed using the porous stage 11, the chip warpage can be straightened. In fixing using a chuck hole, the corner of the chip 12 cannot be fully straightened. However, the use of a porous material enables perfect warpage straightening.

Flip chip connection performed while heating the porous stage 11 can promote and improve bonding.

[22nd Embodiment]

Figure 27:
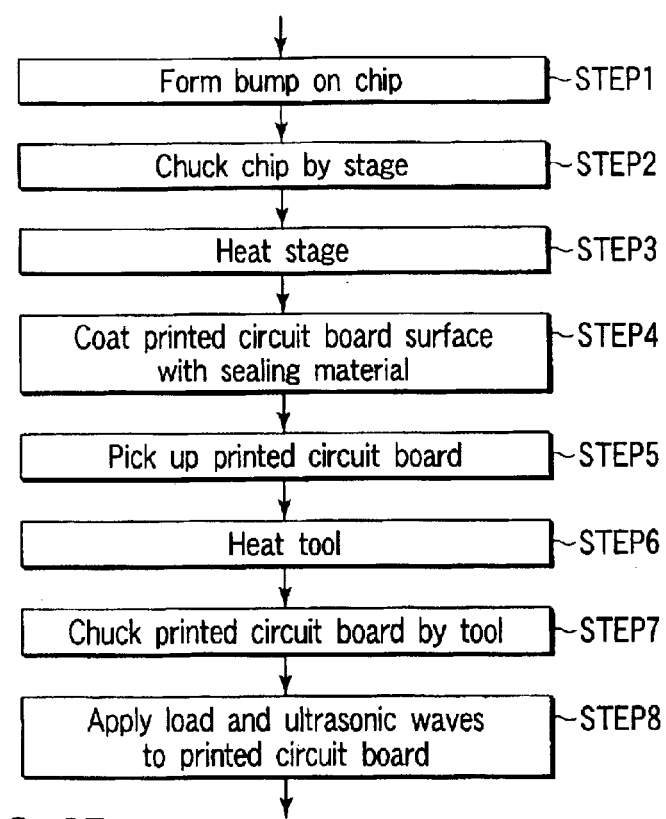
FIG. 27 is a flow chart showing a manufacturing process regarding the ultrasonic flip chip bonding technique for explaining a semiconductor device manufacturing method according to the 22nd embodiment of the present invention.

FIG. 27 is a flow chart showing a manufacturing process regarding the ultrasonic flip chip bonding technique for explaining a semiconductor device manufacturing method according to the 22nd embodiment of the present invention. Various elements are formed in a semiconductor substrate (wafer) by a known process. The wafer is then diced into chips along the dicing line or scribe line of the wafer by using a diamond scriber, diamond blade, laser scriber, or the like, thereby forming a semiconductor chip 12.

A stud bump 14 is formed on an electrode 13 of the chip 12 (STEP 1). A surface of the chip 12 opposite to an element formation surface is chucked and fixed onto a porous stage 11 (STEP 2). In this state, the porous stage 11 is heated (STEP 3).

A surface of a printed circuit board 16 on a wiring electrode 17 side is coated with a sealing material 18 (STEP 4). The printed circuit board 16 is picked up (STEP 5).

A tool 15 is heated (STEP 6), and a surface of the printed circuit board 16 opposite to a formation surface for the wiring electrode 17 is chucked by the tool 15 (STEP 7).

The tool 15 is moved above the porous stage 11 which holds the chip 12, and aligned (this state corresponds to FIG. 1). As shown in FIG. 2, the tool 15 is moved down with the printed circuit board 16 facing down. While a load is applied to the printed circuit board 16, ultrasonic waves are applied at, e.g., a frequency of 40 kHz and a power of 2,480 W, mounting the printed circuit board 16 on the chip 12 (STEP 8). At this time, the space between the chip 12 and the printed circuit board 16 is filled with the sealing material 18, performing simultaneous flip chip connection including the sealing step.

According to this manufacturing method, ultrasonic waves are applied to the printed circuit board 16 more flexible than the chip 12. A defect in the chip 12 such as a scratch or crack can be suppressed to reduce damage in flip chip connection. Further, a sufficient load and ultrasonic waves having a power and frequency (amplitude) suitable for ultrasonic bonding can be applied, suppressing bump misalignment and improving the connectivity.

Since the chip 12 is chucked by the porous stage 11, damage to the chip in the use of a chuck hole can be avoided. Simultaneous connection including not only electrical connection between the chip 12 and the printed circuit board 16 but also the sealing step by setting of a sealing resin (liquid resin or resin sheet) can be realized.

Since the entire lower surface of the chip 12 is chucked and fixed using the porous stage 11, the chip warpage can be straightened. In fixing using a chuck hole, the corner of the chip 12 cannot be fully straightened. However, the use of a porous material enables perfect warpage straightening.

Since both the porous stage 11 and tool 15 are heated, bonding can be further improved.

[23rd Embodiment]

Figure 28:
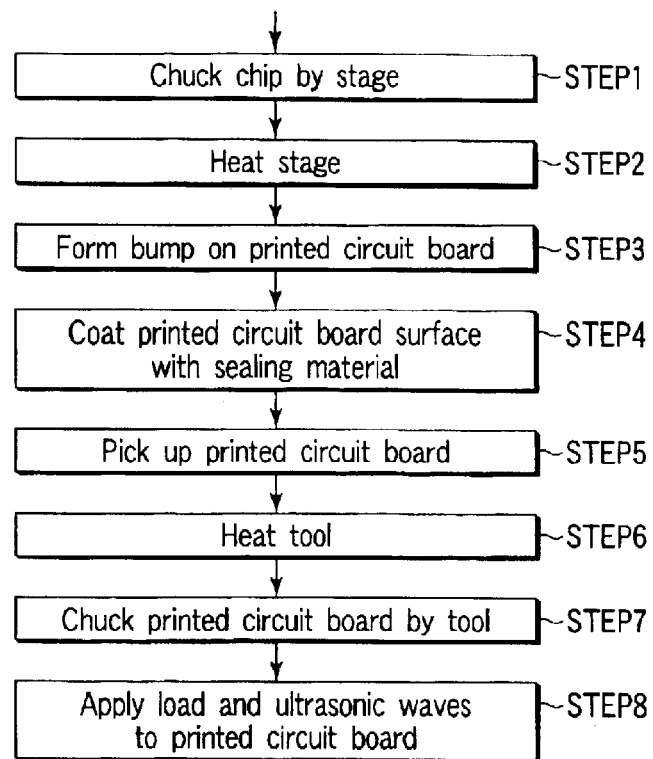
FIG. 28 is a flow chart showing a manufacturing process regarding the ultrasonic flip chip bonding technique for explaining a semiconductor device manufacturing method according to the 23rd embodiment of the present invention.

FIG. 28 is a flow chart showing a manufacturing process regarding the ultrasonic flip chip bonding technique for explaining a semiconductor device manufacturing method according to the 23rd embodiment of the present invention. Various elements are formed in a semiconductor substrate (wafer) by a known process. The wafer is then diced into chips along the dicing line or scribe line of the wafer by using a diamond scriber, diamond blade, laser scriber, or the like, thereby forming a semiconductor chip 12.

A surface of the chip 12 opposite to an element formation surface is chucked and fixed onto a porous stage 11 (STEP 1). In this state, the porous stage 11 is heated (STEP 2).

A stud bump is formed on a wiring electrode 17 of a printed circuit board 16 (STEP 3). A surface of the printed circuit board 16 on the wiring electrode 17 side is coated with a sealing material 18 (STEP 4).

The printed circuit board 16 coated with the sealing material 18 is picked up (STEP 5).

A tool 15 is heated (STEP 6), and a surface of the printed circuit board 16 opposite to the formation surface for the wiring electrode 17 is chucked by the tool 15 (STEP 7).

The tool 15 is moved above the porous stage 11 which holds the chip 12, and aligned (this state corresponds to FIG. 1). As shown in FIG. 2, the tool 15 is moved down with the printed circuit board 16 facing down. While a load is applied to the printed circuit board 16, ultrasonic waves are applied at, e.g., a frequency of 40 kHz and a power of 2,480 W, mounting the printed circuit board 16 on the chip 12 (STEP 8). At this time, the space between the chip 12 and the printed circuit board 16 is filled with the sealing material 18, performing simultaneous flip chip connection including the sealing step.

According to this manufacturing method, ultrasonic waves are applied to the printed circuit board 16 more flexible than the chip 12. A defect in the chip 12 such as a scratch or crack can be suppressed to reduce damage in flip chip connection. Further, a sufficient load and ultrasonic waves having a power and frequency (amplitude) suitable for ultrasonic bonding can be applied, suppressing bump misalignment and improving the connectivity.

Since the chip 12 is chucked by the porous stage 11, damage to the chip in the use of a chuck hole can be avoided. Simultaneous connection including not only electrical connection between the chip 12 and the printed circuit board 16 but also the sealing step by setting of a sealing resin (liquid resin or resin sheet) can be realized.

Since the entire lower surface of the chip 12 is chucked and fixed using the porous stage 11, the chip warpage can be straightened. In fixing using a chuck hole, the corner of the chip 12 cannot be fully straightened. However, the use of a porous material enables perfect warpage straightening.

Since both the porous stage 11 and tool 15 are heated, bonding can be further improved.

[24th Embodiment]

Figure 29:
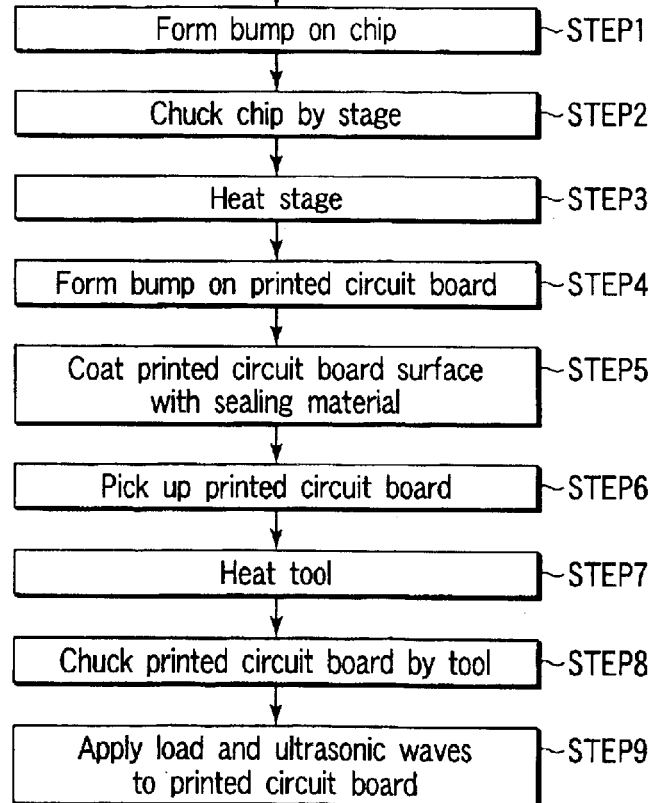
FIG. 29 is a flow chart showing a manufacturing process regarding the ultrasonic flip chip bonding technique for explaining a semiconductor device manufacturing method according to the 24th embodiment of the present invention.

FIG. 29 is a flow chart showing a manufacturing process regarding the ultrasonic flip chip bonding technique for explaining a semiconductor device manufacturing method according to the 24th embodiment of the present invention. Various elements are formed in a semiconductor substrate (wafer) by a known process. The wafer is then diced into chips along the dicing line or scribe line of the wafer by using a diamond scriber, diamond blade, laser scriber, or the like, thereby forming a semiconductor chip 12.

A stud bump 14 is formed on an electrode 13 of the chip 12 (STEP 1). A surface of the chip 12 opposite to an element formation surface is chucked and fixed onto a porous stage 11 (STEP 2). In this state, the porous stage 11 is heated (STEP 3).

A stud bump is formed on a wiring electrode 17 of a printed circuit board 16 (STEP 4). The formation surface of the printed circuit board 16 for the wiring electrode 17 is coated with a sealing material 18 (STEP 5).

The printed circuit board 16 coated with the sealing material 18 is picked up (STEP 6).

A tool 15 is heated (STEP 7), and a surface of the printed circuit board 16 opposite to the formation surface for the wiring electrode 17 is chucked by the tool 15 (STEP 8).

The tool 15 is moved above the porous stage 11 which holds the chip 12, and aligned (this state corresponds to FIG. 1). As shown in FIG. 2, the tool 15 is moved down with the printed circuit board 16 facing down. While a load is applied to the printed circuit board 16, ultrasonic waves are applied at, e.g., a frequency of 40 kHz and a power of 2,480 W, mounting the printed circuit board 16 on the chip 12 (STEP 9). At this time, the space between the chip 12 and the printed circuit board 16 is filled with the sealing material 18, performing simultaneous flip chip connection including the sealing step.

According to this manufacturing method, ultrasonic waves are applied to the printed circuit board 16 more flexible than the chip 12. A defect in the chip 12 such as a scratch or crack can be suppressed to reduce damage in flip chip connection. Further, a sufficient load and ultrasonic waves having a power and frequency (amplitude) suitable for ultrasonic bonding can be applied, suppressing bump misalignment and improving the connectivity.

Since the chip 12 is chucked by the porous stage 11, damage to the chip in the use of a chuck hole can be avoided. Simultaneous connection including not only electrical connection between the chip 12 and the printed circuit board 16 but also the sealing step by setting of a sealing resin (liquid resin or resin sheet) can be realized.

Since the entire lower surface of the chip 12 is chucked and fixed using the porous stage 11, the chip warpage can be straightened. In fixing using a chuck hole, the corner of the chip 12 cannot be fully straightened. However, the use of a porous material enables perfect warpage straightening.

Since both the porous stage 11 and tool 15 are heated, bonding can be further improved.

[25th Embodiment]

Figure 30:
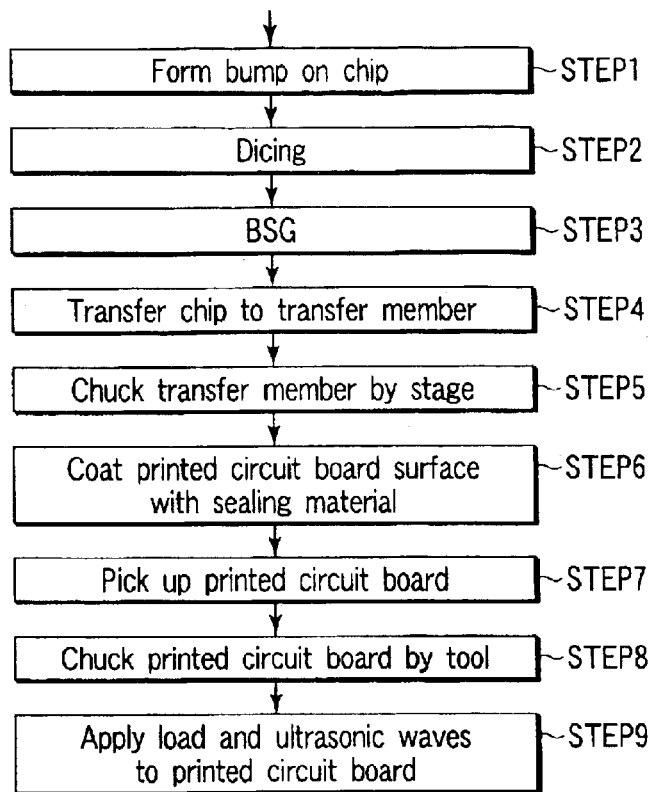
FIG. 30 is a flow chart showing a manufacturing process regarding the ultrasonic flip chip bonding technique for explaining a semiconductor device manufacturing method according to the 25th embodiment of the present invention.

FIG. 30 is a flow chart showing a manufacturing process regarding the ultrasonic flip chip bonding technique for explaining a semiconductor device manufacturing method according to the 25th embodiment of the present invention. Various elements are formed in a semiconductor substrate (wafer) by a known process. A stud bump 14 is formed on an electrode 13 of each semiconductor chip 12 of the wafer (STEP 1).

So-called half-cut dicing is performed to form a groove shallow enough not to reach the lower surface of the wafer from its element formation surface along a dicing line or scribe line by using a diamond scriber, diamond blade, laser scriber, or the like (STEP 2).

The lower surface of the wafer is ground with a grindstone (BSG: Back Side Grinding), simultaneously thinning the wafer and dividing it into chips (STEP 3). Even after the wafer is divided into chips, the lower surface is kept ground by at least 5 $\mu$m or more. This can remove a layer which is formed at the bottom of the groove and damaged by chipping or the like.

The divided chip 12 is fixed and transferred to a transfer member such as a pressure sensitive adhesive sheet (STEP 4). The transfer member is chucked and fixed onto a porous stage 11 (STEP 5).

The formation surface of a printed circuit board 16 for a wiring electrode 17 is coated with a sealing material 18 (STEP 6).

The printed circuit board 16 coated with the sealing material 18 is picked up (STEP 7). A surface of the printed circuit board 16 opposite to the formation surface for the wiring electrode 17 is chucked by a tool 15 (STEP 8).

The tool 15 is moved above the porous stage 11 which holds the chip 12, and aligned (this state corresponds to FIG. 1). As shown in FIG. 2, the tool 15 is moved down with the printed circuit board 16 facing down. While a load is applied to the printed circuit board 16, ultrasonic waves are applied at, e.g., a frequency of 40 kHz and a power of 2,480 W, mounting the printed circuit board 16 on the chip 12 (STEP 9). At this time, the space between the chip 12 and the printed circuit board 16 is filled with the sealing material 18, performing simultaneous flip chip connection including the sealing step.

According to this manufacturing method, ultrasonic waves are applied to the printed circuit board 16 more flexible than the chip 12. A defect in the chip 12 such as a scratch or crack can be suppressed to reduce damage in flip chip connection. Further, a sufficient load and ultrasonic waves having a power and frequency (amplitude) suitable for ultrasonic bonding can be applied, suppressing bump misalignment and improving the connectivity.

Since the chip 12 is chucked by the porous stage 11, damage to the chip in the use of a chuck hole can be avoided. Simultaneous connection including not only electrical connection between the chip 12 and the printed circuit board 16 but also the sealing step by setting of a sealing resin (liquid resin or resin sheet) can be realized.

Since the entire lower surface of the chip 12 is chucked and fixed using the porous stage 11, the chip warpage which readily occurs in thinning by grinding a lower wafer surface (BSG: Back Side Grinding) can be straightened. In fixing using a chuck hole, the corner of the chip 12 cannot be fully straightened. However, the use of a porous material enables perfect warpage straightening.

The chip 12 is transferred onto the transfer member which is chucked and fixed onto the porous stage 11. The step of picking up the divided chip 12 and putting it in a tray after the dicing step, and the step of picking up the chip 12 from the tray in packaging can be omitted, decreasing the number of manufacturing steps.

[26th Embodiment]

Figure 31:
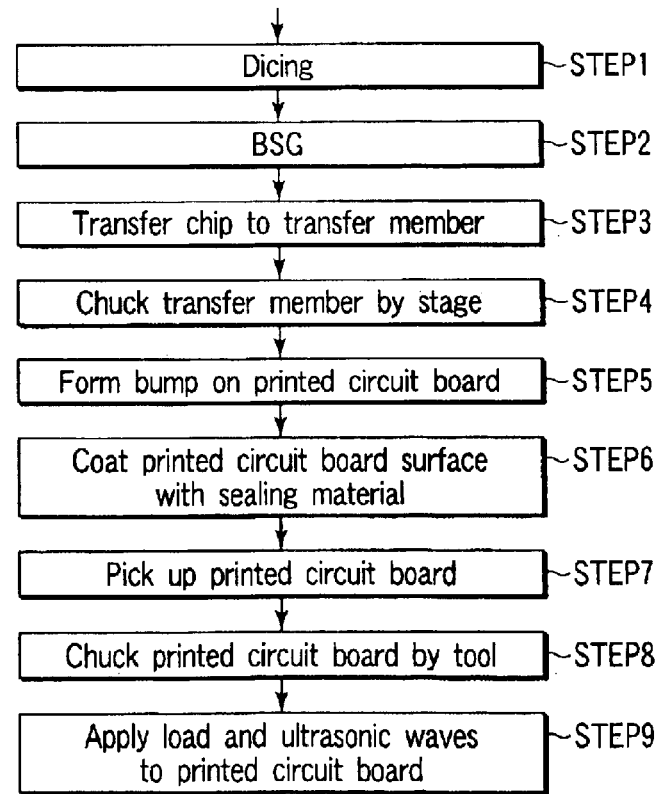
FIG. 31 is a flow chart showing a manufacturing process regarding the ultrasonic flip chip bonding technique for explaining a semiconductor device manufacturing method according to the 26th embodiment of the present invention.

FIG. 31 is a flow chart showing a manufacturing process regarding the ultrasonic flip chip bonding technique for explaining a semiconductor device manufacturing method according to the 26th embodiment of the present invention. Various elements are formed in a semiconductor substrate (wafer) by a known process. So-called half-cut dicing is performed to form a groove shallow enough not to reach the lower surface of the wafer from its element formation surface along a dicing line or scribe line by using a diamond scriber, diamond blade, laser scriber, or the like (STEP 1).

The lower surface of the wafer is ground with a grindstone (BSG: Back Side Grinding), simultaneously thinning the wafer and dividing it into chips (STEP 2). Even after the wafer is divided into chips, the lower surface is kept ground by at least 5 μm or more. This can remove a layer which is formed at the bottom of the groove and damaged by chipping or the like.

A divided chip 12 is fixed and transferred to a transfer member such as a pressure sensitive adhesive sheet (STEP 3). The transfer member is chucked and fixed onto a porous stage 11 (STEP 4).

A stud bump is formed on a wiring electrode 17 of a printed circuit board 16 (STEP 5). A surface of the printed circuit board 16 on the wiring electrode 17 side is coated with a sealing material 18 (STEP 6).

The printed circuit board 16 coated with the sealing material 18 is picked up (STEP 7). A surface of the printed circuit board 16 opposite to the formation surface for the wiring electrode 17 is chucked by a tool 15 (STEP 8).

The tool 15 is moved above the porous stage 11 which holds the chip 12, and aligned (this state corresponds to FIG. 1). As shown in FIG. 2, the tool 15 is moved down with the printed circuit board 16 facing down. While a load is applied to the printed circuit board 16, ultrasonic waves are applied at, e.g., a frequency of 40 kHz and a power of 2,480 W, mounting the printed circuit board 16 on the chip 12 (STEP 9). At this time, the space between the chip 12 and the printed circuit board 16 is filled with the sealing material 18, performing simultaneous flip chip connection including the sealing step.

According to this manufacturing method, ultrasonic waves are applied to the printed circuit board 16 more flexible than the chip 12 though the chip is formed thin in advance by dicing (DBG). A defect on the lower surface of the chip 12 such as a scratch or crack can be suppressed to reduce damage in flip chip connection. In addition, degradation of connectivity by bump misalignment can be suppressed.

Since the chip 12 is chucked by the porous stage 11, damage to the chip in the use of a chuck hole can be avoided. Simultaneous connection including not only electrical connection between the chip 12 and the printed circuit board 16 but also the sealing step by setting of a sealing resin (liquid resin or resin sheet) can be realized.

Since the entire lower surface of the chip 12 is chucked and fixed using the porous stage 11, the chip warpage which readily occurs in thinning by grinding a lower wafer surface (BSG: Back Side Grinding) can be straightened. In fixing using a chuck hole, the corner of the chip 12 cannot be fully straightened. However, the use of a porous material enables perfect warpage straightening.

The chip 12 is transferred onto the transfer member which is chucked and fixed onto the porous stage 11. The step of picking up the divided chip 12 and putting it in a tray after the dicing step, and the step of picking up the chip 12 from the tray in packaging can be omitted, decreasing the number of manufacturing steps.

[27th Embodiment]

Figure 32:
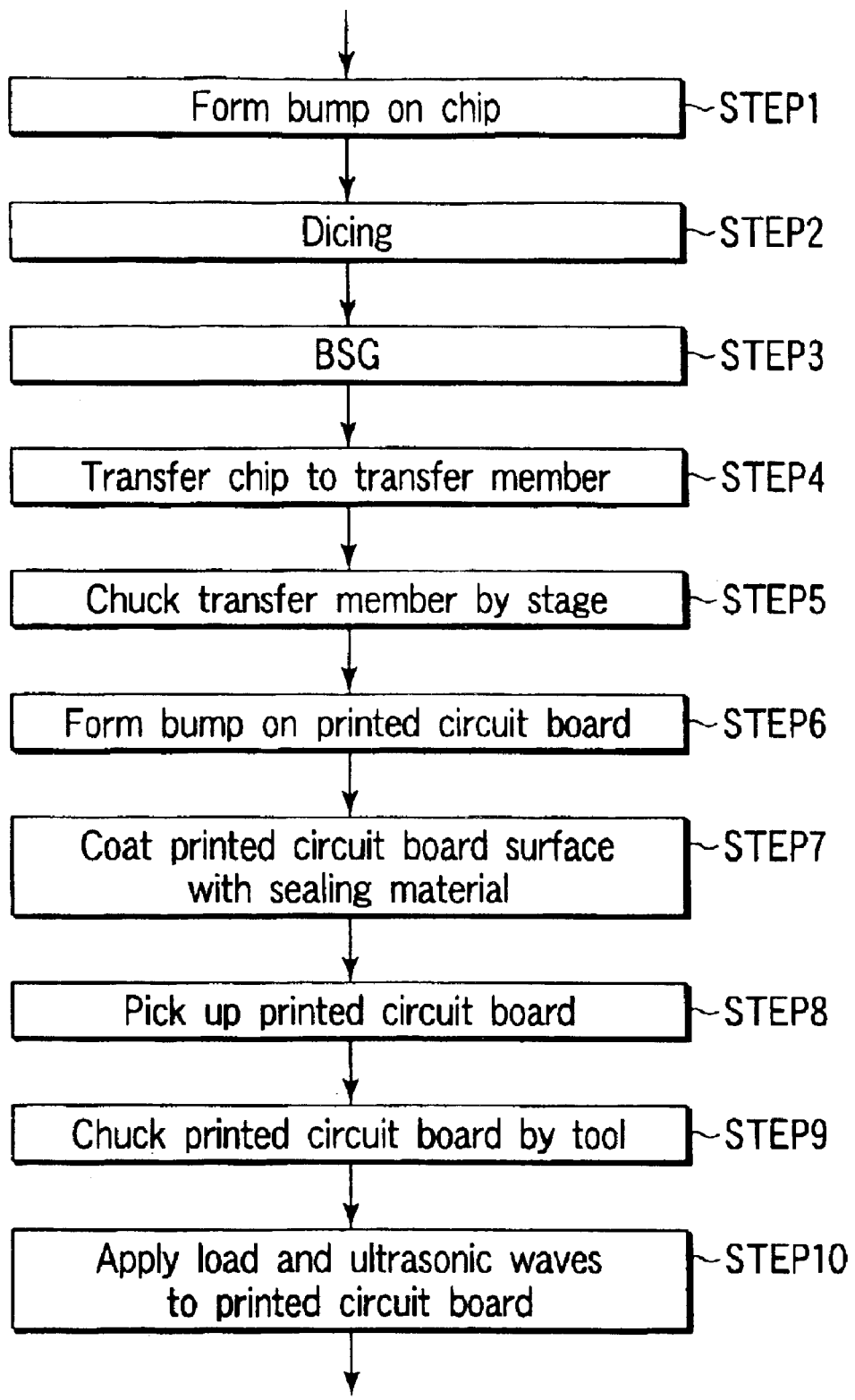
FIG. 32 is a flow chart showing a manufacturing process regarding the ultrasonic flip chip bonding technique for explaining a semiconductor device manufacturing method according to the 27th embodiment of the present invention.

FIG. 32 is a flow chart showing a manufacturing process regarding the ultrasonic flip chip bonding technique for explaining a semiconductor device manufacturing method according to the 27th embodiment of the present invention. Various elements are formed in a semiconductor substrate (wafer) by a known process. A stud bump 14 is formed on an electrode 13 of each semiconductor chip 12 of the wafer (STEP 1).

So-called half-cut dicing is performed to form a groove shallow enough not to reach the lower surface of the wafer from its element formation surface along a dicing line or scribe line by using a diamond scriber, diamond blade, laser scriber, or the like (STEP 2).

The lower surface of the wafer is ground with a grindstone (BSG: Back Side Grinding), simultaneously thinning the wafer and dividing it into chips (STEP 3). Even after the wafer is divided into chips, the lower surface is kept ground by at least 5 μm or more. This can remove a layer which is formed at the bottom of the groove and damaged by chipping or the like.

The divided chip 12 is fixed and transferred to a transfer member such as a pressure sensitive adhesive sheet (STEP 4). The transfer member is chucked and fixed onto a porous stage 11 (STEP 5).

A stud bump is formed on a wiring electrode 17 of a printed circuit board 16 (STEP 6). The formation surface of the printed circuit board 16 for the wiring electrode 17 is coated with a sealing material 18 (STEP 7).

The printed circuit board 16 coated with the sealing material 18 is picked up (STEP 8). A surface of the printed circuit board 16 opposite to the formation surface for the wiring electrode 17 is chucked by a tool 15 (STEP 9).

The tool 15 is moved above the porous stage 11 which holds the chip 12, and aligned (this state corresponds to FIG. 1). As shown in FIG. 2, the tool 15 is moved down with the printed circuit board 16 facing down. While a load is applied to the printed circuit board 16, ultrasonic waves are applied at, e.g., a frequency of 40 kHz and a power of 2,480 W, mounting the printed circuit board 16 on the chip 12 (STEP 10). At this time, the space between the chip 12 and the printed circuit board 16 is filled with the sealing material 18, performing simultaneous flip chip connection including the sealing step.

According to this manufacturing method, ultrasonic waves are applied to the printed circuit board 16 more flexible than the chip 12 though the chip is formed thin by dicing in advance. A defect on the lower surface of the chip 12 such as a scratch or crack can be suppressed to reduce damage in flip chip connection. In addition, degradation of connectivity by bump misalignment can be suppressed.

Since the chip 12 is chucked by the porous stage 11, damage to the chip in the use of a chuck hole can be avoided. Simultaneous connection including not only electrical connection between the chip 12 and the printed circuit board 16 but also the sealing step by setting of a sealing resin (liquid resin or resin sheet) can be realized.

Since the entire lower surface of the chip 12 is chucked and fixed using the porous stage 11, the chip warpage which readily occurs in thinning by grinding a lower wafer surface (BSG: Back Side Grinding) can be straightened. In fixing using a chuck hole, the corner of the chip 12 cannot be fully straightened. However, the use of a porous material enables perfect warpage straightening.

The chip 12 is transferred onto the transfer member which is chucked and fixed onto the porous stage 11. The step of picking up the divided chip 12 and putting it in a tray after the dicing step, and the step of picking up the chip 12 from the tray in packaging can be omitted, decreasing the number of manufacturing steps.

[28th Embodiment]

FIG. 33 is a flow chart showing a manufacturing process regarding the ultrasonic flip chip bonding technique for explaining a semiconductor device manufacturing method according to the 28th embodiment of the present invention. Various elements are formed in a semiconductor substrate (wafer) by a known process. A stud bump 14 is formed on an electrode 13 of each semiconductor chip 12 of the wafer (STEP 1).

So-called half-cut dicing is performed to form a groove shallow enough not to reach the lower surface of the wafer from its element formation surface along a dicing line or scribe line by using a diamond scriber, diamond blade, laser scriber, or the like (STEP 2).

The lower surface of the wafer is ground with a grindstone (BSG: Back Side Grinding), simultaneously thinning the wafer and dividing it into chips (STEP 3). Even after the wafer is divided into chips, the lower surface is kept ground by at least 5 μm or more. This can remove a layer which is formed at the bottom of the groove and damaged by chipping or the like.

The divided chip 12 is fixed and transferred to a transfer member such as a pressure sensitive adhesive sheet (STEP 4). The transfer member is chucked and fixed onto a porous stage 11 (STEP 5).

The formation surface of a printed circuit board 16 for a wiring electrode 17 is coated with a sealing material 18 (STEP 6). The printed circuit board 16 is picked up (STEP 7).

A tool 15 is heated (STEP 8), and a surface of the printed circuit board 16 opposite to the formation surface for the wiring electrode 17 is chucked by the tool 15 (STEP 9).

The tool 15 is moved above the porous stage 11 which holds the chip 12, and aligned (this state corresponds to FIG. 1). As shown in FIG. 2, the tool 15 is moved down with the printed circuit board 16 facing down. While a load is applied to the printed circuit board 16, ultrasonic waves are applied at, e.g., a frequency of 40 kHz and a power of 2,480 W, mounting the printed circuit board 16 on the chip 12 (STEP 10). At this time, the space between the chip 12 and the printed circuit board 16 is filled with the sealing material 18, performing simultaneous flip chip connection including the sealing step.

According to this manufacturing method, ultrasonic waves are applied to the printed circuit board 16 more flexible than the chip 12 though the chip is formed thin by dicing in advance. A defect on the lower surface of the chip 12 such as a scratch or crack can be suppressed to reduce damage in flip chip connection. In addition, degradation of connectivity by bump misalignment can be suppressed.

Since the chip 12 is chucked by the porous stage 11, damage to the chip in the use of a chuck hole can be avoided. Simultaneous connection including not only electrical connection between the chip 12 and the printed circuit board 16 but also the sealing step by setting of a sealing resin (liquid resin or resin sheet) can be realized.

Since the entire lower surface of the chip 12 is chucked and fixed using the porous stage 11, the chip warpage which readily occurs in thinning by grinding a lower wafer surface (BSG: Back Side Grinding) can be straightened. In fixing using a chuck hole, the corner of the chip 12 cannot be fully straightened. However, the use of a porous material enables perfect warpage straightening.

Flip chip connection performed while heating the tool 15 can further promote and improve bonding.

The chip 12 is transferred onto the transfer member which is chucked and fixed onto the porous stage 11. The step of picking up the divided chip 12 and putting it in a tray after the dicing step, and the step of picking up the chip 12 from the tray in packaging can be omitted, decreasing the number of manufacturing steps.

[29th Embodiment]

Figure 34:
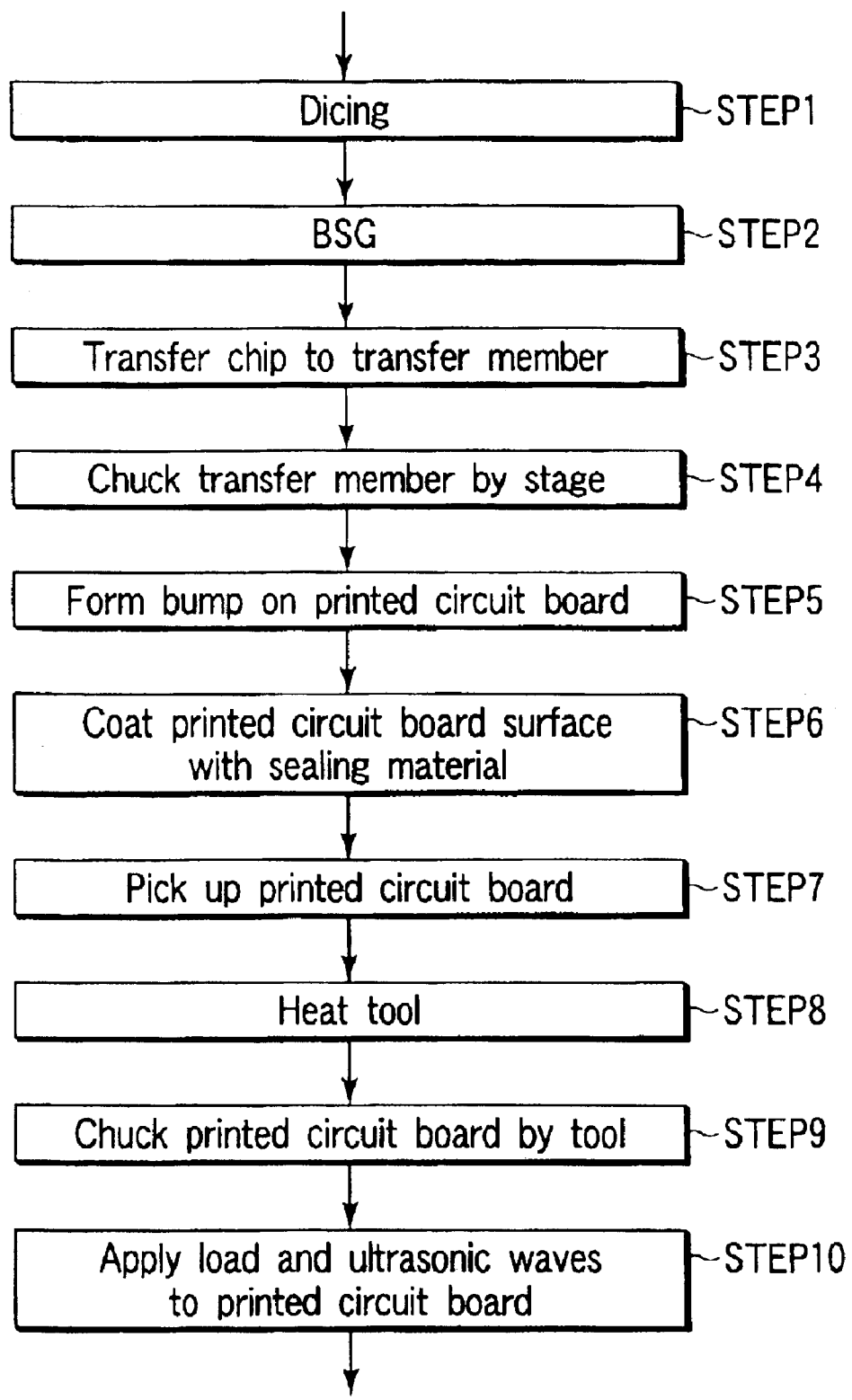
FIG. 34 is a flow chart showing a manufacturing process regarding the ultrasonic flip chip bonding technique for explaining a semiconductor device manufacturing method according to the 29th embodiment of the present invention.

FIG. 34 is a flow chart showing a manufacturing process regarding the ultrasonic flip chip bonding technique for explaining a semiconductor device manufacturing method according to the 29th embodiment of the present invention. Various elements are formed in a semiconductor substrate (wafer) by a known process. So-called half-cut dicing is performed to form a groove shallow enough not to reach the lower surface of the wafer from its element formation surface along a dicing line or scribe line by using a diamond scriber, diamond blade, laser scriber, or the like (STEP 1).

The lower surface of the wafer is ground with a grindstone (BSG: Back Side Grinding), simultaneously thinning the wafer and dividing it into chips (STEP 2). Even after the wafer is divided into chips, the lower surface is kept ground by at least 5 μm or more. This can remove a layer which is formed at the bottom of the groove and damaged by chipping or the like.

A divided chip 12 is fixed and transferred to a transfer member such as a pressure sensitive adhesive sheet (STEP 3). The transfer member is chucked and fixed onto a porous stage 11 (STEP 4).

A stud bump 14 is formed on a wiring electrode 17 of a printed circuit board 16 (STEP 5).

The formation surface of the printed circuit board 16 for the wiring electrode 17 is coated with a sealing material 18 (STEP 6). The printed circuit board 16 is picked up (STEP 7).

A tool 15 is heated (STEP 8), and a surface of the printed circuit board 16 opposite to the formation surface for the wiring electrode 17 is chucked by the tool 15 (STEP 9).

The tool 15 is moved above the porous stage 11 which holds the chip 12, and aligned (this state corresponds to FIG. 1). As shown in FIG. 2, the tool 15 is moved down with the printed circuit board 16 facing down. While a load is applied to the printed circuit board 16, ultrasonic waves are applied at, e.g., a frequency of 40 kHz and a power of 2,480 W, mounting the printed circuit board 16 on the chip 12 (STEP 10). At this time, the space between the chip 12 and the printed circuit board 16 is filled with the sealing material 18, performing simultaneous flip chip connection including the sealing step.

According to this manufacturing method, ultrasonic waves are applied to the printed circuit board 16 more flexible than the chip 12 though the chip is formed thin by dicing in advance. A defect on the lower surface of the chip 12 such as a scratch or crack can be suppressed to reduce damage in flip chip connection. In addition, degradation of connectivity by bump misalignment can be suppressed.

Since the chip 12 is chucked by the porous stage 11, damage to the chip in the use of a chuck hole can be avoided.

Simultaneous connection including not only electrical connection between the chip 12 and the printed circuit board 16 but also the sealing step by setting of a sealing resin (liquid resin or resin sheet) can be realized.

Since the entire lower surface of the chip 12 is chucked and fixed using the porous stage 11, the chip warpage which readily occurs in thinning by grinding a lower wafer surface (BSG: Back Side Grinding) can be straightened. In fixing using a chuck hole, the corner of the chip 12 cannot be fully straightened. However, the use of a porous material enables perfect warpage straightening.

Flip chip connection performed while heating the tool 15 can further promote and improve bonding.

The chip 12 is transferred onto the transfer member which is chucked and fixed onto the porous stage 11. The step of picking up the divided chip 12 and putting it in a tray after the dicing step, and the step of picking up the chip 12 from the tray in packaging can be omitted, decreasing the number of manufacturing steps.

[30th Embodiment]

Figure 35:
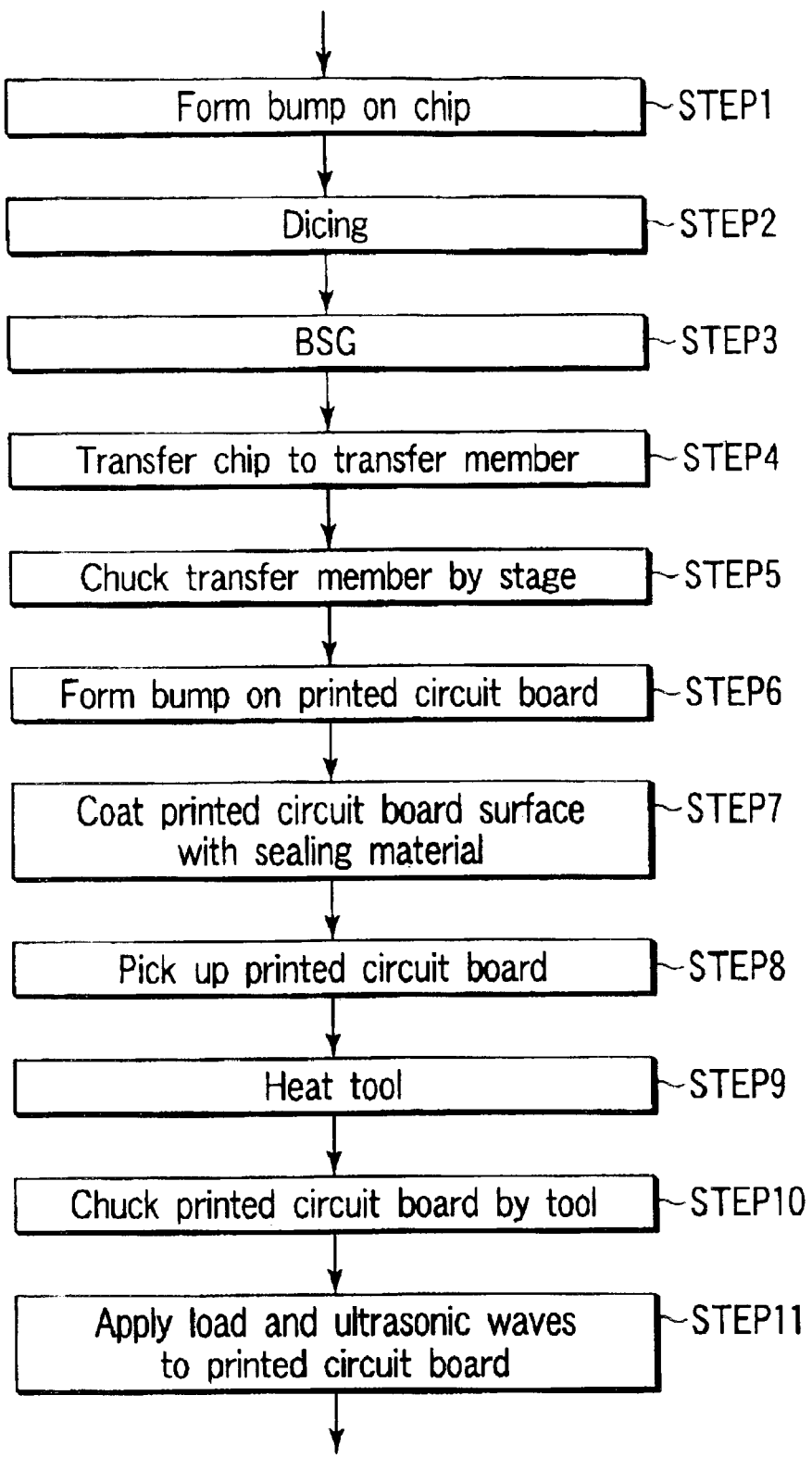
FIG. 35 is a flow chart showing a manufacturing process regarding the ultrasonic flip chip bonding technique for explaining a semiconductor device manufacturing method according to the 30th embodiment of the present invention.

FIG. 35 is a flow chart showing a manufacturing process regarding the ultrasonic flip chip bonding technique for explaining a semiconductor device manufacturing method according to the 30th embodiment of the present invention. Various elements are formed in a semiconductor substrate (wafer) by a known process. A stud bump 14 is formed on an electrode 13 of each semiconductor chip 12 of the wafer (STEP 1).

So-called half-cut dicing is performed to form a groove shallow enough not to reach the lower surface of the wafer from its element formation surface along a dicing line or scribe line by using a diamond scriber, diamond blade, laser scriber, or the like (STEP 2).

The lower surface of the wafer is ground with a grindstone (BSG: Back Side Grinding), simultaneously thinning the wafer and dividing it into chips (STEP 3). Even after the wafer is divided into chips, the lower surface is kept ground by at least 5 $\mu$m or more. This can remove a layer which is formed at the bottom of the groove and damaged by chipping or the like.

The divided chip 12 is fixed and transferred to a transfer member such as a pressure sensitive adhesive sheet (STEP 4). The transfer member is chucked and fixed onto a porous stage 11 (STEP 5).

A stud bump 14 is formed on a wiring electrode 17 of a printed circuit board 16 (STEP 6).

The formation surface of the printed circuit board 16 for the wiring electrode 17 is coated with a sealing material 18 (STEP 7). The printed circuit board 16 is picked up (STEP 8).

A tool 15 is heated (STEP 9), and a surface of the printed circuit board 16 opposite to the formation surface for the wiring electrode 17 is chucked by the tool 15 (STEP 10).

The tool 15 is moved above the porous stage 11 which holds the chip 12, and aligned (this state corresponds to FIG. 1). As shown in FIG. 2, the tool 15 is moved down with the printed circuit board 16 facing down. While a load is applied to the printed circuit board 16, ultrasonic waves are applied at, e.g., a frequency of 40 kHz and a power of 2,480 W, mounting the printed circuit board 16 on the chip 12 (STEP 11). At this time, the space between the chip 12 and the printed circuit board 16 is filled with the sealing material 18, performing simultaneous flip chip connection including the sealing step.

According to this manufacturing method, ultrasonic waves are applied to the printed circuit board 16 more flexible than the chip 12 though the chip is formed thin by dicing in advance. A defect on the lower surface of the chip 12 such as a scratch or crack can be suppressed to reduce damage in flip chip connection. In addition, degradation of connectivity by bump misalignment can be suppressed.

Since the chip 12 is chucked by the porous stage 11, damage to the chip in the use of a chuck hole can be avoided. Simultaneous connection including not only electrical connection between the chip 12 and the printed circuit board 16 but also the sealing step by setting of a sealing resin (liquid resin or resin sheet) can be realized.

Since the entire lower surface of the chip 12 is chucked and fixed using the porous stage 11, the chip warpage which readily occurs in thinning by grinding a lower wafer surface (BSG: Back Side Grinding) can be straightened. In fixing using a chuck hole, the corner of the chip 12 cannot be fully straightened. However, the use of a porous material enables perfect warpage straightening.

Flip chip connection performed while heating the tool 15 can further promote and improve bonding.

The chip 12 is transferred onto the transfer member which is chucked and fixed onto the porous stage 11. The step of picking up the divided chip 12 and putting it in a tray after the dicing step, and the step of picking up the chip 12 from the tray in packaging can be omitted, decreasing the number of manufacturing steps.

[31st Embodiment]

FIG. 36 is a flow chart showing a manufacturing process regarding the ultrasonic flip chip bonding technique for explaining a semiconductor device manufacturing method according to the 31st embodiment of the present invention. Various elements are formed in a semiconductor substrate (wafer) by a known process. A stud bump 14 is formed on an electrode 13 of each semiconductor chip 12 of the wafer (STEP 1).

So-called half-cut dicing is performed to form a groove shallow enough not to reach the lower surface of the wafer from its element formation surface along a dicing line or scribe line by using a diamond scriber, diamond blade, laser scriber, or the like (STEP 2).

The lower surface of the wafer is ground with a grindstone (BSG: Back Side Grinding), simultaneously thinning the wafer and dividing it into chips (STEP 3). Even after the wafer is divided into chips, the lower surface is kept ground by at least 5 $\mu$m or more. This can remove a layer which is formed at the bottom of the groove and damaged by chipping or the like.

The divided chip 12 is fixed and transferred to a transfer member such as a pressure sensitive adhesive sheet (STEP 4). The transfer member is chucked and fixed onto a porous stage 11 (STEP 5). After that, the porous stage 11 is heated (STEP 6).

The formation surface of a printed circuit board 16 for a wiring electrode 17 is coated with a sealing material 18 (STEP 7). The printed circuit board 16 is picked up (STEP 8).

A surface of the printed circuit board 16 opposite to the formation surface for the wiring electrode 17 is chucked by a tool 15 (STEP 9).

The tool 15 is moved above the porous stage 11 which holds the chip 12, and aligned (this state corresponds to FIG. 1). As shown in FIG. 2, the tool 15 is moved down with the printed circuit board 16 facing down. While a load is applied to the printed circuit board 16, ultrasonic waves are applied at, e.g., a frequency of 40 kHz and a power of 2,480 W, mounting the printed circuit board 16 on the chip 12 (STEP 10). At this time, the space between the chip 12 and the printed circuit board 16 is filled with the sealing material 18, performing simultaneous flip chip connection including the sealing step.

According to this manufacturing method, ultrasonic waves are applied to the printed circuit board 16 more flexible than the chip 12 though the chip is formed thin by dicing in advance. A defect on the lower surface of the chip 12 such as a scratch or crack can be suppressed to reduce damage in flip chip connection. In addition, degradation of connectivity by bump misalignment can be suppressed.

Since the chip 12 is chucked by the porous stage 11, damage to the chip in the use of a chuck hole can be avoided. Simultaneous connection including not only electrical connection between the chip 12 and the printed circuit board 16 but also the sealing step by setting of a sealing resin (liquid resin or resin sheet) can be realized.

Since the entire lower surface of the chip 12 is chucked and fixed using the porous stage 11, the chip warpage which readily occurs in thinning by grinding a lower wafer surface (BSG: Back Side Grinding) can be straightened. In fixing using a chuck hole, the corner of the chip 12 cannot be fully straightened. However, the use of a porous material enables perfect warpage straightening.

Flip chip connection performed while heating the porous stage 11 can further promote and improve bonding.

The chip 12 is transferred onto the transfer member which is chucked and fixed onto the porous stage 11. The step of picking up the divided chip 12 and putting it in a tray after the dicing step, and the step of picking up the chip 12 from the tray in packaging can be omitted, decreasing the number of manufacturing steps.

[32nd Embodiment]

Figure 37:
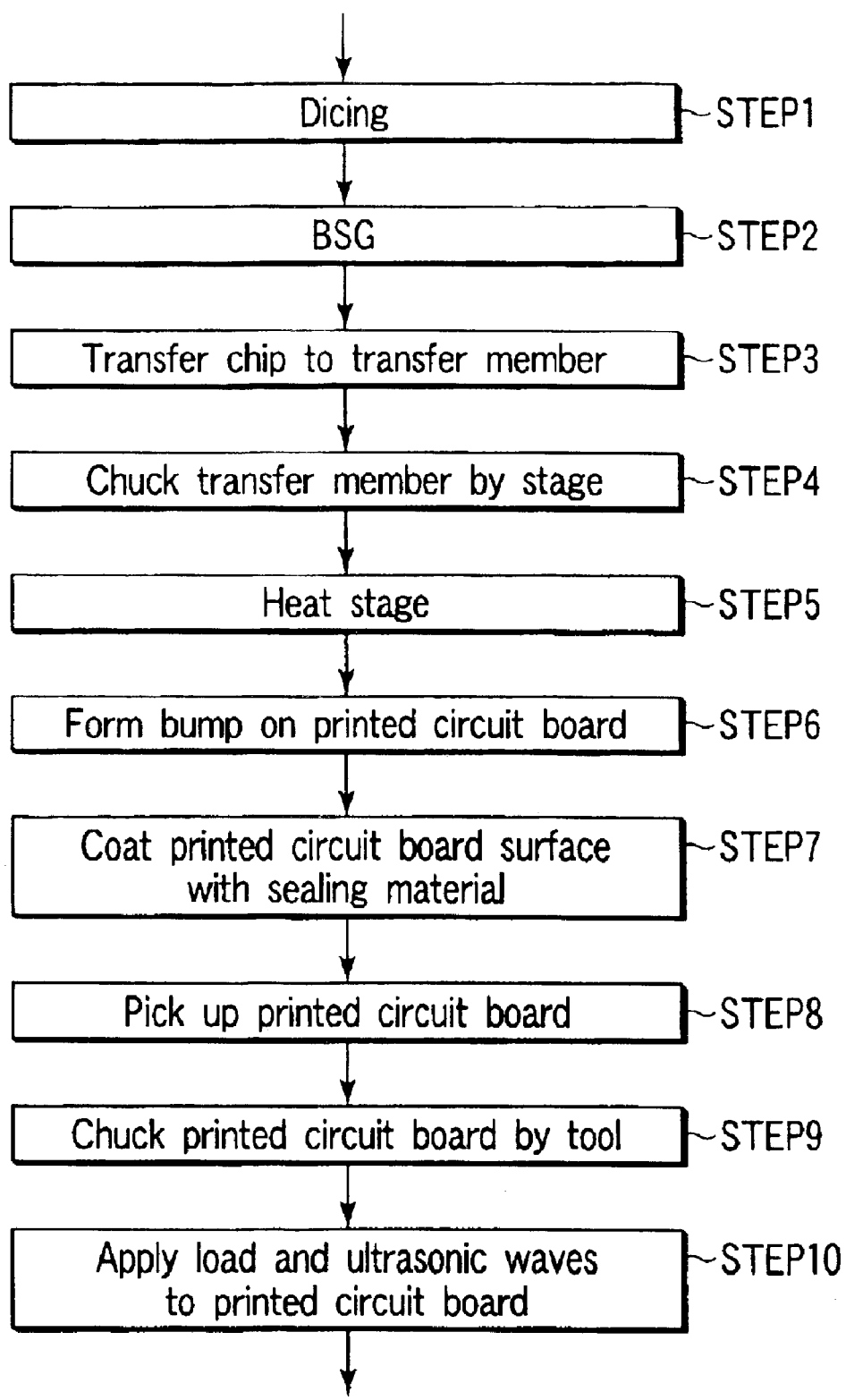
FIG. 37 is a flow chart showing a manufacturing process regarding the ultrasonic flip chip bonding technique for explaining a semiconductor device manufacturing method according to the 32nd embodiment of the present invention.

FIG. 37 is a flow chart showing a manufacturing process regarding the ultrasonic flip chip bonding technique for explaining a semiconductor device manufacturing method according to the 32nd embodiment of the present invention. Various elements are formed in a semiconductor substrate (wafer) by a known process. So-called half-cut dicing is performed to form a groove shallow enough not to reach the lower surface of the wafer from its element formation surface along a dicing line or scribe line by using a diamond scriber, diamond blade, laser scriber, or the like (STEP 1).

The lower surface of the wafer is ground with a grindstone (BSG: Back Side Grinding), simultaneously thinning the wafer and dividing it into chips (STEP 2). Even after the wafer is divided into chips, the lower surface is kept ground by at least 5 $\mu$m or more. This can remove a layer which is formed at the bottom of the groove and damaged by chipping or the like.

A divided chip 12 is fixed and transferred to a transfer member such as a pressure sensitive adhesive sheet (STEP 3). The transfer member is chucked and fixed onto a porous stage 11 (STEP 4). After that, the porous stage 11 is heated (STEP 5).

A stud bump 14 is formed on a wiring electrode 17 of a printed circuit board 16 (STEP 6).

The formation surface of the printed circuit board 16 for the wiring electrode 17 is coated with a sealing material 18 (STEP 7). The printed circuit board 16 is picked up (STEP 8).

A surface of the printed circuit board 16 opposite to the formation surface for the wiring electrode 17 is chucked by a tool 15 (STEP 9).

The tool 15 is moved above the porous stage 11 which holds the chip 12, and aligned (this state corresponds to FIG. 1). As shown in FIG. 2, the tool 15 is moved down with the printed circuit board 16 facing down. While a load is applied to the printed circuit board 16, ultrasonic waves are applied at, e.g., a frequency of 40 kHz and a power of 2,480 W, mounting the printed circuit board 16 on the chip 12 (STEP 10). At this time, the space between the chip 12 and the printed circuit board 16 is filled with the sealing material 18, performing simultaneous flip chip connection including the sealing step.

According to this manufacturing method, ultrasonic waves are applied to the printed circuit board 16 more flexible than the chip 12 though the chip is formed thin by dicing in advance. A defect on the lower surface of the chip 12 such as a scratch or crack can be suppressed to reduce damage in flip chip connection. In addition, degradation of connectivity by bump misalignment can be suppressed.

Since the chip 12 is chucked by the porous stage 11, damage to the chip in the use of a chuck hole can be avoided. Simultaneous connection including not only electrical connection between the chip 12 and the printed circuit board 16 but also the sealing step by setting of a sealing resin (liquid resin or resin sheet) can be realized.

Since the entire lower surface of the chip 12 is chucked and fixed using the porous stage 11, the chip warpage which readily occurs in thinning by grinding a lower wafer surface (BSG: Back Side Grinding) can be straightened. In fixing using a chuck hole, the corner of the chip 12 cannot be fully straightened. However, the use of a porous material enables perfect warpage straightening.

Flip chip connection performed while heating the porous stage 11 can further promote and improve bonding.

The chip 12 is transferred onto the transfer member which is chucked and fixed onto the porous stage 11. The step of picking up the divided chip 12 and putting it in a tray after the dicing step, and the step of picking up the chip 12 from the tray in packaging can be omitted, decreasing the number of manufacturing steps.

[33rd Embodiment]

FIG. 38 is a flow chart showing a manufacturing process regarding the ultrasonic flip chip bonding technique for explaining a semiconductor device manufacturing method according to the 33rd embodiment of the present invention. Various elements are formed in a semiconductor substrate (wafer) by a known process. A stud bump 14 is formed on an electrode 13 of each semiconductor chip 12 of the wafer (STEP 1).

So-called half-cut dicing is performed to form a groove shallow enough not to reach the lower surface of the wafer from its element formation surface along a dicing line or scribe line by using a diamond scriber, diamond blade, laser scriber, or the like (STEP 2).

The lower surface of the wafer is ground with a grindstone (BSG: Back Side Grinding), simultaneously thinning the wafer and dividing it into chips (STEP 3). Even after the wafer is divided into chips, the lower surface is kept ground by at least 5 $\mu$m or more. This can remove a layer which is formed at the bottom of the groove and damaged by chipping or the like.

The divided chip 12 is fixed and transferred to a transfer member such as a pressure sensitive adhesive sheet (STEP 4). The transfer member is chucked and fixed onto a porous stage 11 (STEP 5). After that, the porous stage 11 is heated (STEP 6).

A stud bump is formed on a wiring electrode 17 of a printed circuit board 16 (STEP 7).

The formation surface of the printed circuit board 16 for the wiring electrode 17 is coated with a sealing material 18 (STEP 8). The printed circuit board 16 is picked up (STEP 9).

A surface of the printed circuit board 16 opposite to the formation surface for the wiring electrode 17 is chucked by a tool 15 (STEP 10).

The tool 15 is moved above the porous stage 11 which holds the chip 12, and aligned (this state corresponds to FIG. 1). As shown in FIG. 2, the tool 15 is moved down with the printed circuit board 16 facing down. While a load is applied to the printed circuit board 16, ultrasonic waves are applied at, e.g., a frequency of 40 kHz and a power of 2,480 W, mounting the printed circuit board 16 on the chip 12 (STEP 11). At this time, the space between the chip 12 and the printed circuit board 16 is filled with the sealing material 18, performing simultaneous flip chip connection including the sealing step.

According to this manufacturing method, ultrasonic waves are applied to the printed circuit board 16 more flexible than the chip 12 though the chip is formed thin by dicing in advance. A defect on the lower surface of the chip 12 such as a scratch or crack can be suppressed to reduce damage in flip chip connection. In addition, degradation of connectivity by bump misalignment can be suppressed.

Since the chip 12 is chucked by the porous stage 11, damage to the chip in the use of a chuck hole can be avoided. Simultaneous connection including not only electrical connection between the chip 12 and the printed circuit board 16 but also the sealing step by setting of a sealing resin (liquid resin or resin sheet) can be realized.

Since the entire lower surface of the chip 12 is chucked and fixed using the porous stage 11, the chip warpage which readily occurs in thinning by grinding a lower wafer surface (BSG: Back Side Grinding) can be straightened. In fixing using a chuck hole, the corner of the chip 12 cannot be fully straightened. However, the use of a porous material enables perfect warpage straightening.

Flip chip connection performed while heating the porous stage 11 can further promote and improve bonding.

The chip 12 is transferred onto the transfer member which is chucked and fixed onto the porous stage 11. The step of picking up the divided chip 12 and putting it in a tray after the dicing step, and the step of picking up the chip 12 from the tray in packaging can be omitted, decreasing the number of manufacturing steps.

[34th Embodiment]

Figure 39:
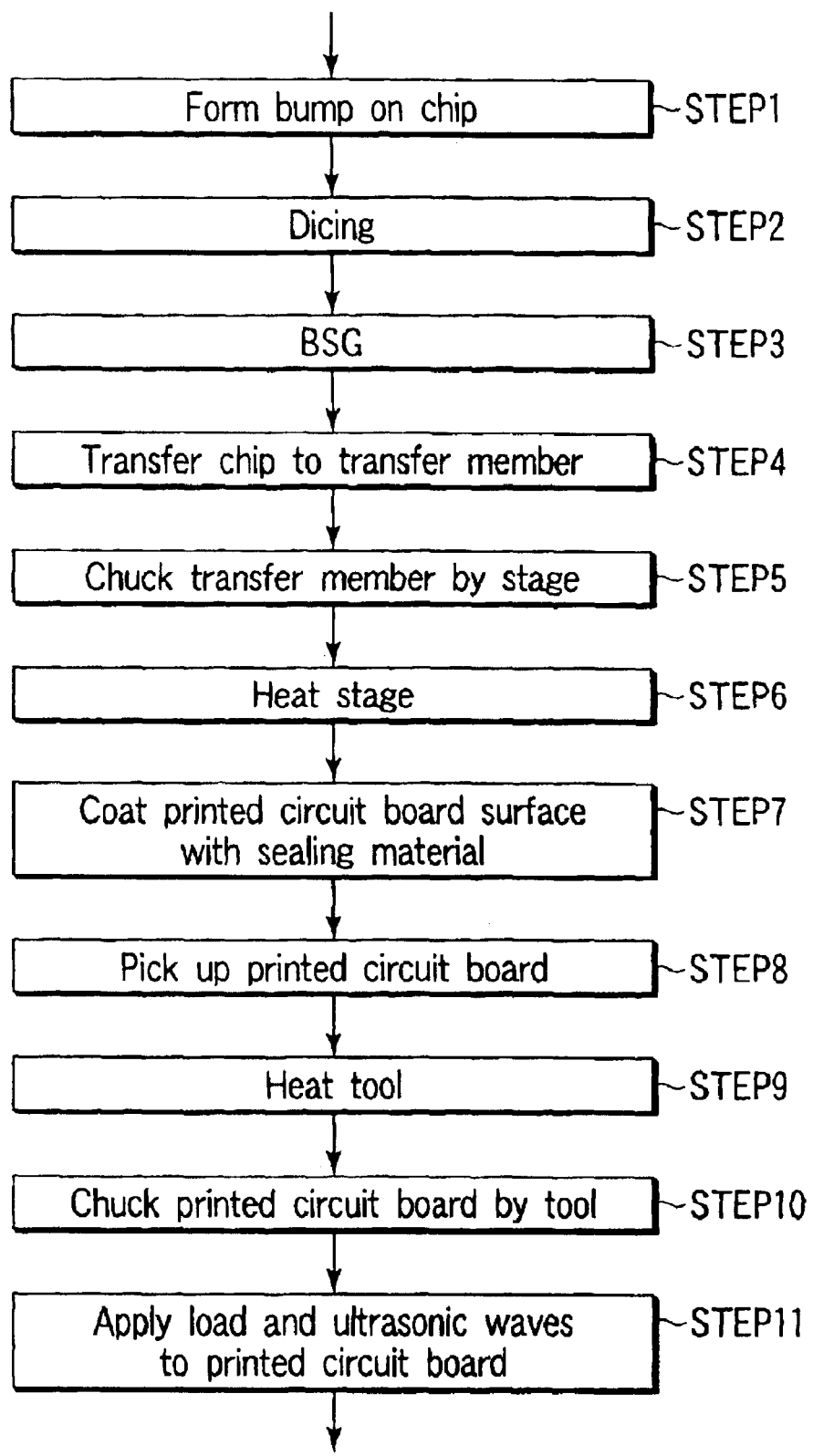
FIG. 39 is a flow chart showing a manufacturing process regarding the ultrasonic flip chip bonding technique for explaining a semiconductor device manufacturing method according to the 34th embodiment of the present invention.

FIG. 39 is a flow chart showing a manufacturing process regarding the ultrasonic flip chip bonding technique for explaining a semiconductor device manufacturing method according to the 34th embodiment of the present invention. Various elements are formed in a semiconductor substrate (wafer) by a known process. A stud bump 14 is formed on an electrode 13 of each semiconductor chip 12 of the wafer (STEP 1).

So-called half-cut dicing is performed to form a groove shallow enough not to reach the lower surface of the wafer from its element formation surface along a dicing line or scribe line by using a diamond scriber, diamond blade, laser scriber, or the like (STEP 2).

The lower surface of the wafer is ground with a grindstone (BSG: Back Side Grinding), simultaneously thinning the wafer and dividing it into chips (STEP 3). Even after the wafer is divided into chips, the lower surface is kept ground by at least 5 μm or more. This can remove a layer which is formed at the bottom of the groove and damaged by chipping or the like.

The divided chip 12 is fixed and transferred to a transfer member such as a pressure sensitive adhesive sheet (STEP 4). The transfer member is chucked and fixed onto a porous stage 11 (STEP 5). After that, the porous stage 11 is heated (STEP 6).

The formation surface of a printed circuit board 16 for a wiring electrode 17 is coated with a sealing material 18 (STEP 7). The printed circuit board 16 is picked up (STEP 8).

A tool 15 is heated (STEP 9), and a surface of the printed circuit board 16 opposite to the formation surface for the wiring electrode 17 is chucked by the tool 15 (STEP 10).

The tool 15 is moved above the porous stage 11 which holds the chip 12, and aligned (this state corresponds to FIG. 1). As shown in FIG. 2, the tool 15 is moved down with the printed circuit board 16 facing down. While a load is applied to the printed circuit board 16, ultrasonic waves are applied at, e.g., a frequency of 40 kHz and a power of 2,480 W, mounting the printed circuit board 16 on the chip 12 (STEP 11). At this time, the space between the chip 12 and the printed circuit board 16 is filled with the sealing material 18, performing simultaneous flip chip connection including the sealing step.

According to this manufacturing method, ultrasonic waves are applied to the printed circuit board 16 more flexible than the chip 12 though the chip is formed thin by dicing in advance. A defect on the lower surface of the chip 12 such as a scratch or crack can be suppressed to reduce damage in flip chip connection. In addition, degradation of connectivity by bump misalignment can be suppressed.

Since the chip 12 is chucked by the porous stage 11, damage to the chip in the use of a chuck hole can be avoided. Simultaneous connection including not only electrical connection between the chip 12 and the printed circuit board 16 but also the sealing step by setting of a sealing resin (liquid resin or resin sheet) can be realized.

Since the entire lower surface of the chip 12 is chucked and fixed using the porous stage 11, the chip warpage which readily occurs in thinning by grinding a lower wafer surface (BSG: Back Side Grinding) can be straightened. In fixing using a chuck hole, the corner of the chip 12 cannot be fully straightened. However, the use of a porous material enables perfect warpage straightening.

Since both the porous stage 11 and tool 15 are heated, bonding can be further improved.

The chip 12 is transferred onto the transfer member which is chucked and fixed onto the porous stage 11. The step of picking up the divided chip 12 and putting it in a tray after the dicing step, and the step of picking up the chip 12 from the tray in packaging can be omitted, decreasing the number of manufacturing steps.

[35th Embodiment]

Figure 40:
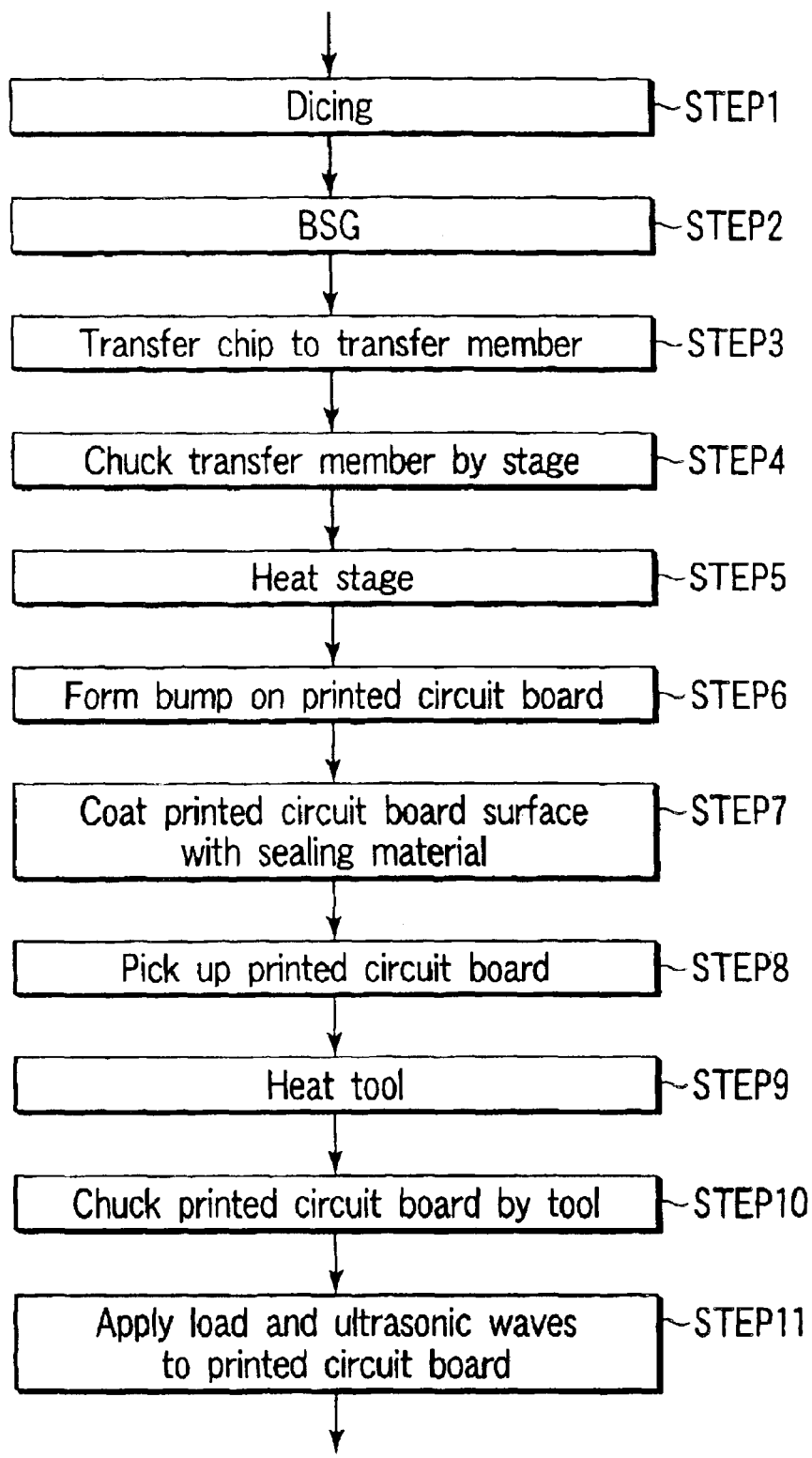
FIG. 40 is a flow chart showing a manufacturing process regarding the ultrasonic flip chip bonding technique for explaining a semiconductor device manufacturing method according to the 35th embodiment of the present invention.

FIG. 40 is a flow chart showing a manufacturing process regarding the ultrasonic flip chip bonding technique for explaining a semiconductor device manufacturing method according to the 35th embodiment of the present invention. Various elements are formed in a semiconductor substrate (wafer) by a known process. So-called half-cut dicing is performed to form a groove shallow enough not to reach the lower surface of the wafer from its element formation surface along a dicing line or scribe line by using a diamond scriber, diamond blade, laser scriber, or the like (STEP 1).

The lower surface of the wafer is ground with a grindstone (BSG: Back Side Grinding), simultaneously thinning the wafer and dividing it into chips (STEP 2). Even after the wafer is divided into chips, the lower surface is kept ground by at least 5 μm or more. This can remove a layer which is formed at the bottom of the groove and damaged by chipping or the like.

A divided chip 12 is fixed and transferred to a transfer member such as a pressure sensitive adhesive sheet (STEP 3). The transfer member is chucked and fixed onto a porous stage 11 (STEP 4). After that, the porous stage 11 is heated (STEP 5).

A stud bump is formed on a wiring electrode 17 of a printed circuit board 16 (STEP 6).

The formation surface of the printed circuit board 16 for the wiring electrode 17 is coated with a sealing material 18 (STEP 7). The printed circuit board 16 is picked up (STEP 8).

A tool 15 is heated (STEP 9), and a surface of the printed circuit board 16 opposite to the formation surface for the wiring electrode 17 is chucked by the tool 15 (STEP 10).

The tool 15 is moved above the porous stage 11 which holds the chip 12, and aligned (this state corresponds to FIG. 1). As shown in FIG. 2, the tool 15 is moved down with the printed circuit board 16 facing down. While a load is applied to the printed circuit board 16, ultrasonic waves are applied at, e.g., a frequency of 40 kHz and a power of 2,480 W, mounting the printed circuit board 16 on the chip 12 (STEP 11). At this time, the space between the chip 12 and the printed circuit board 16 is filled with the sealing material 18, performing simultaneous flip chip connection including the sealing step.

According to this manufacturing method, ultrasonic waves are applied to the printed circuit board 16 more flexible than the chip 12 though the chip is formed thin by dicing in advance. A defect on the lower surface of the chip 12 such as a scratch or crack can be suppressed to reduce damage in flip chip connection. In addition, degradation of connectivity by bump misalignment can be suppressed.

Since the chip 12 is chucked by the porous stage 11, damage to the chip in the use of a chuck hole can be avoided. Simultaneous connection including not only electrical connection between the chip 12 and the printed circuit board 16 but also the sealing step by setting of a sealing resin (liquid resin or resin sheet) can be realized.

Since the entire lower surface of the chip 12 is chucked and fixed using the porous stage 11, the chip warpage which readily occurs in thinning by grinding a lower wafer surface (BSG: Back Side Grinding) can be straightened. In fixing using a chuck hole, the corner of the chip 12 cannot be fully straightened. However, the use of a porous material enables perfect warpage straightening.

Since both the porous stage 11 and tool 15 are heated, bonding can be further improved.

The chip 12 is transferred onto the transfer member which is chucked and fixed onto the porous stage 11. The step of picking up the divided chip 12 and putting it in a tray after the dicing step, and the step of picking up the chip 12 from the tray in packaging can be omitted, decreasing the number of manufacturing steps.

[36th Embodiment]

Figure 41:
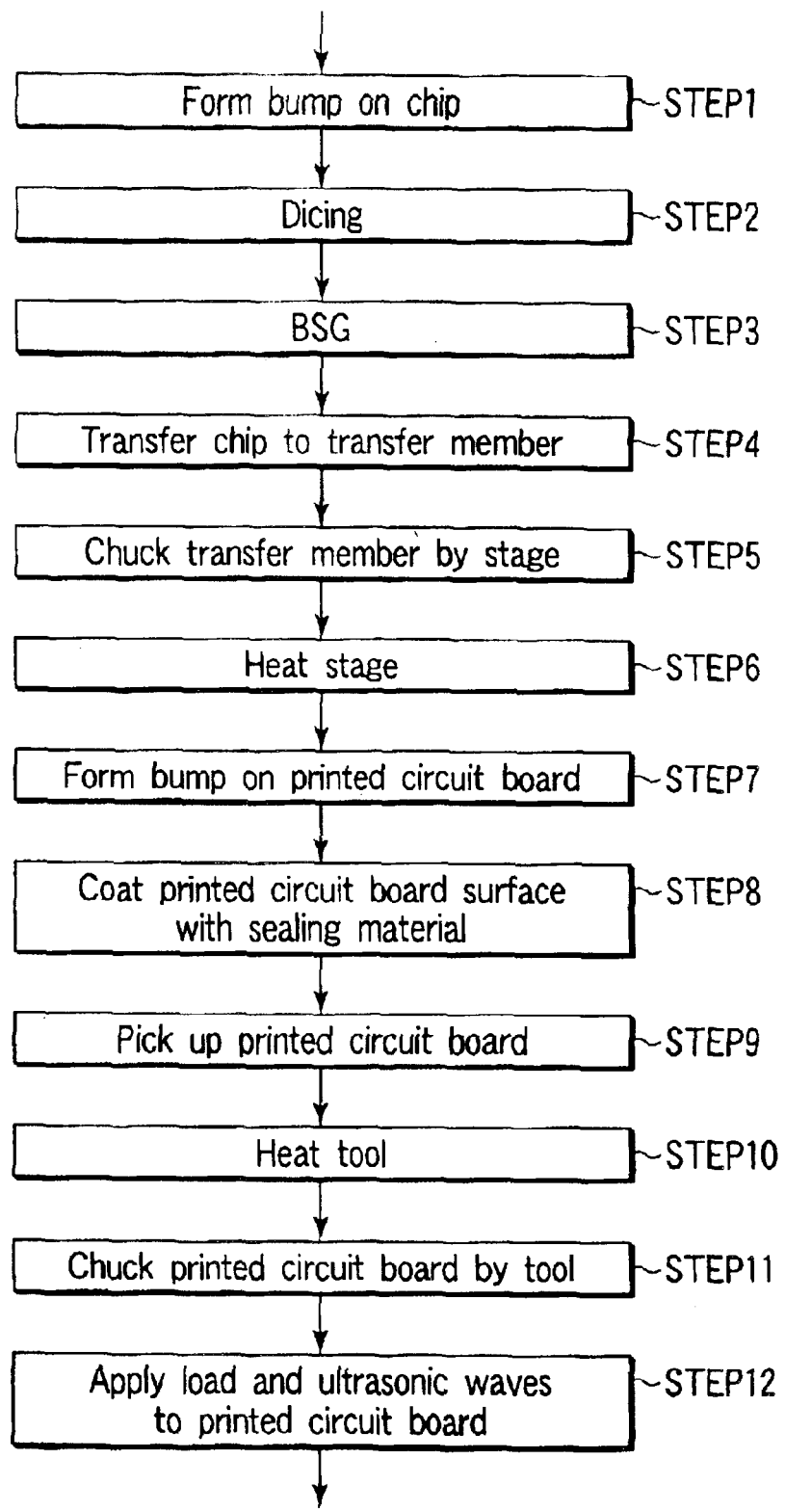
FIG. 41 is a flow chart showing a manufacturing process regarding the ultrasonic flip chip bonding technique for explaining a semiconductor device manufacturing method according to the 36th embodiment of the present invention.

FIG. 41 is a flow chart showing a manufacturing process regarding the ultrasonic flip chip bonding technique for explaining a semiconductor device manufacturing method according to the 36th embodiment of the present invention. Various elements are formed in a semiconductor substrate (wafer) by a known process. A stud bump 14 is formed on an electrode 13 of each semiconductor chip 12 of the wafer (STEP 1).

So-called half-cut dicing is performed to form a groove shallow enough not to reach the lower surface of the wafer from its element formation surface along a dicing line or scribe line by using a diamond scriber, diamond blade, laser scriber, or the like (STEP 2).

The lower surface of the wafer is ground with a grindstone (BSG: Back Side Grinding), simultaneously thinning the wafer and dividing it into chips (STEP 3). Even after the wafer is divided into chips, the lower surface is kept ground by at least 5 μm or more. This can remove a layer which is formed at the bottom of the groove and damaged by chipping or the like.

The divided chip 12 is fixed and transferred to a transfer member such as a pressure sensitive adhesive sheet (STEP 4). The transfer member is chucked and fixed onto a porous stage 11 (STEP 5). After that, the porous stage 11 is heated (STEP 6).

A stud bump is formed on a wiring electrode 17 of a printed circuit board 16 (STEP 7).

The formation surface of the printed circuit board 16 for the wiring electrode 17 is coated with a sealing material 18 (STEP 8). The printed circuit board 16 is picked up (STEP 9).

A tool 15 is heated (STEP 10), and a surface of the printed circuit board 16 opposite to the formation surface for the wiring electrode 17 is chucked by the tool 15 (STEP 11).

The tool 15 is moved above the porous stage 11 which holds the chip 12, and aligned (this state corresponds to FIG. 1). As shown in FIG. 2, the tool 15 is moved down with the printed circuit board 16 facing down. While a load is applied to the printed circuit board 16, ultrasonic waves are applied at, e.g., a frequency of 40 kHz and a power of 2,480 W, mounting the printed circuit board 16 on the chip 12 (STEP 12). At this time, the space between the chip 12 and the printed circuit board 16 is filled with the sealing material 18, performing simultaneous flip chip connection including the sealing step.

According to this manufacturing method, ultrasonic waves are applied to the printed circuit board 16 more flexible than the chip 12 though the chip is formed thin by dicing in advance. A defect on the lower surface of the chip 12 such as a scratch or crack can be suppressed to reduce damage in flip chip connection. In addition, degradation of connectivity by bump misalignment can be suppressed.

Since the chip 12 is chucked by the porous stage 11, damage to the chip in the use of a chuck hole can be avoided. Simultaneous connection including not only electrical connection between the chip 12 and the printed circuit board 16 but also the sealing step by setting of a sealing resin (liquid resin or resin sheet) can be realized.

Since the entire lower surface of the chip 12 is chucked and fixed using the porous stage 11, the chip warpage which readily occurs in thinning by grinding a lower wafer surface (BSG: Back Side Grinding) can be straightened. In fixing using a chuck hole, the corner of the chip 12 cannot be fully straightened. However, the use of a porous material enables perfect warpage straightening.

Since both the porous stage 11 and tool 15 are heated, bonding can be further improved.

The chip 12 is transferred onto the transfer member which is chucked and fixed onto the porous stage 11. The step of picking up the divided chip 12 and putting it in a tray after the dicing step, and the step of picking up the chip 12 from the tray in packaging can be omitted, decreasing the number of manufacturing steps.

[37th Embodiment]

Figure 42:
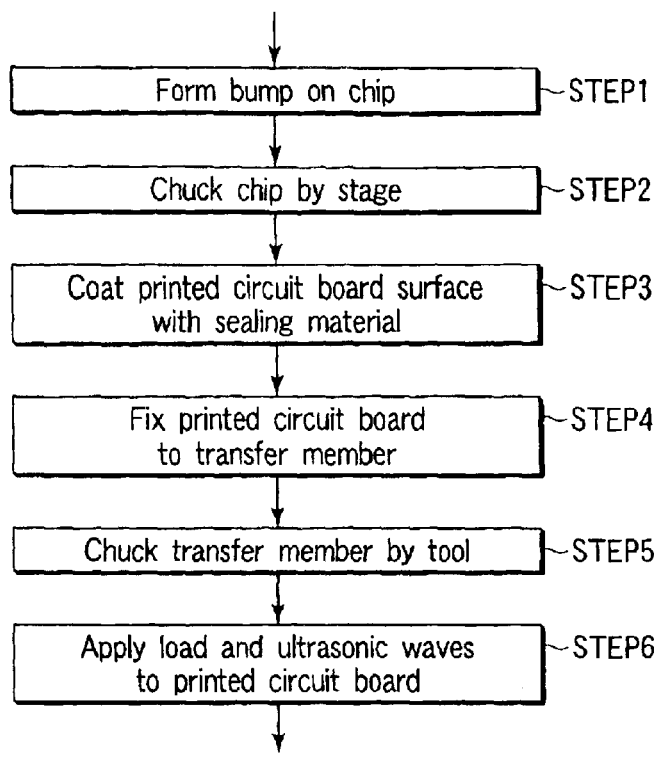
FIG. 42 is a flow chart showing a manufacturing process regarding the ultrasonic flip chip bonding technique for explaining a semiconductor device manufacturing method according to the 37th embodiment of the present invention.

FIG. 42 is a flow chart showing a manufacturing process regarding the ultrasonic flip chip bonding technique for explaining a semiconductor device manufacturing method according to the 37th embodiment of the present invention. Various elements are formed in a semiconductor substrate (wafer) by a known process. The wafer is then diced into chips along the dicing line or scribe line of the wafer by using a diamond scriber, diamond blade, laser scriber, or the like, thereby forming a semiconductor chip 12.

A stud bump 14 is formed on an electrode 13 of the chip 12 (STEP 1).

A surface of the chip 12 opposite to an element formation surface is chucked and fixed onto a porous stage 11 (STEP 2).

A surface of a printed circuit board 16 on a wiring electrode 17 side is coated with a sealing material 18 (STEP 3). The printed circuit board 16 is fixed to a transfer member (STEP 4), and the transfer member is chucked by a tool 15 (STEP 5).

The tool 15 is moved above the porous stage 11 which holds the chip 12, and aligned (this state corresponds to FIG. 1). As shown in FIG. 2, the tool 15 is moved down with the printed circuit board 16 facing down. While a load is applied to the printed circuit board 16, ultrasonic waves are applied at, e.g., a frequency of 40 kHz and a power of 2,480 W, mounting the printed circuit board 16 on the chip 12 (STEP 6). At this time, the space between the chip 12 and the printed circuit board 16 is filled with the sealing material 18, performing simultaneous flip chip connection including the sealing step.

According to this manufacturing method, ultrasonic waves are applied to the printed circuit board 16 more flexible than the chip 12. A defect in the chip 12 such as a scratch or crack can be suppressed to reduce damage in flip chip connection. Further, a sufficient load and ultrasonic waves having a power and frequency (amplitude) suitable for ultrasonic bonding can be applied, suppressing bump misalignment and improving the connectivity.

Since the chip 12 is chucked by the porous stage 11, damage to the chip in the use of a chuck hole can be avoided. Simultaneous connection including not only electrical connection between the chip 12 and the printed circuit board 16 but also the sealing step by setting of a sealing resin (liquid resin or resin sheet) can be realized.

Since the entire lower surface of the chip 12 is chucked and fixed using the porous stage 11, the chip warpage can be straightened. In fixing using a chuck hole, the corner of the chip 12 cannot be fully straightened. However, the use of a porous material enables perfect warpage straightening.

The printed circuit board 16 is fixed to the transfer member, and the transfer member is chucked and fixed to the tool 15. The step of picking up the printed circuit board 16 in order to chuck the printed circuit board 16 by the tool 15 can be omitted.

[38th Embodiment]

Figure 43:
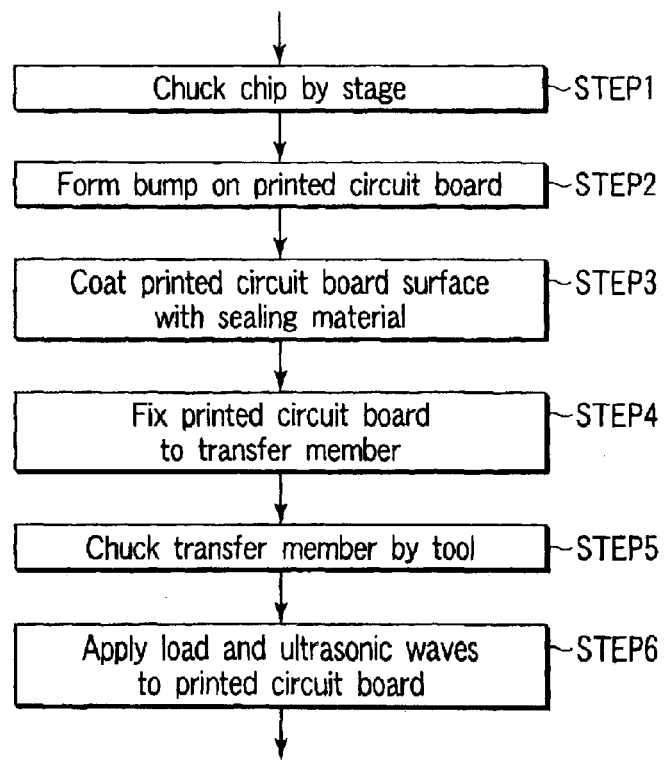
FIG. 43 is a flow chart showing a manufacturing process regarding the ultrasonic flip chip bonding technique for explaining a semiconductor device manufacturing method according to the 38th embodiment of the present invention.

FIG. 43 is a flow chart showing a manufacturing process regarding the ultrasonic flip chip bonding technique for explaining a semiconductor device manufacturing method according to the 38th embodiment of the present invention. Various elements are formed in a semiconductor substrate (wafer) by a known process. The wafer is then diced into chips along the dicing line or scribe line of the wafer by using a diamond scriber, diamond blade, laser scriber, or the like, thereby forming a semiconductor chip 12.

A surface of the chip 12 opposite to an element formation surface is chucked and fixed onto a porous stage 11 (STEP 1).

A stud bump is formed on a wiring electrode 17 of a printed circuit board 16 (STEP 2). A surface of the printed circuit board 16 on the wiring electrode 17 side is coated with a sealing material 18 (STEP 3).

The printed circuit board 16 coated with the sealing material 18 is fixed to a transfer member (STEP 4), and the transfer member is chucked by a tool 15 (STEP 5).

The tool 15 is moved above the porous stage 11 which holds the chip 12, and aligned (this state corresponds to FIG. 1). As shown in FIG. 2, the tool 15 is moved down with the printed circuit board 16 facing down. While a load is applied to the printed circuit board 16, ultrasonic waves are applied at, e.g., a frequency of 40 kHz and a power of 2,480 W, mounting the printed circuit board 16 on the chip 12 (STEP 6). At this time, the space between the chip 12 and the printed circuit board 16 is filled with the sealing material 18, performing simultaneous flip chip connection including the sealing step.

According to this manufacturing method, ultrasonic waves are applied to the printed circuit board 16 more flexible than the chip 12. A defect in the chip 12 such as a scratch or crack can be suppressed to reduce damage in flip chip connection. Further, a sufficient load and ultrasonic waves having a power and frequency (amplitude) suitable for ultrasonic bonding can be applied, suppressing bump misalignment and improving the connectivity.

Since the chip 12 is chucked by the porous stage 11, damage to the chip in the use of a chuck hole can be avoided. Simultaneous connection including not only electrical connection between the chip 12 and the printed circuit board 16 but also the sealing step by setting of a sealing resin (liquid resin or resin sheet) can be realized.

Since the entire lower surface of the chip 12 is chucked and fixed using the porous stage 11, the chip warpage can be straightened. In fixing using a chuck hole, the corner of the chip 12 cannot be fully straightened. However, the use of a porous material enables perfect warpage straightening.

[39th Embodiment]

Figure 44:
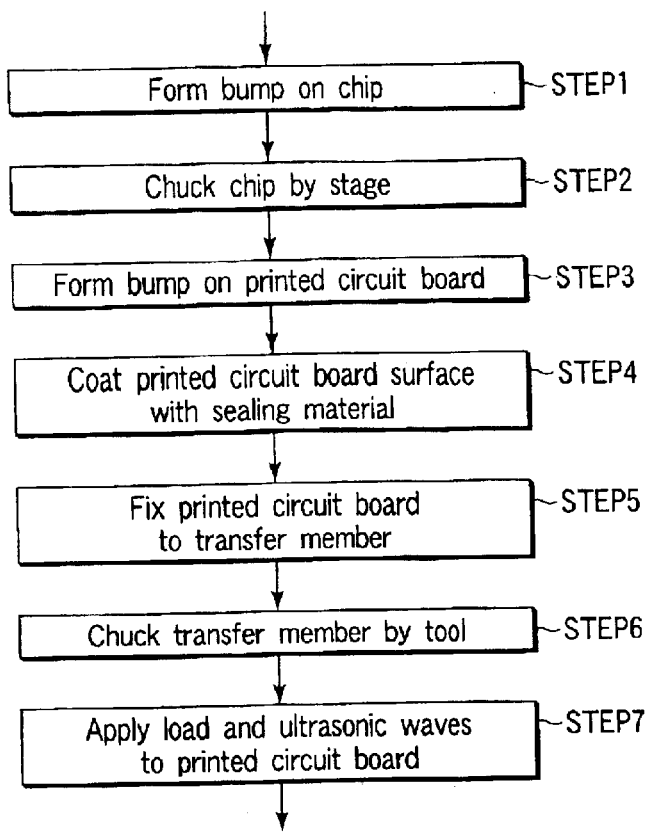
FIG. 44 is a flow chart showing a manufacturing process regarding the ultrasonic flip chip bonding technique for explaining a semiconductor device manufacturing method according to the 39th embodiment of the present invention.

FIG. 44 is a flow chart showing a manufacturing process regarding the ultrasonic flip chip bonding technique for explaining a semiconductor device manufacturing method according to the 39th embodiment of the present invention. Various elements are formed in a semiconductor substrate (wafer) by a known process. The wafer is then diced into chips along the dicing line or scribe line of the wafer by using a diamond scriber, diamond blade, laser scriber, or the like, thereby forming a semiconductor chip 12.

A stud bump 14 is formed on an electrode 13 of the chip 12 (STEP 1).

The lower surface of the chip 12 is chucked and fixed onto a porous stage 11 (STEP 2).

A stud bump is formed on a wiring electrode 17 of a printed circuit board 16 (STEP 3).

The formation surface of the printed circuit board 16 for the wiring electrode 17 is coated with a sealing material 18 (STEP 4).

The printed circuit board 16 is fixed to a transfer member (STEP 5), and the transfer member is chucked by a tool 15 (STEP 6).

The tool 15 is moved above the porous stage 11 which holds the chip 12, and aligned (this state corresponds to FIG. 1). As shown in FIG. 2, the tool 15 is moved down with the printed circuit board 16 facing down. While a load is applied to the printed circuit board 16, ultrasonic waves are applied at, e.g., a frequency of 40 kHz and a power of 2,480 W, mounting the printed circuit board 16 on the chip 12 (STEP 7). At this time, the space between the chip 12 and the printed circuit board 16 is filled with the sealing material 18, performing simultaneous flip chip connection including the sealing step.

According to this manufacturing method, ultrasonic waves are applied to the printed circuit board 16 more flexible than the chip 12. A defect in the chip 12 such as a scratch or crack can be suppressed to reduce damage in flip chip connection. Further, a sufficient load and ultrasonic waves having a power and frequency (amplitude) suitable for ultrasonic bonding can be applied, suppressing bump misalignment and improving the connectivity.

Since the chip 12 is chucked by the porous stage 11, damage to the chip in the use of a chuck hole can be avoided. Simultaneous connection including not only electrical connection between the chip 12 and the printed circuit board 16 but also the sealing step by setting of a sealing resin (liquid resin or resin sheet) can be realized.

Since the entire lower surface of the chip 12 is chucked and fixed using the porous stage 11, the chip warpage can be straightened. In fixing using a chuck hole, the corner of the chip 12 cannot be fully straightened. However, the use of a porous material enables perfect warpage straightening.

[40th Embodiment]

Figure 45:
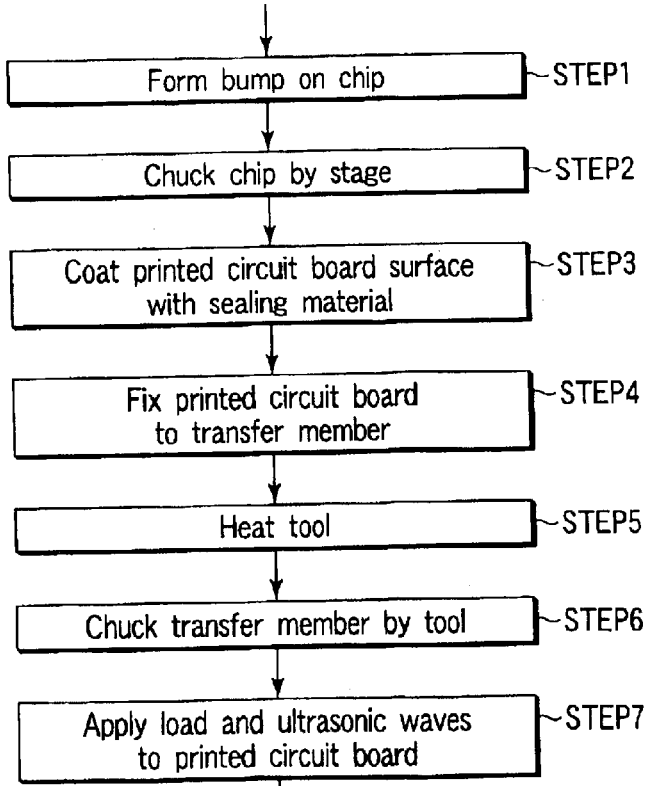
FIG. 45 is a flow chart showing a manufacturing process regarding the ultrasonic flip chip bonding technique for explaining a semiconductor device manufacturing method according to the 40th embodiment of the present invention.

FIG. 45 is a flow chart showing a manufacturing process regarding the ultrasonic flip chip bonding technique for explaining a semiconductor device manufacturing method according to the 40th embodiment of the present invention. Various elements are formed in a semiconductor substrate (wafer) by a known process. The wafer is then diced into chips along the dicing line or scribe line of the wafer by using a diamond scriber, diamond blade, laser scriber, or the like, thereby forming a semiconductor chip 12.

A stud bump 14 is formed on an electrode 13 of the chip 12 (STEP 1).

A surface of the chip 12 opposite to an element formation surface is chucked and fixed onto a porous stage 11 (STEP 2).

The formation surface of a printed circuit board 16 for a wiring electrode 17 is coated with a sealing material 18 (STEP 3).

The printed circuit board 16 coated with the sealing material 18 is fixed to a transfer member (STEP 4).

A tool 15 is heated (STEP 5), and chucks the transfer member (STEP 6).

The tool 15 is moved above the porous stage 11 which holds the chip 12, and aligned (this state corresponds to FIG. 1). As shown in FIG. 2, the tool 15 is moved down with the printed circuit board 16 facing down. While a load is applied to the printed circuit board 16, ultrasonic waves are applied at, e.g., a frequency of 40 kHz and a power of 2,480 W, mounting the printed circuit board 16 on the chip 12 (STEP 7). At this time, the space between the chip 12 and the printed circuit board 16 is filled with the sealing material 18, performing simultaneous flip chip connection including the sealing step.

According to this manufacturing method, ultrasonic waves are applied to the printed circuit board 16 more flexible than the chip 12. A defect in the chip 12 such as a scratch or crack can be suppressed to reduce damage in flip chip connection. Further, a sufficient load and ultrasonic waves having a power and frequency (amplitude) suitable for ultrasonic bonding can be applied, suppressing bump misalignment and improving the connectivity.

Since the chip 12 is chucked by the porous stage 11, damage to the chip in the use of a chuck hole can be avoided. Simultaneous connection including not only electrical connection between the chip 12 and the printed circuit board 16 but also the sealing step by setting of a sealing resin (liquid resin or resin sheet) can be realized.

Since the entire lower surface of the chip 12 is chucked and fixed using the porous stage 11, the chip warpage can be straightened. In fixing using a chuck hole, the corner of the chip 12 cannot be fully straightened. However, the use of a porous material enables perfect warpage straightening.

[41st Embodiment]

Figure 46:
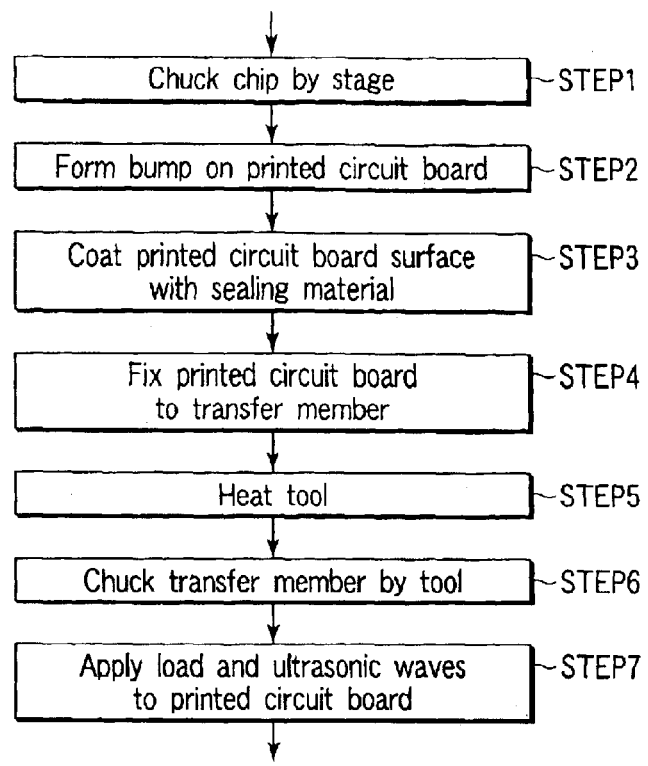
FIG. 46 is a flow chart showing a manufacturing process regarding the ultrasonic flip chip bonding technique for explaining a semiconductor device manufacturing method according to the 41st embodiment of the present invention.

FIG. 46 is a flow chart showing a manufacturing process regarding the ultrasonic flip chip bonding technique for explaining a semiconductor device manufacturing method according to the 41st embodiment of the present invention. Various elements are formed in a semiconductor substrate (wafer) by a known process. The wafer is then diced into chips along the dicing line or scribe line of the wafer by using a diamond scriber, diamond blade, laser scriber, or the like, thereby forming a semiconductor chip 12.

A surface of the chip 12 opposite to an element formation surface is chucked and fixed onto a porous stage 11 (STEP 1).

A stud bump is formed on a wiring electrode 17 of a printed circuit board 16 (STEP 2). The formation surface of the printed circuit board 16 for the wiring electrode 17 is coated with a sealing material 18 (STEP 3). The printed circuit board 16 is fixed to a transfer member (STEP 4).

A tool 15 is heated (STEP 5), and chucks the transfer member (STEP 6).

The tool 15 is moved above the porous stage 11 which holds the chip 12, and aligned (this state corresponds to FIG. 1). As shown in FIG. 2, the tool 15 is moved down with the printed circuit board 16 facing down. While a load is applied to the printed circuit board 16, ultrasonic waves are applied at, e.g., a frequency of 40 kHz and a power of 2,480 W, mounting the printed circuit board 16 on the chip 12 (STEP 7). At this time, the space between the chip 12 and the printed circuit board 16 is filled with the sealing material 18, performing simultaneous flip chip connection including the sealing step.

According to this manufacturing method, ultrasonic waves are applied to the printed circuit board 16 more flexible than the chip 12. A defect in the chip 12 such as a scratch or crack can be suppressed to reduce damage in flip chip connection. Further, a sufficient load and ultrasonic waves having a power and frequency (amplitude) suitable for ultrasonic bonding can be applied, suppressing bump misalignment and improving the connectivity.

Since the chip 12 is chucked by the porous stage 11, damage to the chip in the use of a chuck hole can be avoided. Simultaneous connection including not only electrical connection between the chip 12 and the printed circuit board 16 but also the sealing step by setting of a sealing resin (liquid resin or resin sheet) can be realized.

Since the entire lower surface of the chip 12 is chucked and fixed using the porous stage 11, the chip warpage can be straightened. In fixing using a chuck hole, the corner of the chip 12 cannot be fully straightened. However, the use of a porous material enables perfect warpage straightening.

Flip chip connection performed while heating the tool 15 can further promote and improve bonding.

[42nd Embodiment]

Figure 47:
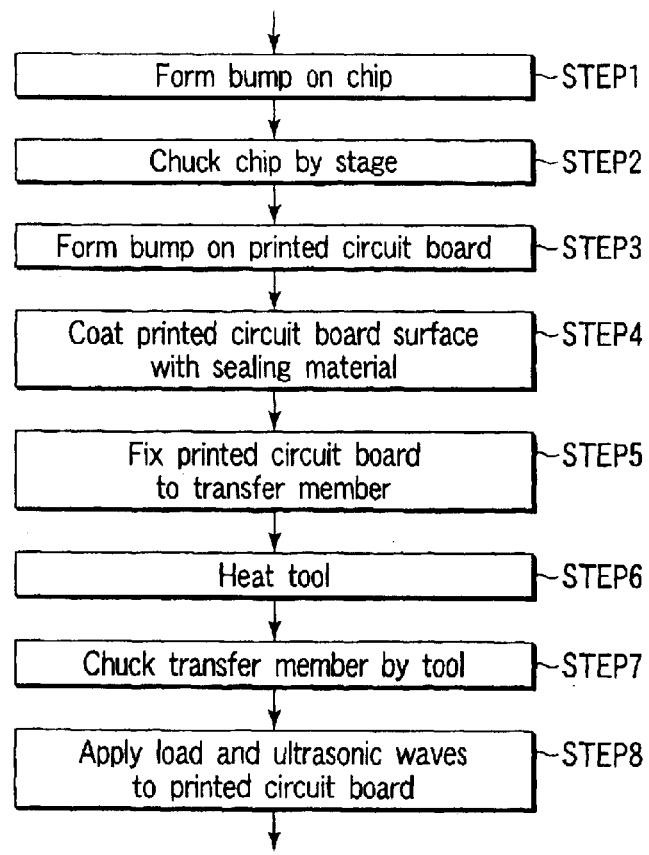
FIG. 47 is a flow chart showing a manufacturing process regarding the ultrasonic flip chip bonding technique for explaining a semiconductor device manufacturing method according to the 42nd embodiment of the present invention.

FIG. 47 is a flow chart showing a manufacturing process regarding the ultrasonic flip chip bonding technique for explaining a semiconductor device manufacturing method according to the 42nd embodiment of the present invention. Various elements are formed in a semiconductor substrate (wafer) by a known process. The wafer is then diced into chips along the dicing line or scribe line of the wafer by using a diamond scriber, diamond blade, laser scriber, or the like, thereby forming a semiconductor chip 12.

A stud bump 14 is formed on an electrode 13 of the chip 12 (STEP 1). A surface of the chip 12 opposite to an element formation surface is chucked and fixed onto a porous stage 11 (STEP 2).

A stud bump is formed on a wiring electrode 17 of a printed circuit board 16 (STEP 3). The formation surface of the printed circuit board 16 for the wiring electrode 17 is coated with a sealing material 18 (STEP 4). The printed circuit board 16 is fixed to a transfer member (STEP 5).

A tool 15 is heated (STEP 6), and chucks the transfer member (STEP 7).

The tool 15 is moved above the porous stage 11 which holds the chip 12, and aligned (this state corresponds to FIG. 1). As shown in FIG. 2, the tool 15 is moved down with the printed circuit board 16 facing down. While a load is applied to the printed circuit board 16, ultrasonic waves are applied at, e.g., a frequency of 40 kHz and a power of 2,480 W, mounting the printed circuit board 16 on the chip 12 (STEP 8). At this time, the space between the chip 12 and the printed circuit board 16 is filled with the sealing material 18, performing simultaneous flip chip connection including the sealing step.

According to this manufacturing method, ultrasonic waves are applied to the printed circuit board 16 more flexible than the chip 12. A defect in the chip 12 such as a scratch or crack can be suppressed to reduce damage in flip chip connection. Further, a sufficient load and ultrasonic waves having a power and frequency (amplitude) suitable for ultrasonic bonding can be applied, suppressing bump misalignment and improving the connectivity.

Since the chip 12 is chucked by the porous stage 11, damage to the chip in the use of a chuck hole can be avoided. Simultaneous connection including not only electrical connection between the chip 12 and the printed circuit board 16 but also the sealing step by setting of a sealing resin (liquid resin or resin sheet) can be realized.

Since the entire lower surface of the chip 12 is chucked and fixed using the porous stage 11, the chip warpage can be straightened. In fixing using a chuck hole, the corner of the chip 12 cannot be fully straightened. However, the use of a porous material enables perfect warpage straightening.

Flip chip connection performed while heating the tool 15 can further promote and improve bonding.

[43rd Embodiment]

Figure 48:
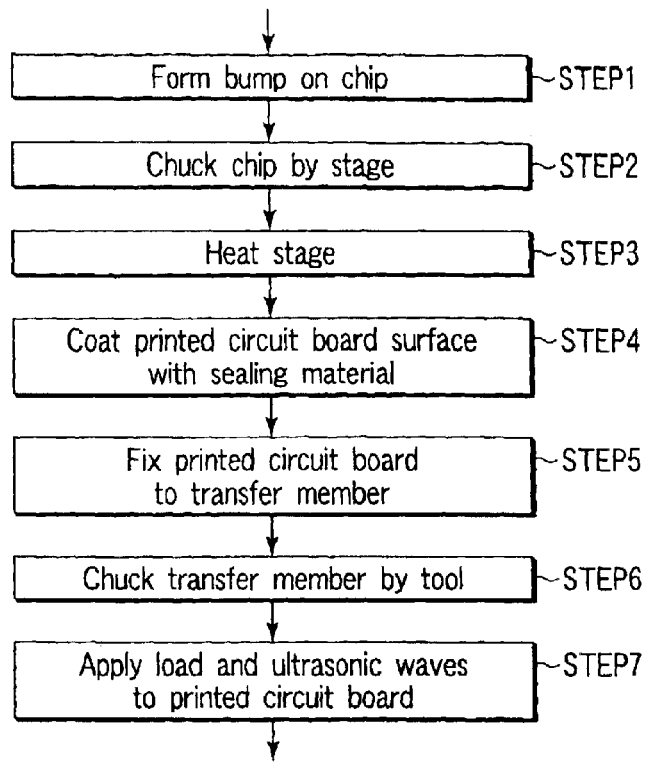
FIG. 48 is a flow chart showing a manufacturing process regarding the ultrasonic flip chip bonding technique for explaining a semiconductor device manufacturing method according to the 43rd embodiment of the present invention.

FIG. 48 is a flow chart showing a manufacturing process regarding the ultrasonic flip chip bonding technique for explaining a semiconductor device manufacturing method according to the 43rd embodiment of the present invention. Various elements are formed in a semiconductor substrate (wafer) by a known process. The wafer is then diced into chips along the dicing line or scribe line of the wafer by using a diamond scriber, diamond blade, laser scriber, or the like, thereby forming a semiconductor chip 12.

A stud bump 14 is formed on an electrode 13 of the chip 12 (STEP 1). A surface of the chip 12 opposite to an element formation surface is chucked and fixed onto a porous stage 11 (STEP 2). Thereafter, the porous stage 11 is heated (STEP 3).

The formation surface of a printed circuit board 16 for a wiring electrode 17 is coated with a sealing material 18 (STEP 4)

The printed circuit board 16 coated with the sealing material 18 is fixed to a transfer member (STEP 5). The transfer member is chucked by a tool 15 (STEP 6).

The tool 15 is moved above the porous stage 11 which holds the chip 12, and aligned (this state corresponds to FIG. 1). As shown in FIG. 2, the tool 15 is moved down with the printed circuit board 16 facing down. While a load is applied to the printed circuit board 16, ultrasonic waves are applied at, e.g., a frequency of 40 kHz and a power of 2,480 W, mounting the printed circuit board 16 on the chip 12 (STEP 7). At this time, the space between the chip 12 and the printed circuit board 16 is filled with the sealing material 18, performing simultaneous flip chip connection including the sealing step.

According to this manufacturing method, ultrasonic waves are applied to the printed circuit board 16 more flexible than the chip 12. A defect in the chip 12 such as a scratch or crack can be suppressed to reduce damage in flip chip connection. Further, a sufficient load and ultrasonic waves having a power and frequency (amplitude) suitable for ultrasonic bonding can be applied, suppressing bump misalignment and improving the connectivity.

Since the chip 12 is chucked by the porous stage 11, damage to the chip in the use of a chuck hole can be avoided. Simultaneous connection including not only electrical connection between the chip 12 and the printed circuit board 16 but also the sealing step by setting of a sealing resin (liquid resin or resin sheet) can be realized.

Since the entire lower surface of the chip 12 is chucked and fixed using the porous stage 11, the chip warpage can be straightened. In fixing using a chuck hole, the corner of the chip 12 cannot be fully straightened. However, the use of a porous material enables perfect warpage straightening.

Flip chip connection performed while heating the porous stage 11 can promote and improve bonding.

[44th Embodiment]

Figure 49:
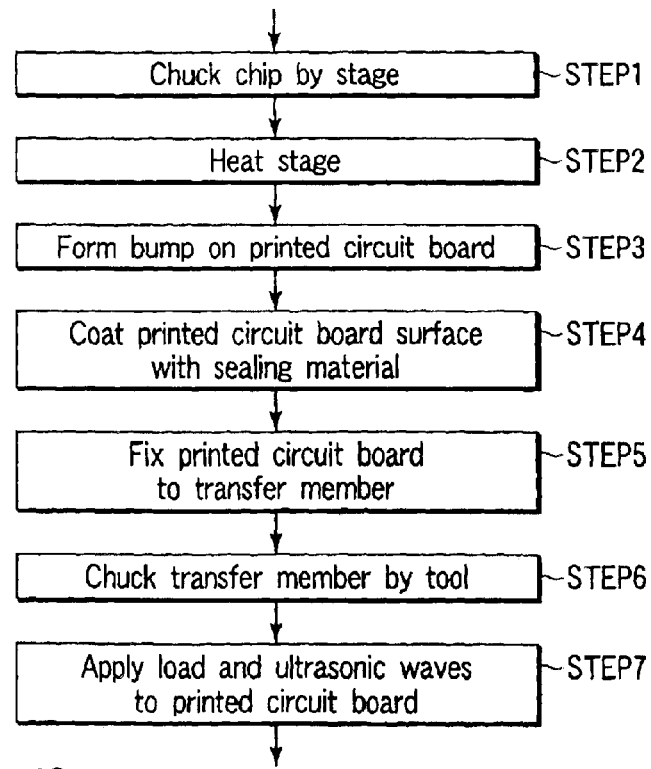
FIG. 49 is a flow chart showing a manufacturing process regarding the ultrasonic flip chip bonding technique for explaining a semiconductor device manufacturing method according to the 44th embodiment of the present invention.

FIG. 49 is a flow chart showing a manufacturing process regarding the ultrasonic flip chip bonding technique for explaining a semiconductor device manufacturing method according to the 44th embodiment of the present invention. Various elements are formed in a semiconductor substrate (wafer) by a known process. The wafer is then diced into chips along the dicing line or scribe line of the wafer by using a diamond scriber, diamond blade, laser scriber, or the like, thereby forming a semiconductor chip 12.

The chip 12 is chucked and fixed onto a porous stage 11 (STEP 1). In this state, the porous stage 11 is heated (STEP 2).

A stud bump is formed on a wiring electrode 17 of a printed circuit board 16 (STEP 3).

The formation surface of the printed circuit board 16 for the wiring electrode 17 is coated with a sealing material 18 (STEP 4). The printed circuit board 16 is fixed to a transfer member (STEP 5). The transfer member is chucked by a tool 15 (STEP 6).

The tool 15 is moved above the porous stage 11 which holds the chip 12, and aligned (this state corresponds to FIG. 1). As shown in FIG. 2, the tool 15 is moved down with the printed circuit board 16 facing down. While a load is applied to the printed circuit board 16, ultrasonic waves are applied at, e.g., a frequency of 40 kHz and a power of 2,480 W, mounting the printed circuit board 16 on the chip 12 (STEP 7). At this time, the space between the chip 12 and the printed circuit board 16 is filled with the sealing material 18, performing simultaneous flip chip connection including the sealing step.

According to this manufacturing method, ultrasonic waves are applied to the printed circuit board 16 more flexible than the chip 12. A defect in the chip 12 such as a scratch or crack can be suppressed to reduce damage in flip chip connection. Further, a sufficient load and ultrasonic waves having a power and frequency (amplitude) suitable for ultrasonic bonding can be applied, suppressing bump misalignment and improving the connectivity.

Since the chip 12 is chucked by the porous stage 11, damage to the chip in the use of a chuck hole can be avoided. Simultaneous connection including not only electrical connection between the chip 12 and the printed circuit board 16 but also the sealing step by setting of a sealing resin (liquid resin or resin sheet) can be realized.

Since the entire lower surface of the chip 12 is chucked and fixed using the porous stage 11, the chip warpage can be straightened. In fixing using a chuck hole, the corner of the chip 12 cannot be fully straightened. However, the use of a porous material enables perfect warpage straightening.

Flip chip connection performed while heating the porous stage 11 can promote and improve bonding.

The printed circuit board 16 is fixed to the transfer member, and the transfer member is chucked and fixed to the tool 15. The step of picking up the printed circuit board 16 in order to chuck the printed circuit board 16 by the tool 15 can be omitted.

[45th Embodiment]

Figure 50:
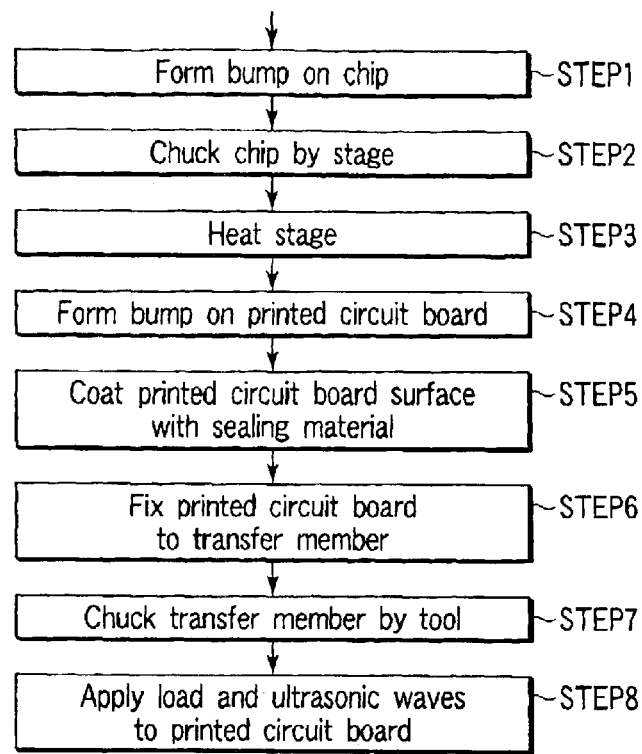
FIG. 50 is a flow chart showing a manufacturing process regarding the ultrasonic flip chip bonding technique for explaining a semiconductor device manufacturing method according to the 45th embodiment of the present invention.

FIG. 50 is a flow chart showing a manufacturing process regarding the ultrasonic flip chip bonding technique for explaining a semiconductor device manufacturing method according to the 45th embodiment of the present invention. Various elements are formed in a semiconductor substrate (wafer) by a known process. The wafer is then diced into chips along the dicing line or scribe line of the wafer by using a diamond scriber, diamond blade, laser scriber, or the like, thereby forming a semiconductor chip 12.

A stud bump 14 is formed on an electrode 13 of the chip 12 (STEP 1). The chip 12 is chucked and fixed onto a porous stage 11 (STEP 2), and the porous stage 11 is heated (STEP 3).

A stud bump is formed on a wiring electrode 17 of a printed circuit board 16 (STEP 4). The formation surface of the printed circuit board 16 for the wiring electrode 17 is coated with a sealing material 18 (STEP 5).

The printed circuit board 16 is fixed to a transfer member (STEP 6), and the transfer member is chucked by a tool 15 (STEP 7).

The tool 15 is moved above the porous stage 11 which holds the chip 12, and aligned (this state corresponds to FIG. 1). As shown in FIG. 2, the tool 15 is moved down with the printed circuit board 16 facing down. While a load is applied to the printed circuit board 16, ultrasonic waves are applied at, e.g., a frequency of 40 kHz and a power of 2,480 W, mounting the printed circuit board 16 on the chip 12 (STEP 8). At this time, the space between the chip 12 and the printed circuit board 16 is filled with the sealing material 18, performing simultaneous flip chip connection including the sealing step.

According to this manufacturing method, ultrasonic waves are applied to the printed circuit board 16 more flexible than the chip 12. A defect in the chip 12 such as a scratch or crack can be suppressed to reduce damage in flip chip connection. Further, a sufficient load and ultrasonic waves having a power and frequency (amplitude) suitable for ultrasonic bonding can be applied, suppressing bump misalignment and improving the connectivity.

Since the chip 12 is chucked by the porous stage 11, damage to the chip in the use of a chuck hole can be avoided. Simultaneous connection including not only electrical connection between the chip 12 and the printed circuit board 16 but also the sealing step by setting of a sealing resin (liquid resin or resin sheet) can be realized.

Since the entire lower surface of the chip 12 is chucked and fixed using the porous stage 11, the chip warpage can be straightened. In fixing using a chuck hole, the corner of the chip 12 cannot be fully straightened. However, the use of a porous material enables perfect warpage straightening.

Flip chip connection performed while heating the porous stage 11 can promote and improve bonding.

The printed circuit board 16 is fixed to the transfer member, and the transfer member is chucked and fixed to the tool 15. The step of picking up the printed circuit board 16 in order to chuck the printed circuit board 16 by the tool 15 can be omitted.

[46th Embodiment]

Figure 51:
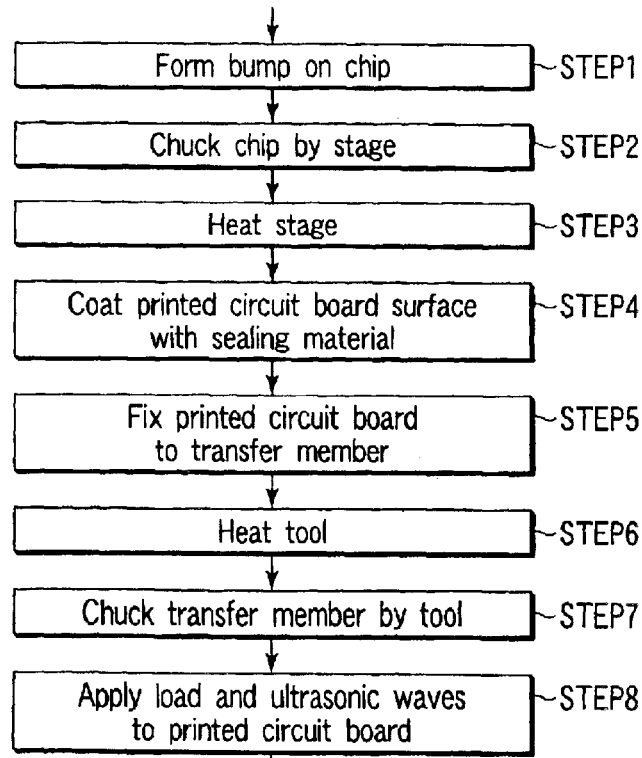
FIG. 51 is a flow chart showing a manufacturing process regarding the ultrasonic flip chip bonding technique for explaining a semiconductor device manufacturing method according to the 46th embodiment of the present invention.

FIG. 51 is a flow chart showing a manufacturing process regarding the ultrasonic flip chip bonding technique for explaining a semiconductor device manufacturing method according to the 46th embodiment of the present invention. Various elements are formed in a semiconductor substrate (wafer) by a known process. The wafer is then diced into chips along the dicing line or scribe line of the wafer by using a diamond scriber, diamond blade, laser scriber, or the like, thereby forming a semiconductor chip 12.

A stud bump 14 is formed on an electrode 13 of the chip 12 (STEP 1). The chip 12 is chucked and fixed onto a porous stage 11 (STEP 2), and the porous stage 11 is heated (STEP 3).

The formation surface of a printed circuit board 16 for a wiring electrode 17 is coated with a sealing material 18 (STEP 4). The printed circuit board 16 is fixed to a transfer member (STEP 5). A tool 15 is heated (STEP 6), and chucks the transfer member (STEP 7).

The tool 15 is moved above the porous stage 11 which holds the chip 12, and aligned (this state corresponds to FIG. 1). As shown in FIG. 2, the tool 15 is moved down with the printed circuit board 16 facing down. While a load is applied to the printed circuit board 16, ultrasonic waves are applied at, e.g., a frequency of 40 kHz and a power of 2,480 W, mounting the printed circuit board 16 on the chip 12 (STEP 8). At this time, the space between the chip 12 and the printed circuit board 16 is filled with the sealing material 18, performing simultaneous flip chip connection including the sealing step.

According to this manufacturing method, ultrasonic waves are applied to the printed circuit board 16 more flexible than the chip 12. A defect in the chip 12 such as a scratch or crack can be suppressed to reduce damage in flip chip connection. Further, a sufficient load and ultrasonic waves having a power and frequency (amplitude) suitable for ultrasonic bonding can be applied, suppressing bump misalignment and improving the connectivity.

Since the chip 12 is chucked by the porous stage 11, damage to the chip in the use of a chuck hole can be avoided. Simultaneous connection including not only electrical connection between the chip 12 and the printed circuit board 16 but also the sealing step by setting of a sealing resin (liquid resin or resin sheet) can be realized.

Since the entire lower surface of the chip 12 is chucked and fixed using the porous stage 11, the chip warpage can be straightened. In fixing using a chuck hole, the corner of the chip 12 cannot be fully straightened. However, the use of a porous material enables perfect warpage straightening.

Since both the porous stage 11 and tool 15 are heated, bonding can be further improved.

The printed circuit board 16 is fixed to the transfer member, and the transfer member is chucked and fixed to the tool 15. The step of picking up the printed circuit board 16 in order to chuck the printed circuit board 16 by the tool 15 can be omitted.

[47th Embodiment]

FIG. 52 is a flow chart showing a manufacturing process regarding the ultrasonic flip chip bonding technique for explaining a semiconductor device manufacturing method according to the 47th embodiment of the present invention. Various elements are formed in a semiconductor substrate (wafer) by a known process. The wafer is then diced into chips along the dicing line or scribe line of the wafer by using a diamond scriber, diamond blade, laser scriber, or the like, thereby forming a semiconductor chip 12.

The chip 12 is chucked and fixed onto a porous stage 11 (STEP 1), and the porous stage 11 is heated (STEP 2).

A stud bump is formed on a wiring electrode 17 of a printed circuit board 16 (STEP 3).

The formation surface of the printed circuit board 16 for the wiring electrode 17 is coated with a sealing material 18 (STEP 4). The printed circuit board 16 is fixed to a transfer member (STEP 5). A tool 15 is heated (STEP 6), and chucks the transfer member (STEP 7).

The tool 15 is moved above the porous stage 11 which holds the chip 12, and aligned (this state corresponds to FIG. 1). As shown in FIG. 2, the tool 15 is moved down with the printed circuit board 16 facing down. While a load is applied to the printed circuit board 16, ultrasonic waves are applied at, e.g., a frequency of 40 kHz and a power of 2,480 W, mounting the printed circuit board 16 on the chip 12 (STEP 8). At this time, the space between the chip 12 and the printed circuit board 16 is filled with the sealing material 18, performing simultaneous flip chip connection including the sealing step.

According to this manufacturing method, ultrasonic waves are applied to the printed circuit board 16 more flexible than the chip 12. A defect in the chip 12 such as a scratch or crack can be suppressed to reduce damage in flip chip connection. Further, a sufficient load and ultrasonic waves having a power and frequency (amplitude) suitable for ultrasonic bonding can be applied, suppressing bump misalignment and improving the connectivity.

Since the chip 12 is chucked by the porous stage 11, damage to the chip in the use of a chuck hole can be avoided. Simultaneous connection including not only electrical connection between the chip 12 and the printed circuit board 16 but also the sealing step by setting of a sealing resin (liquid resin or resin sheet) can be realized.

Since the entire lower surface of the chip 12 is chucked and fixed using the porous stage 11, the chip warpage can be straightened. In fixing using a chuck hole, the corner of the chip 12 cannot be fully straightened. However, the use of a porous material enables perfect warpage straightening.

Since both the porous stage 11 and tool 15 are heated, bonding can be further improved.

The printed circuit board 16 is fixed to the transfer member, and the transfer member is chucked and fixed to the tool 15. The step of picking up the printed circuit board 16 in order to chuck the printed circuit board 16 by the tool 15 can be omitted.

[48th Embodiment]

FIG. 53 is a flow chart showing a manufacturing process regarding the ultrasonic flip chip bonding technique for explaining a semiconductor device manufacturing method according to the 48th embodiment of the present invention. Various elements are formed in a semiconductor substrate (wafer) by a known process. The wafer is then diced into chips along the dicing line or scribe line of the wafer by using a diamond scriber, diamond blade, laser scriber, or the like, thereby forming a semiconductor chip 12.

A stud bump 14 is formed on an electrode 13 of the chip 12 (STEP 1). The chip 12 is chucked and fixed onto a porous stage 11 (STEP 2), and the porous stage 11 is heated (STEP 3).

A stud bump is formed on a wiring electrode 17 of a printed circuit board 16 (STEP 4).

The formation surface of the printed circuit board 16 for the wiring electrode 17 is coated with a sealing material 18 (STEP 5). The printed circuit board 16 is fixed to a transfer member (STEP 6).

A tool 15 is heated (STEP 7), and chucks the transfer member (STEP 8).

The tool 15 is moved above the porous stage 11 which holds the chip 12, and aligned (this state corresponds to FIG. 1). As shown in FIG. 2, the tool 15 is moved down with the printed circuit board 16 facing down. While a load is applied to the printed circuit board 16, ultrasonic waves are applied at, e.g., a frequency of 40 kHz and a power of 2,480 W, mounting the printed circuit board 16 on the chip 12 (STEP 9). At this time, the space between the chip 12 and the printed circuit board 16 is filled with the sealing material 18, performing simultaneous flip chip connection including the sealing step.

According to this manufacturing method, ultrasonic waves are applied to the printed circuit board 16 more flexible than the chip 12. A defect in the chip 12 such as a scratch or crack can be suppressed to reduce damage in flip chip connection. Further, a sufficient load and ultrasonic waves having a power and frequency (amplitude) suitable for ultrasonic bonding can be applied, suppressing bump misalignment and improving the connectivity.

Since the chip 12 is chucked by the porous stage 11, damage to the chip in the use of a chuck hole can be avoided. Simultaneous connection including not only electrical connection between the chip 12 and the printed circuit board 16 but also the sealing step by setting of a sealing resin (liquid resin or resin sheet) can be realized.

Since the entire lower surface of the chip 12 is chucked and fixed using the porous stage 11, the chip warpage can be straightened. In fixing using a chuck hole, the corner of the chip 12 cannot be fully straightened. However, the use of a porous material enables perfect warpage straightening.

Since both the porous stage 11 and tool 15 are heated, bonding can be further improved.

The printed circuit board 16 is fixed to the transfer member, and the transfer member is chucked and fixed to the tool 15. The step of picking up the printed circuit board 16 in order to chuck the printed circuit board 16 by the tool 15 can be omitted.

[49th Embodiment]

Figures 54, 55:
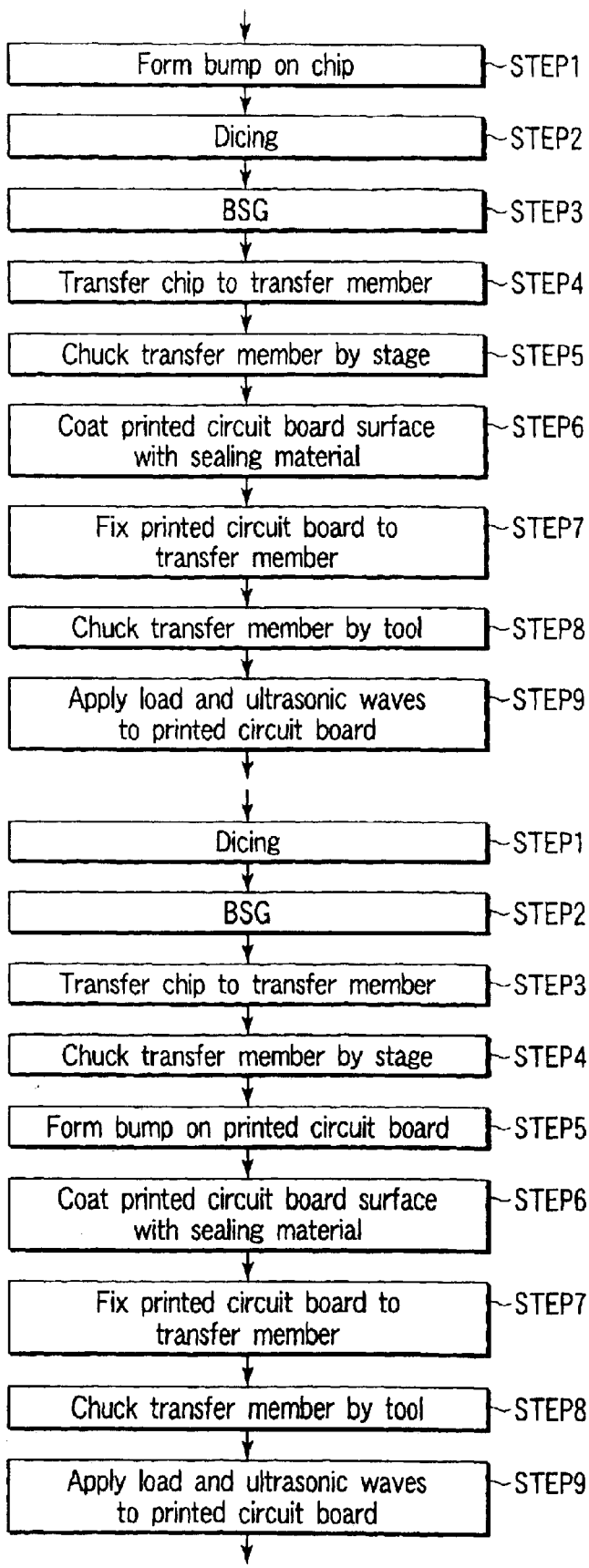
FIG. 54 is a flow chart showing a manufacturing process regarding the ultrasonic flip chip bonding technique for explaining a semiconductor device manufacturing method according to the 49th embodiment of the present invention.
FIG. 55 is a flow chart showing a manufacturing process regarding the ultrasonic flip chip bonding technique for explaining a semiconductor device manufacturing method according to the 50th embodiment of the present invention.

FIG. 54 is a flow chart showing a manufacturing process regarding the ultrasonic flip chip bonding technique for explaining a semiconductor device manufacturing method according to the 49th embodiment of the present invention. Various elements are formed in a semiconductor substrate (wafer) by a known process. A stud bump 14 is formed on an electrode 13 of each semiconductor chip 12 of the wafer (STEP 1).

So-called half-cut dicing is performed to form a groove shallow enough not to reach the lower surface of the wafer from its element formation surface along a dicing line or scribe line by using a diamond scriber, diamond blade, laser scriber, or the like (STEP 2).

The lower surface of the wafer is ground with a grindstone (BSG: Back Side Grinding), simultaneously thinning the wafer and dividing it into chips (STEP 3). Even after the wafer is divided into chips, the lower surface is kept ground by at least 5 $\mu$m or more. This can remove a layer which is formed at the bottom of the groove and damaged by chipping or the like.

The divided chip 12 is fixed and transferred to a transfer member (STEP 4). The transfer member is chucked and fixed onto a porous stage 11 (STEP 5).

The formation surface of a printed circuit board 16 for a wiring electrode 17 is coated with a sealing material 18 (STEP 6). The printed circuit board 16 is fixed to a transfer member (STEP 7), and the transfer member is chucked by a tool 15 (STEP 8).

The tool 15 is moved above the porous stage 11 which holds the chip 12, and aligned (this state corresponds to FIG.

1). As shown in FIG. 2, the tool 15 is moved down with the printed circuit board 16 facing down. While a load is applied to the printed circuit board 16, ultrasonic waves are applied at, e.g., a frequency of 40 kHz and a power of 2,480 W, mounting the printed circuit board 16 on the chip 12 (STEP 9). At this time, the space between the chip 12 and the printed circuit board 16 is filled with the sealing material 18, performing simultaneous flip chip connection including the sealing step.

According to this manufacturing method, ultrasonic waves are applied to the printed circuit board 16 more flexible than the chip 12. A defect in the chip 12 such as a scratch or crack can be suppressed to reduce damage in flip chip connection. Further, a sufficient load and ultrasonic waves having a power and frequency (amplitude) suitable for ultrasonic bonding can be applied, suppressing bump misalignment and improving the connectivity.

Since the chip 12 is chucked by the porous stage 11, damage to the chip in the use of a chuck hole can be avoided. Simultaneous connection including not only electrical connection between the chip 12 and the printed circuit board 16 but also the sealing step by setting of a sealing resin (liquid resin or resin sheet) can be realized.

Since the entire lower surface of the chip 12 is chucked and fixed using the porous stage 11, the chip warpage which readily occurs in thinning by grinding a lower wafer surface (BSG: Back Side Grinding) can be straightened. In fixing using a chuck hole, the corner of the chip 12 cannot be fully straightened. However, the use of a porous material enables perfect warpage straightening.

The printed circuit board 16 is fixed to the transfer member, and the transfer member is chucked and fixed to the tool 15. The step of picking up the printed circuit board 16 in order to chuck the printed circuit board 16 by the tool 15 can be omitted.

[50th Embodiment]

FIG. 55 is a flow chart showing a manufacturing process regarding the ultrasonic flip chip bonding technique for explaining a semiconductor device manufacturing method according to the 50th embodiment of the present invention. Various elements are formed in a semiconductor substrate (wafer) by a known process. So-called half-cut dicing is performed to form a groove shallow enough not to reach the lower surface of the wafer from its element formation surface along a dicing line or scribe line by using a diamond scriber, diamond blade, laser scriber, or the like (STEP 1).

The lower surface of the wafer is ground with a grindstone (BSG: Back Side Grinding), simultaneously thinning the wafer and dividing it into chips (STEP 2). Even after the wafer is divided into chips, the lower surface is kept ground by at least 5 μm or more. This can remove a layer which is formed at the bottom of the groove and damaged by chipping or the like.

A divided chip 12 is fixed and transferred to a transfer member (STEP 3). The transfer member is chucked and fixed onto a porous stage 11 (STEP 4).

A stud bump is formed on a wiring electrode 17 of a printed circuit board 16 (STEP 5). The formation surface of the printed circuit board 16 for the wiring electrode 17 is coated with a sealing material 18 (STEP 6).

The printed circuit board 16 coated with the sealing material 18 is fixed to a transfer member (STEP 7), and the transfer member is chucked by a tool 15 (STEP 8).

The tool 15 is moved above the porous stage 11 which holds the chip 12, and aligned (this state corresponds to FIG. 1). As shown in FIG. 2, the tool 15 is moved down with the printed circuit board 16 facing down. While a load is applied to the printed circuit board 16, ultrasonic waves are applied at, e.g., a frequency of 40 kHz and a power of 2,480 W, mounting the printed circuit board 16 on the chip 12 (STEP 9). At this time, the space between the chip 12 and the printed circuit board 16 is filled with the sealing material 18, performing simultaneous flip chip connection including the sealing step.

According to this manufacturing method, ultrasonic waves are applied to the printed circuit board 16 more flexible than the chip 12. A defect in the chip 12 such as a scratch or crack can be suppressed to reduce damage in flip chip connection. Further, a sufficient load and ultrasonic waves having a power and frequency (amplitude) suitable for ultrasonic bonding can be applied, suppressing bump misalignment and improving the connectivity.

Since the chip 12 is chucked by the porous stage 11, damage to the chip in the use of a chuck hole can be avoided. Simultaneous connection including not only electrical connection between the chip 12 and the printed circuit board 16 but also the sealing step by setting of a sealing resin (liquid resin or resin sheet) can be realized.

Since the entire lower surface of the chip 12 is chucked and fixed using the porous stage 11, the chip warpage which readily occurs in thinning by grinding a lower wafer surface (BSG: Back Side Grinding) can be straightened. In fixing using a chuck hole, the corner of the chip 12 cannot be fully straightened. However, the use of a porous material enables perfect warpage straightening.

The printed circuit board 16 is fixed to the transfer member, and the transfer member is chucked and fixed to the tool 15. The step of picking up the printed circuit board 16 in order to chuck the printed circuit board 16 by the tool 15 can be omitted.

[51st Embodiment]

Figure 56:
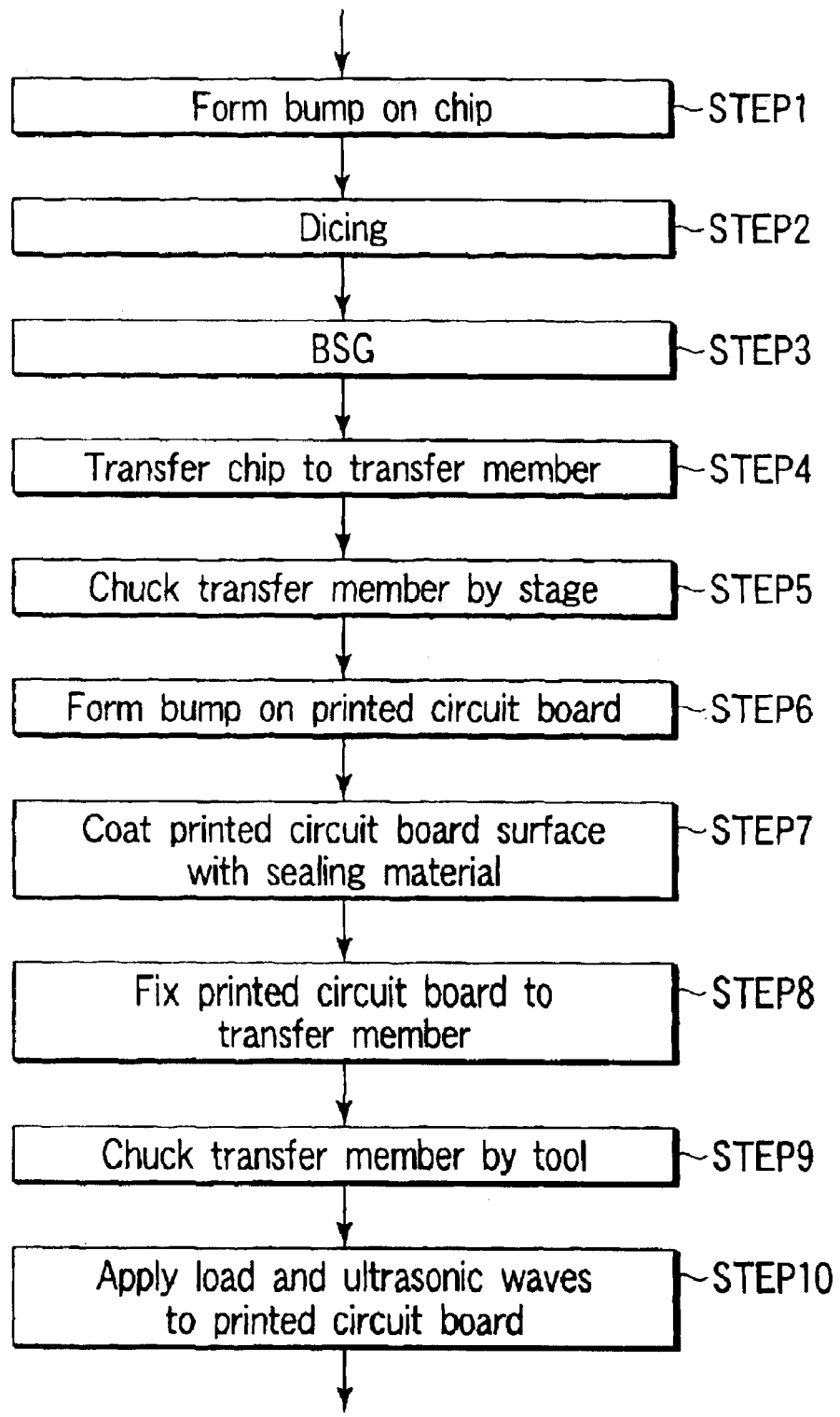
FIG. 56 is a flow chart showing a manufacturing process regarding the ultrasonic flip chip bonding technique for explaining a semiconductor device manufacturing method according to the 51st embodiment of the present invention.

FIG. 56 is a flow chart showing a manufacturing process regarding the ultrasonic flip chip bonding technique for explaining a semiconductor device manufacturing method according to the 51st embodiment of the present invention. Various elements are formed in a semiconductor substrate (wafer) by a known process. A stud bump 14 is formed on an electrode 13 of each semiconductor chip 12 of the wafer (STEP 1).

So-called half-cut dicing is performed to form a groove shallow enough not to reach the lower surface of the wafer from its element formation surface along a dicing line or scribe line by using a diamond scriber, diamond blade, laser scriber, or the like (STEP 2).

The lower surface of the wafer is ground with a grindstone (BSG: Back Side Grinding), simultaneously thinning the wafer and dividing it into chips (STEP 3). Even after the wafer is divided into chips, the lower surface is kept ground by at least 5 μm or more. This can remove a layer which is formed at the bottom of the groove and damaged by chipping or the like.

The divided chip 12 is fixed and transferred to a transfer member (STEP 4). The transfer member is chucked and fixed onto a porous stage 11 (STEP 5).

A stud bump is formed on a wiring electrode 17 of a printed circuit board 16 (STEP 6). The formation surface of the printed circuit board 16 for the wiring electrode 17 is coated with a sealing material 18 (STEP 7).

The printed circuit board 16 coated with the sealing material 18 is fixed to a transfer member (STEP 8), and the transfer member is chucked by a tool 15 (STEP 9).

The tool 15 is moved above the porous stage 11 which holds the chip 12, and aligned (this state corresponds to FIG. 1). As shown in FIG. 2, the tool 15 is moved down with the printed circuit board 16 facing down. While a load is applied to the printed circuit board 16, ultrasonic waves are applied at, e.g., a frequency of 40 kHz and a power of 2,480 W, mounting the printed circuit board 16 on the chip 12 (STEP 10). At this time, the space between the chip 12 and the printed circuit board 16 is filled with the sealing material 18, performing simultaneous flip chip connection including the sealing step.

According to this manufacturing method, ultrasonic waves are applied to the printed circuit board 16 more flexible than the chip 12. A defect in the chip 12 such as a scratch or crack can be suppressed to reduce damage in flip chip connection. Further, a sufficient load and ultrasonic waves having a power and frequency (amplitude) suitable for ultrasonic bonding can be applied, suppressing bump misalignment and improving the connectivity.

Since the chip 12 is chucked by the porous stage 11, damage to the chip in the use of a chuck hole can be avoided. Simultaneous connection including not only electrical connection between the chip 12 and the printed circuit board 16 but also the sealing step by setting of a sealing resin (liquid resin or resin sheet) can be realized.

Since the entire lower surface of the chip 12 is chucked and fixed using the porous stage 11, the chip warpage which readily occurs in thinning by grinding a lower wafer surface (BSG: Back Side Grinding) can be straightened. In fixing using a chuck hole, the corner of the chip 12 cannot be fully straightened. However, the use of a porous material enables perfect warpage straightening.

The printed circuit board 16 is fixed to the transfer member, and the transfer member is chucked and fixed to the tool 15. The step of picking up the printed circuit board 16 in order to chuck the printed circuit board 16 by the tool 15 can be omitted.

[52nd Embodiment]

Figure 57:
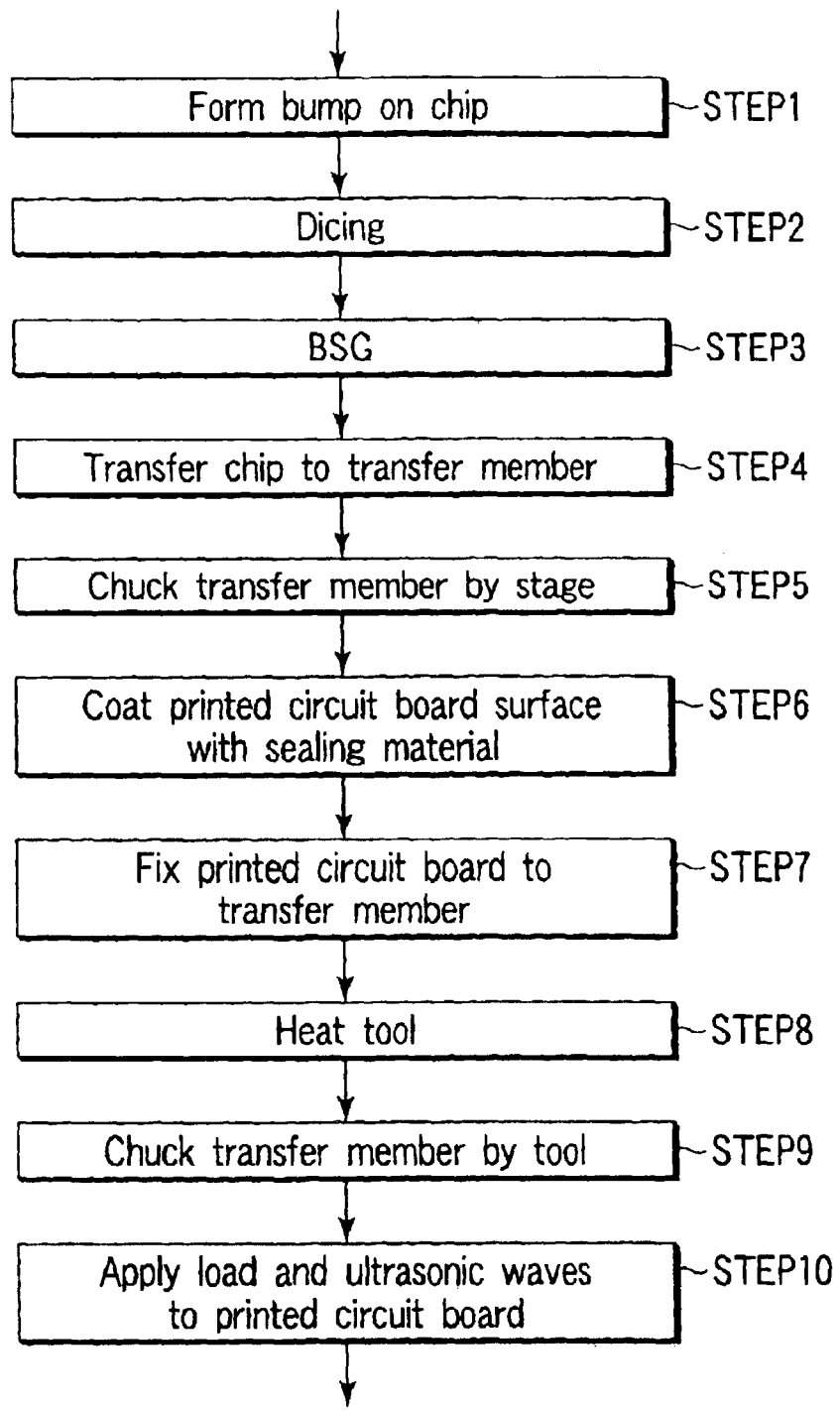
FIG. 57 is a flow chart showing a manufacturing process regarding the ultrasonic flip chip bonding technique for explaining a semiconductor device manufacturing method according to the 52nd embodiment of the present invention.

FIG. 57 is a flow chart showing a manufacturing process regarding the ultrasonic flip chip bonding technique for explaining a semiconductor device manufacturing method according to the 52nd embodiment of the present invention. Various elements are formed in a semiconductor substrate (wafer) by a known process. A stud bump 14 is formed on an electrode 13 of each semiconductor chip 12 of the wafer (STEP 1).

So-called half-cut dicing is performed to form a groove shallow enough not to reach the lower surface of the wafer from its element formation surface along a dicing line or scribe line by using a diamond scriber, diamond blade, laser scriber, or the like (STEP 2).

The lower surface of the wafer is ground with a grindstone (BSG: Back Side Grinding), simultaneously thinning the wafer and dividing it into chips (STEP 3). Even after the wafer is divided into chips, the lower surface is kept ground by at least 5 μm or more. This can remove a layer which is formed at the bottom of the groove and damaged by chipping or the like.

The divided chip 12 is fixed and transferred to a transfer member (STEP 4). The transfer member is chucked and fixed onto a porous stage 11 (STEP 5).

The formation surface of a printed circuit board 16 for a wiring electrode 17 is coated with a sealing material 18 (STEP 6).

The printed circuit board 16 coated with the sealing material 18 is fixed to a transfer member (STEP 7). A tool 15 is heated (STEP 8), and chucks the transfer member (STEP 9).

The tool 15 is moved above the porous stage 11 which holds the chip 12, and aligned (this state corresponds to FIG. 1). As shown in FIG. 2, the tool 15 is moved down with the printed circuit board 16 facing down. While a load is applied to the printed circuit board 16, ultrasonic waves are applied at, e.g., a frequency of 40 kHz and a power of 2,480 W, mounting the printed circuit board 16 on the chip 12 (STEP 10). At this time, the space between the chip 12 and the printed circuit board 16 is filled with the sealing material 18, performing simultaneous flip chip connection including the sealing step.

According to this manufacturing method, ultrasonic waves are applied to the printed circuit board 16 more flexible than the chip 12. A defect in the chip 12 such as a scratch or crack can be suppressed to reduce damage in flip chip connection. Further, a sufficient load and ultrasonic waves having a power and frequency (amplitude) suitable for ultrasonic bonding can be applied, suppressing bump misalignment and improving the connectivity.

Since the chip 12 is chucked by the porous stage 11, damage to the chip in the use of a chuck hole can be avoided. Simultaneous connection including not only electrical connection between the chip 12 and the printed circuit board 16 but also the sealing step by setting of a sealing resin (liquid resin or resin sheet) can be realized.

Since the entire lower surface of the chip 12 is chucked and fixed using the porous stage 11, the chip warpage which readily occurs in thinning by grinding a lower wafer surface (BSG: Back Side Grinding) can be straightened. In fixing using a chuck hole, the corner of the chip 12 cannot be fully straightened. However, the use of a porous material enables perfect warpage straightening.

Flip chip connection performed while heating the tool 15 can further promote and improve bonding.

The printed circuit board 16 is fixed to the transfer member, and the transfer member is chucked and fixed to the tool 15. The step of picking up the printed circuit board 16 in order to chuck the printed circuit board 16 by the tool 15 can be omitted.

[53rd Embodiment]

Figure 58:
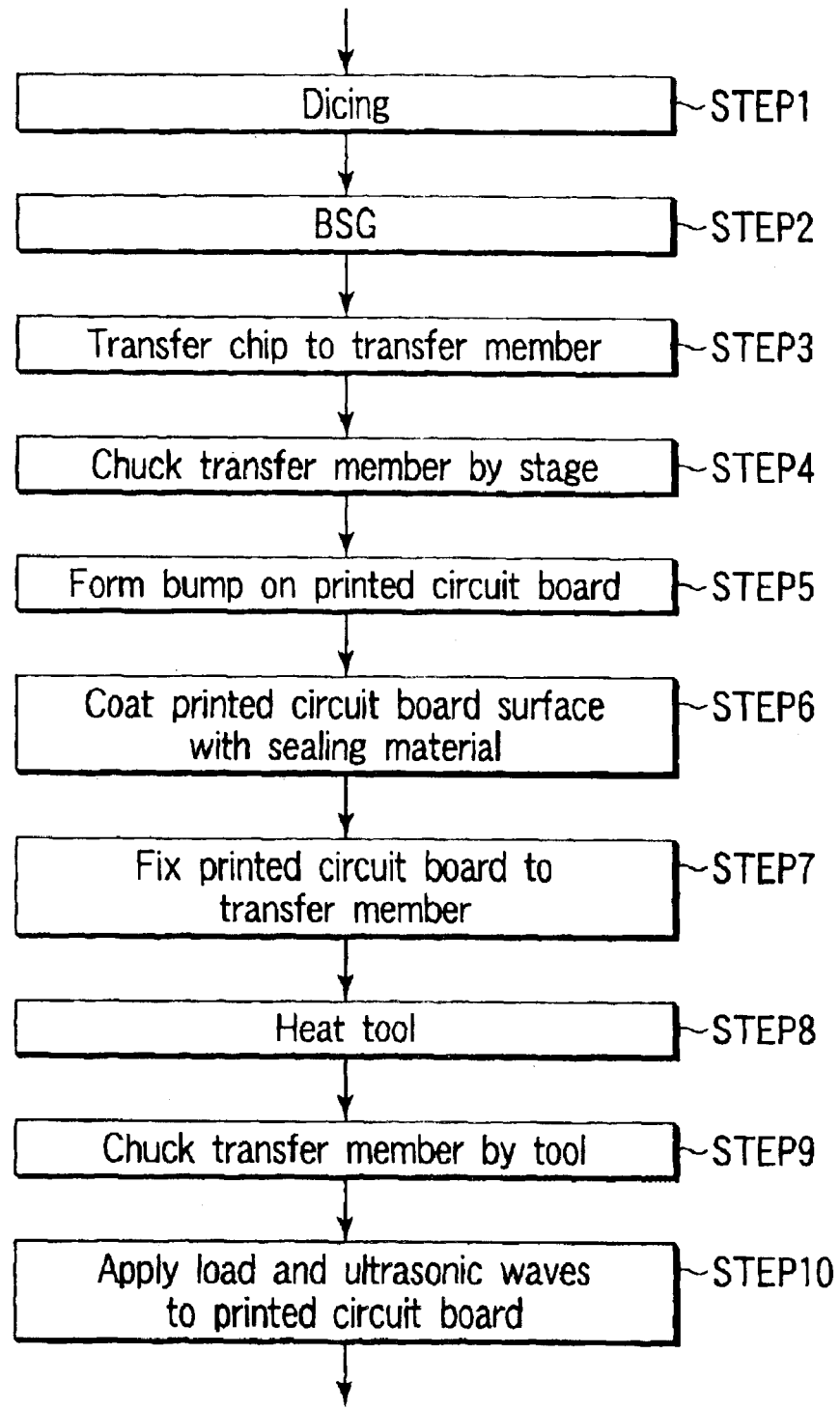
FIG. 58 is a flow chart showing a manufacturing process regarding the ultrasonic flip chip bonding technique for explaining a semiconductor device manufacturing method according to the 53rd embodiment of the present invention.

FIG. 58 is a flow chart showing a manufacturing process regarding the ultrasonic flip chip bonding technique for explaining a semiconductor device manufacturing method according to the 53rd embodiment of the present invention. Various elements are formed in a semiconductor substrate (wafer) by a known process. So-called half-cut dicing is performed to form a groove shallow enough not to reach the lower surface of the wafer from its element formation surface along a dicing line or scribe line by using a diamond scriber, diamond blade, laser scriber, or the like (STEP 1).

The lower surface of the wafer is ground with a grindstone (BSG: Back Side Grinding), simultaneously thinning the wafer and dividing it into chips (STEP 2). Even after the wafer is divided into chips, the lower surface is kept ground by at least 5 μm or more. This can remove a layer which is formed at the bottom of the groove and damaged by chipping or the like.

A divided chip 12 is fixed and transferred to a transfer member (STEP 3). The transfer member is chucked and fixed onto a porous stage 11 (STEP 4).

A stud bump is formed on a wiring electrode 17 of a printed circuit board 16 (STEP 5). The formation surface of the printed circuit board 16 for the wiring electrode 17 is coated with a sealing material 18 (STEP 6).

The printed circuit board 16 coated with the sealing material 18 is fixed to a transfer member (STEP 7). A tool 15 is heated (STEP 8), and chucks the transfer member (STEP 9).

The tool 15 is moved above the porous stage 11 which holds the chip 12, and aligned (this state corresponds to FIG. 1). As shown in FIG. 2, the tool 15 is moved down with the printed circuit board 16 facing down. While a load is applied to the printed circuit board 16, ultrasonic waves are applied at, e.g., a frequency of 40 kHz and a power of 2,480 W, mounting the printed circuit board 16 on the chip 12 (STEP 10). At this time, the space between the chip 12 and the printed circuit board 16 is filled with the sealing material 18, performing simultaneous flip chip connection including the sealing step.

According to this manufacturing method, ultrasonic waves are applied to the printed circuit board 16 more flexible than the chip 12. A defect in the chip 12 such as a scratch or crack can be suppressed to reduce damage in flip chip connection. Further, a sufficient load and ultrasonic waves having a power and frequency (amplitude) suitable for ultrasonic bonding can be applied, suppressing bump misalignment and improving the connectivity.

Since the chip 12 is chucked by the porous stage 11, damage to the chip in the use of a chuck hole can be avoided. Simultaneous connection including not only electrical connection between the chip 12 and the printed circuit board 16 but also the sealing step by setting of a sealing resin (liquid resin or resin sheet) can be realized.

Since the entire lower surface of the chip 12 is chucked and fixed using the porous stage 11, the chip warpage which readily occurs in thinning by grinding a lower wafer surface (BSG: Back Side Grinding) can be straightened. In fixing using a chuck hole, the corner of the chip 12 cannot be fully straightened. However, the use of a porous material enables perfect warpage straightening.

Flip chip connection performed while heating the tool 15 can further promote and improve bonding.

The printed circuit board 16 is fixed to the transfer member, and the transfer member is chucked and fixed to the tool 15. The step of picking up the printed circuit board 16 in order to chuck the printed circuit board 16 by the tool 15 can be omitted.

[54th Embodiment]

Figure 59:
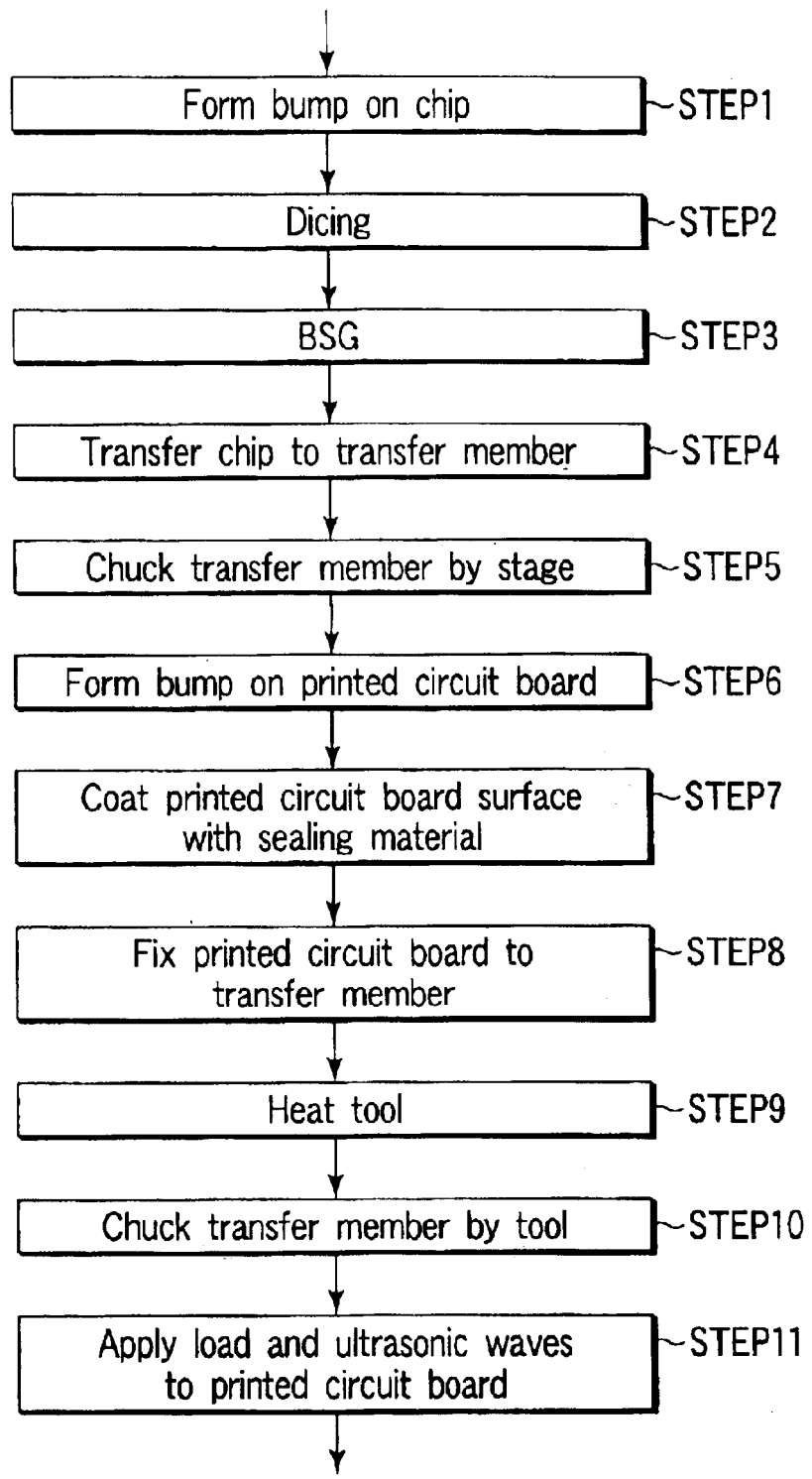
FIG. 59 is a flow chart showing a manufacturing process regarding the ultrasonic flip chip bonding technique for explaining a semiconductor device manufacturing method according to the 54th embodiment of the present invention.

FIG. 59 is a flow chart showing a manufacturing process regarding the ultrasonic flip chip bonding technique for explaining a semiconductor device manufacturing method according to the 54th embodiment of the present invention. Various elements are formed in a semiconductor substrate (wafer) by a known process. A stud bump 14 is formed on an electrode 13 of each semiconductor chip 12 of the wafer (STEP 1).

So-called half-cut dicing is performed to form a groove shallow enough not to reach the lower surface of the wafer from its element formation surface along a dicing line or scribe line by using a diamond scriber, diamond blade, laser scriber, or the like (STEP 2).

The lower surface of the wafer is ground with a grindstone (BSG: Back Side Grinding), simultaneously thinning the wafer and dividing it into chips (STEP 3). Even after the wafer is divided into chips, the lower surface is kept ground by at least 5 μm or more. This can remove a layer which is formed at the bottom of the groove and damaged by chipping or the like.

The divided chip 12 is fixed and transferred to a transfer member (STEP 4). The transfer member is chucked and fixed onto a porous stage 11 (STEP 5).

A stud bump is formed on a wiring electrode 17 of a printed circuit board 16 (STEP 6). The formation surface of the printed circuit board 16 for the wiring electrode 17 is coated with a sealing material 18 (STEP 7).

The printed circuit board 16 coated with the sealing material 18 is fixed to a transfer member (STEP 8). A tool 15 is heated (STEP 9), and chucks the transfer member (STEP 10).

The tool 15 is moved above the porous stage 11 which holds the chip 12, and aligned (this state corresponds to FIG. 1). As shown in FIG. 2, the tool 15 is moved down with the printed circuit board 16 facing down. While a load is applied to the printed circuit board 16, ultrasonic waves are applied at, e.g., a frequency of 40 kHz and a power of 2,480 W, mounting the printed circuit board 16 on the chip 12 (STEP 11). At this time, the space between the chip 12 and the printed circuit board 16 is filled with the sealing material 18, performing simultaneous flip chip connection including the sealing step.

According to this manufacturing method, ultrasonic waves are applied to the printed circuit board 16 more flexible than the chip 12. A defect in the chip 12 such as a scratch or crack can be suppressed to reduce damage in flip chip connection. Further, a sufficient load and ultrasonic waves having a power and frequency (amplitude) suitable for ultrasonic bonding can be applied, suppressing bump misalignment and improving the connectivity.

Since the chip 12 is chucked by the porous stage 11, damage to the chip in the use of a chuck hole can be avoided. Simultaneous connection including not only electrical connection between the chip 12 and the printed circuit board 16 but also the sealing step by setting of a sealing resin (liquid resin or resin sheet) can be realized.

Since the entire lower surface of the chip 12 is chucked and fixed using the porous stage 11, the chip warpage which readily occurs in thinning by grinding a lower wafer surface (BSG: Back Side Grinding) can be straightened. In fixing using a chuck hole, the corner of the chip 12 cannot be fully straightened. However, the use of a porous material enables perfect warpage straightening.

Flip chip connection performed while heating the tool 15 can further promote and improve bonding.

The printed circuit board 16 is fixed to the transfer member, and the transfer member is chucked and fixed to the tool 15. The step of picking up the printed circuit board 16 in order to chuck the printed circuit board 16 by the tool 15 can be omitted.

[55th Embodiment]

Figure 60:
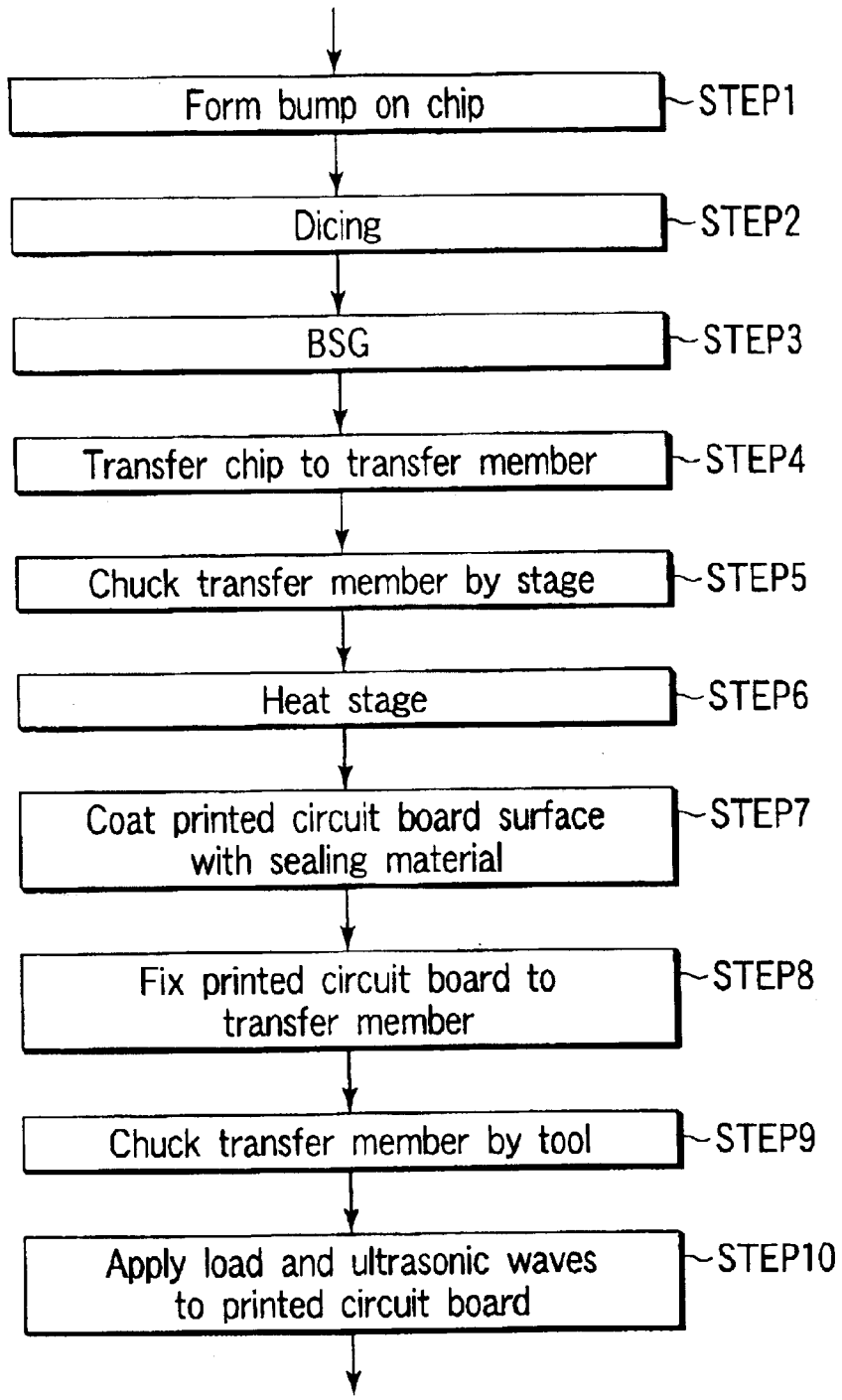
FIG. 60 is a flow chart showing a manufacturing process regarding the ultrasonic flip chip bonding technique for explaining a semiconductor device manufacturing method according to the 55th embodiment of the present invention.

FIG. 60 is a flow chart showing a manufacturing process regarding the ultrasonic flip chip bonding technique for explaining a semiconductor device manufacturing method according to the 55th embodiment of the present invention. Various elements are formed in a semiconductor substrate (wafer) by a known process. A stud bump 14 is formed on an electrode 13 of each semiconductor chip 12 of the wafer (STEP 1).

So-called half-cut dicing is performed to form a groove shallow enough not to reach the lower surface of the wafer from its element formation surface along a dicing line or scribe line by using a diamond scriber, diamond blade, laser scriber, or the like (STEP 2).

The lower surface of the wafer is ground with a grindstone (BSG: Back Side Grinding), simultaneously thinning the wafer and dividing it into chips (STEP 3). Even after the wafer is divided into chips, the lower surface is kept ground by at least 5 μm or more. This can remove a layer which is formed at the bottom of the groove and damaged by chipping or the like.

The divided chip 12 is fixed and transferred to a transfer member (STEP 4). The transfer member is chucked and fixed onto a porous stage 11 (STEP 5). In this state, the porous stage 11 is heated (STEP 6).

The formation surface of a printed circuit board 16 for a wiring electrode 17 is coated with a sealing material 18 (STEP 7).

The printed circuit board 16 coated with the sealing material 18 is fixed to a transfer member (STEP 8). The transfer member is then chucked by a tool 15 (STEP 9).

The tool 15 is moved above the porous stage 11 which holds the chip 12, and aligned (this state corresponds to FIG. 1). As shown in FIG. 2, the tool 15 is moved down with the printed circuit board 16 facing down. While a load is applied to the printed circuit board 16, ultrasonic waves are applied at, e.g., a frequency of 40 kHz and a power of 2,480 W, mounting the printed circuit board 16 on the chip 12 (STEP 10). At this time, the space between the chip 12 and the printed circuit board 16 is filled with the sealing material 18, performing simultaneous flip chip connection including the sealing step.

According to this manufacturing method, ultrasonic waves are applied to the printed circuit board 16 more flexible than the chip 12. A defect in the chip 12 such as a scratch or crack can be suppressed to reduce damage in flip chip connection. Further, a sufficient load and ultrasonic waves having a power and frequency (amplitude) suitable for ultrasonic bonding can be applied, suppressing bump misalignment and improving the connectivity.

Since the chip 12 is chucked by the porous stage 11, damage to the chip in the use of a chuck hole can be avoided. Simultaneous connection including not only electrical connection between the chip 12 and the printed circuit board 16 but also the sealing step by setting of a sealing resin (liquid resin or resin sheet) can be realized.

Since the entire lower surface of the chip 12 is chucked and fixed using the porous stage 11, the chip warpage which readily occurs in thinning by grinding a lower wafer surface (BSG: Back Side Grinding) can be straightened. In fixing using a chuck hole, the corner of the chip 12 cannot be fully straightened. However, the use of a porous material enables perfect warpage straightening.

Flip chip connection performed while heating the porous stage 11 can promote and improve bonding.

The printed circuit board 16 is fixed to the transfer member, and the transfer member is chucked and fixed to the tool 15. The step of picking up the printed circuit board 16 in order to chuck the printed circuit board 16 by the tool 15 can be omitted.

[56th Embodiment]

Figure 61:
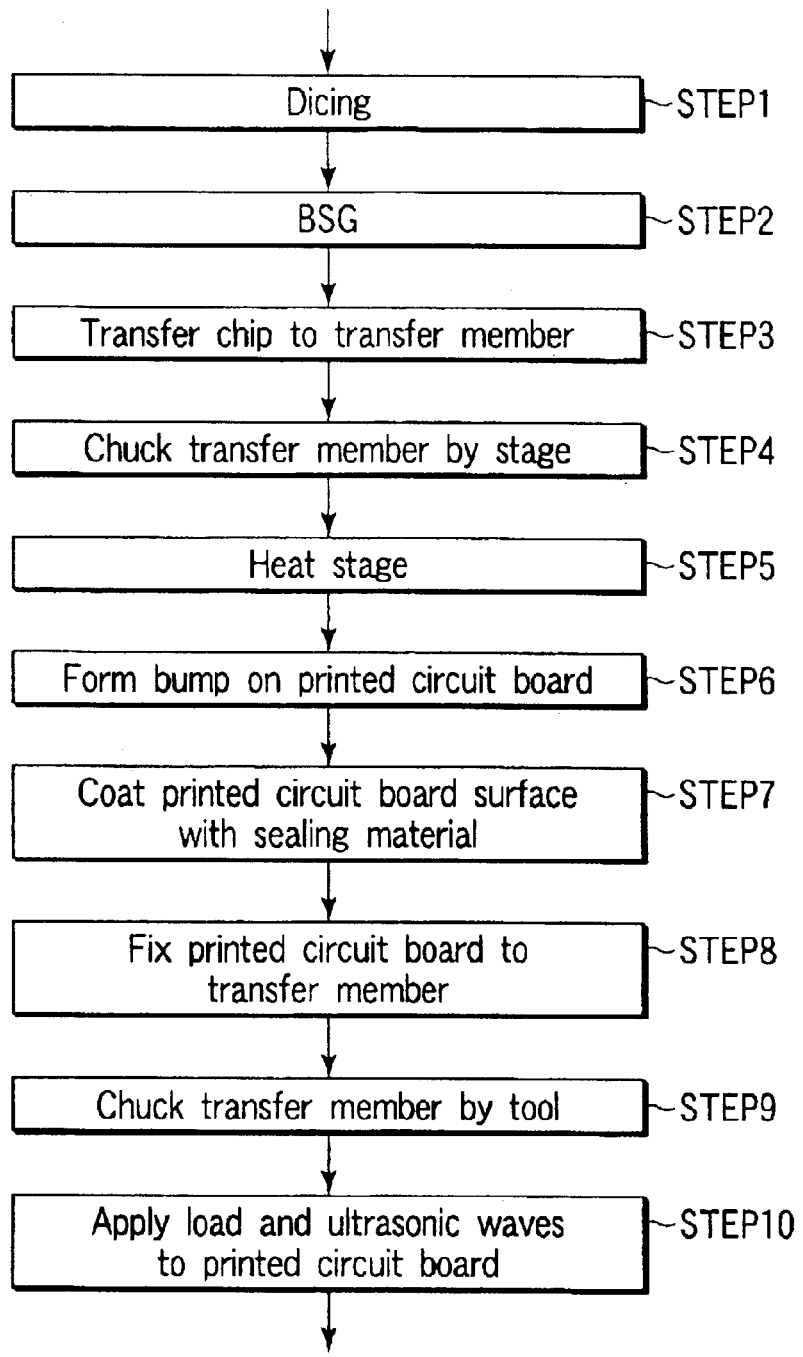
FIG. 61 is a flow chart showing a manufacturing process regarding the ultrasonic flip chip bonding technique for explaining a semiconductor device manufacturing method according to the 56th embodiment of the present invention.

FIG. 61 is a flow chart showing a manufacturing process regarding the ultrasonic flip chip bonding technique for explaining a semiconductor device manufacturing method according to the 56th embodiment of the present invention. Various elements are formed in a semiconductor substrate (wafer) by a known process. So-called half-cut dicing is performed to form a groove shallow enough not to reach the lower surface of the wafer from its element formation surface along a dicing line or scribe line by using a diamond scriber, diamond blade, laser scriber, or the like (STEP 1).

The lower surface of the wafer is ground with a grindstone (BSG: Back Side Grinding), simultaneously thinning the wafer and dividing it into chips (STEP 2). Even after the wafer is divided into chips, the lower surface is kept ground by at least 5 μm or more. This can remove a layer which is formed at the bottom of the groove and damaged by chipping or the like.

A chip 12 is fixed and transferred to a transfer member (STEP 3). The transfer member is chucked and fixed onto a porous stage 11 (STEP 4). In this state, the porous stage 11 is heated (STEP 5).

A stud bump is formed on a wiring electrode 17 of a printed circuit board 16 (STEP 6). The formation surface of the printed circuit board 16 for the wiring electrode 17 is coated with a sealing material 18 (STEP 7).

The printed circuit board 16 is fixed to a transfer member (STEP 8), and the transfer member is chucked by a tool 15 (STEP 9).

The tool 15 is moved above the porous stage 11 which holds the chip 12, and aligned (this state corresponds to FIG. 1). As shown in FIG. 2, the tool 15 is moved down with the printed circuit board 16 facing down. While a load is applied to the printed circuit board 16, ultrasonic waves are applied at, e.g., a frequency of 40 kHz and a power of 2,480 W, mounting the printed circuit board 16 on the chip 12 (STEP 10). At this time, the space between the chip 12 and the printed circuit board 16 is filled with the sealing material 18, performing simultaneous flip chip connection including the sealing step.

According to this manufacturing method, ultrasonic waves are applied to the printed circuit board 16 more flexible than the chip 12. A defect in the chip 12 such as a scratch or crack can be suppressed to reduce damage in flip chip connection. Further, a sufficient load and ultrasonic waves having a power and frequency (amplitude) suitable for ultrasonic bonding can be applied, suppressing bump misalignment and improving the connectivity.

Since the chip 12 is chucked by the porous stage 11, damage to the chip in the use of a chuck hole can be avoided. Simultaneous connection including not only electrical connection between the chip 12 and the printed circuit board 16 but also the sealing step by setting of a sealing resin (liquid resin or resin sheet) can be realized.

Since the entire lower surface of the chip 12 is chucked and fixed using the porous stage 11, the chip warpage which readily occurs in thinning by grinding a lower wafer surface (BSG: Back Side Grinding) can be straightened. In fixing using a chuck hole, the corner of the chip 12 cannot be fully straightened. However, the use of a porous material enables perfect warpage straightening.

Flip chip connection performed while heating the porous stage 11 can promote and improve bonding. The printed circuit board 16 is fixed to the transfer member, and the transfer member is chucked and fixed to the tool 15. The step of picking up the printed circuit board 16 in order to chuck the printed circuit board 16 by the tool 15 can be omitted.

[57th Embodiment]

Figure 62:
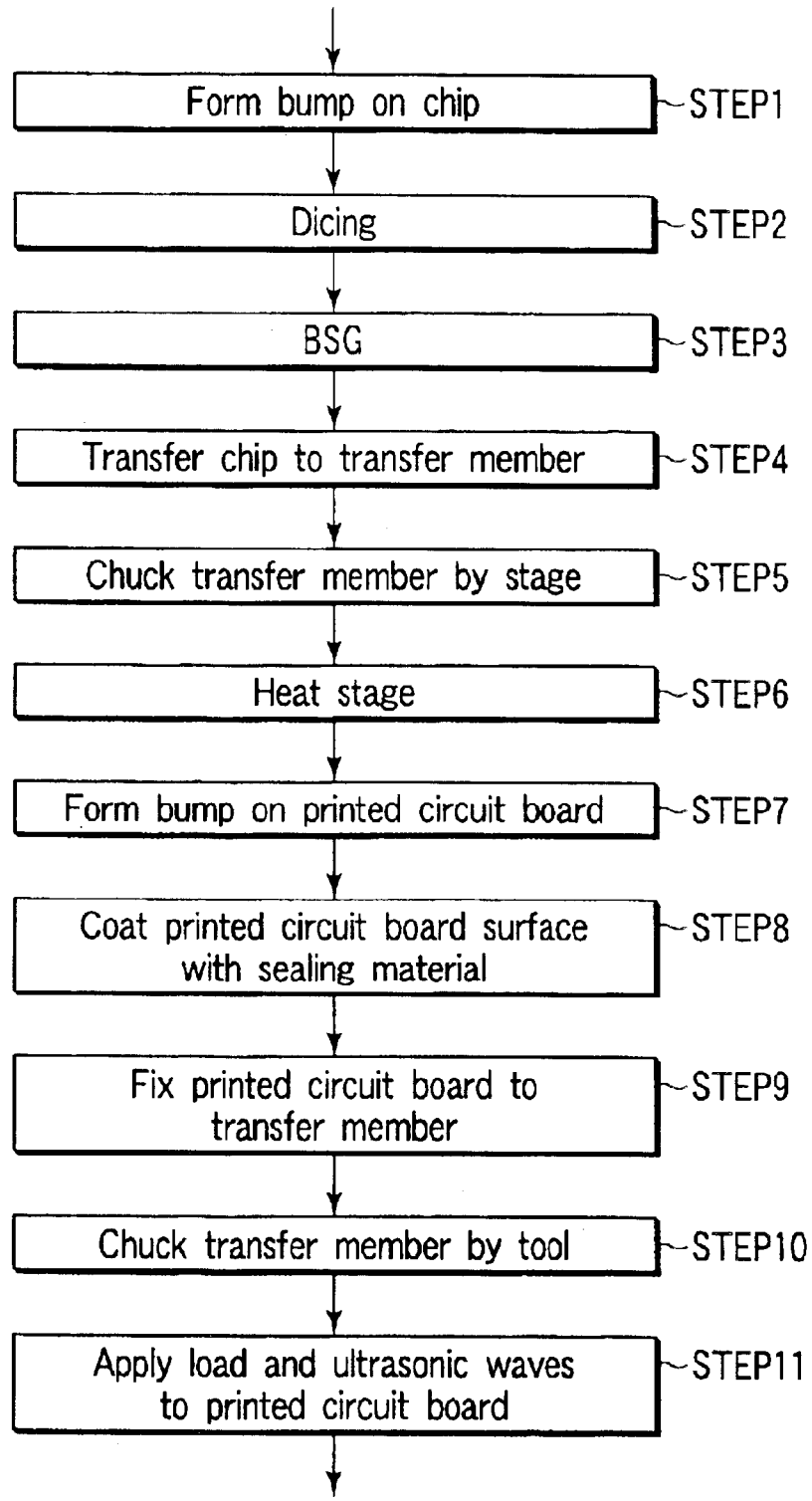
FIG. 62 is a flow chart showing a manufacturing process regarding the ultrasonic flip chip bonding technique for explaining a semiconductor device manufacturing method according to the 57th embodiment of the present invention.

FIG. 62 is a flow chart showing a manufacturing process regarding the ultrasonic flip chip bonding technique for explaining a semiconductor device manufacturing method according to the 57th embodiment of the present invention. Various elements are formed in a semiconductor substrate (wafer) by a known process. A stud bump 14 is formed on an electrode 13 of each semiconductor chip 12 of the wafer (STEP 1).

So-called half-cut dicing is performed to form a groove shallow enough not to reach the lower surface of the wafer from its element formation surface along a dicing line or scribe line by using a diamond scriber, diamond blade, laser scriber, or the like (STEP 2).

The lower surface of the wafer is ground with a grindstone (BSG: Back Side Grinding), simultaneously thinning the wafer and dividing it into chips (STEP 3). Even after the wafer is divided into chips, the lower surface is kept ground by at least 5 μm or more. This can remove a layer which is formed at the bottom of the groove and damaged by chipping or the like.

The chip 12 is fixed and transferred to a transfer member (STEP 4). The transfer member is chucked and fixed onto a porous stage 11 (STEP 5). In this state, the porous stage 11 is heated (STEP 6).

A stud bump is formed on a wiring electrode 17 of a printed circuit board 16 (STEP 7). The formation surface of the printed circuit board 16 for the wiring electrode 17 is coated with a sealing material 18 (STEP 8).

The printed circuit board 16 coated with the sealing material 18 is fixed to a transfer member (STEP 9), and the transfer member is chucked by a tool 15 (STEP 10).

The tool 15 is moved above the porous stage 11 which holds the chip 12, and aligned (this state corresponds to FIG. 1). As shown in FIG. 2, the tool 15 is moved down with the printed circuit board 16 facing down. While a load is applied to the printed circuit board 16, ultrasonic waves are applied at, e.g., a frequency of 40 kHz and a power of 2,480 W, mounting the printed circuit board 16 on the chip 12 (STEP 11). At this time, the space between the chip 12 and the printed circuit board 16 is filled with the sealing material 18, performing simultaneous flip chip connection including the sealing step.

According to this manufacturing method, ultrasonic waves are applied to the printed circuit board 16 more flexible than the chip 12. A defect in the chip 12 such as a scratch or crack can be suppressed to reduce damage in flip chip connection. Further, a sufficient load and ultrasonic waves having a power and frequency (amplitude) suitable for ultrasonic bonding can be applied, suppressing bump misalignment and improving the connectivity.

Since the chip 12 is chucked by the porous stage 11, damage to the chip in the use of a chuck hole can be avoided. Simultaneous connection including not only electrical connection between the chip 12 and the printed circuit board 16 but also the sealing step by setting of a sealing resin (liquid resin or resin sheet) can be realized.

Since the entire lower surface of the chip 12 is chucked and fixed using the porous stage 11, the chip warpage which readily occurs in thinning by grinding a lower wafer surface (BSG: Back Side Grinding) can be straightened. In fixing using a chuck hole, the corner of the chip 12 cannot be fully straightened. However, the use of a porous material enables perfect warpage straightening.

Flip chip connection performed while heating the porous stage 11 can promote and improve bonding.

The printed circuit board 16 is fixed to the transfer member, and the transfer member is chucked and fixed to the tool 15. The step of picking up the printed circuit board 16 in order to chuck the printed circuit board 16 by the tool 15 can be omitted.

[58th Embodiment]

Figure 63:
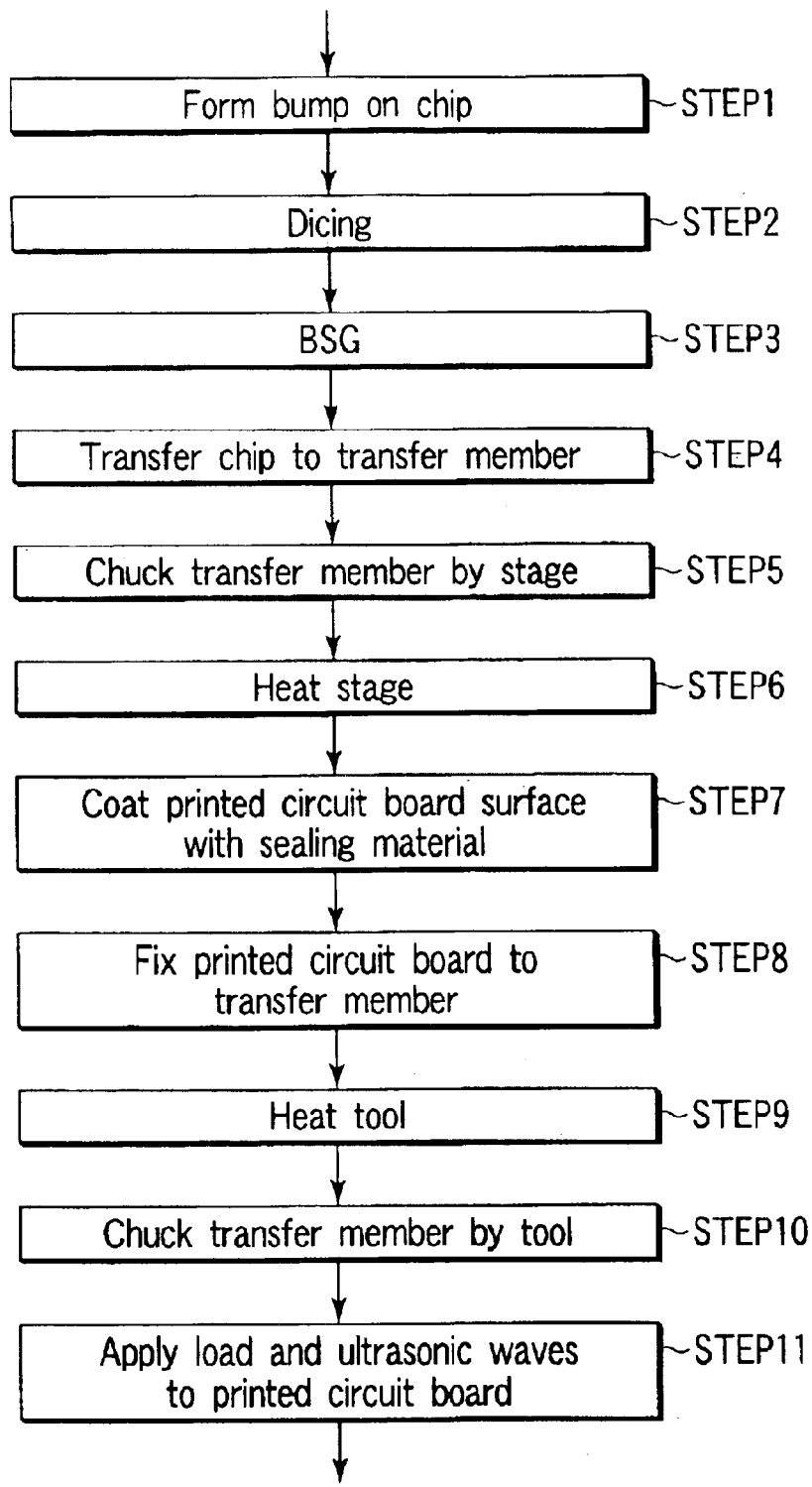
FIG. 63 is a flow chart showing a manufacturing process regarding the ultrasonic flip chip bonding technique for explaining a semiconductor device manufacturing method according to the 58th embodiment of the present invention.

FIG. 63 is a flow chart showing a manufacturing process regarding the ultrasonic flip chip bonding technique for explaining a semiconductor device manufacturing method according to the 58th embodiment of the present invention. Various elements are formed in a semiconductor substrate (wafer) by a known process. A stud bump 14 is formed on an electrode 13 of each semiconductor chip 12 of the wafer (STEP 1).

So-called half-cut dicing is performed to form a groove shallow enough not to reach the lower surface of the wafer from its element formation surface along a dicing line or scribe line by using a diamond scriber, diamond blade, laser scriber, or the like (STEP 2).

The lower surface of the wafer is ground with a grindstone (BSG: Back Side Grinding), simultaneously thinning the wafer and dividing it into chips (STEP 3). Even after the wafer is divided into chips, the lower surface is kept ground by at least 5 $\mu$m or more. This can remove a layer which is formed at the bottom of the groove and damaged by chipping or the like.

The chip 12 is fixed and transferred to a transfer member (STEP 4). The transfer member is chucked and fixed onto a porous stage 11 (STEP 5). In this state, the porous stage 11 is heated (STEP 6).

The formation surface of a printed circuit board 16 for a wiring electrode 17 is coated with a sealing material 18 (STEP 7). The printed circuit board 16 is fixed to a transfer member (STEP 8). A tool 15 is heated (STEP 9), and the transfer member is chucked by a tool 15 (STEP 10).

The tool 15 is moved above the porous stage 11 which holds the chip 12, and aligned (this state corresponds to FIG. 1). As shown in FIG. 2, the tool 15 is moved down with the printed circuit board 16 facing down. While a load is applied to the printed circuit board 16, ultrasonic waves are applied at, e.g., a frequency of 40 kHz and a power of 2,480 W, mounting the printed circuit board 16 on the chip 12 (STEP 11). At this time, the space between the chip 12 and the printed circuit board 16 is filled with the sealing material 18, performing simultaneous flip chip connection including the sealing step.

According to this manufacturing method, ultrasonic waves are applied to the printed circuit board 16 more flexible than the chip 12. A defect in the chip 12 such as a scratch or crack can be suppressed to reduce damage in flip chip connection. Further, a sufficient load and ultrasonic waves having a power and frequency (amplitude) suitable for ultrasonic bonding can be applied, suppressing bump misalignment and improving the connectivity.

Since the chip 12 is chucked by the porous stage 11, damage to the chip in the use of a chuck hole can be avoided. Simultaneous connection including not only electrical connection between the chip 12 and the printed circuit board 16 but also the sealing step by setting of a sealing resin (liquid resin or resin sheet) can be realized.

Since the entire lower surface of the chip 12 is chucked and fixed using the porous stage 11, the chip warpage which readily occurs in thinning by grinding a lower wafer surface (BSG: Back Side Grinding) can be straightened. In fixing using a chuck hole, the corner of the chip 12 cannot be fully straightened. However, the use of a porous material enables perfect warpage straightening.

Since both the porous stage 11 and tool 15 are heated, bonding can be further improved.

The printed circuit board 16 is fixed to the transfer member, and the transfer member is chucked and fixed to the tool 15. The step of picking up the printed circuit board 16 in order to chuck the printed circuit board 16 by the tool 15 can be omitted.

[59th Embodiment]

Figure 64:
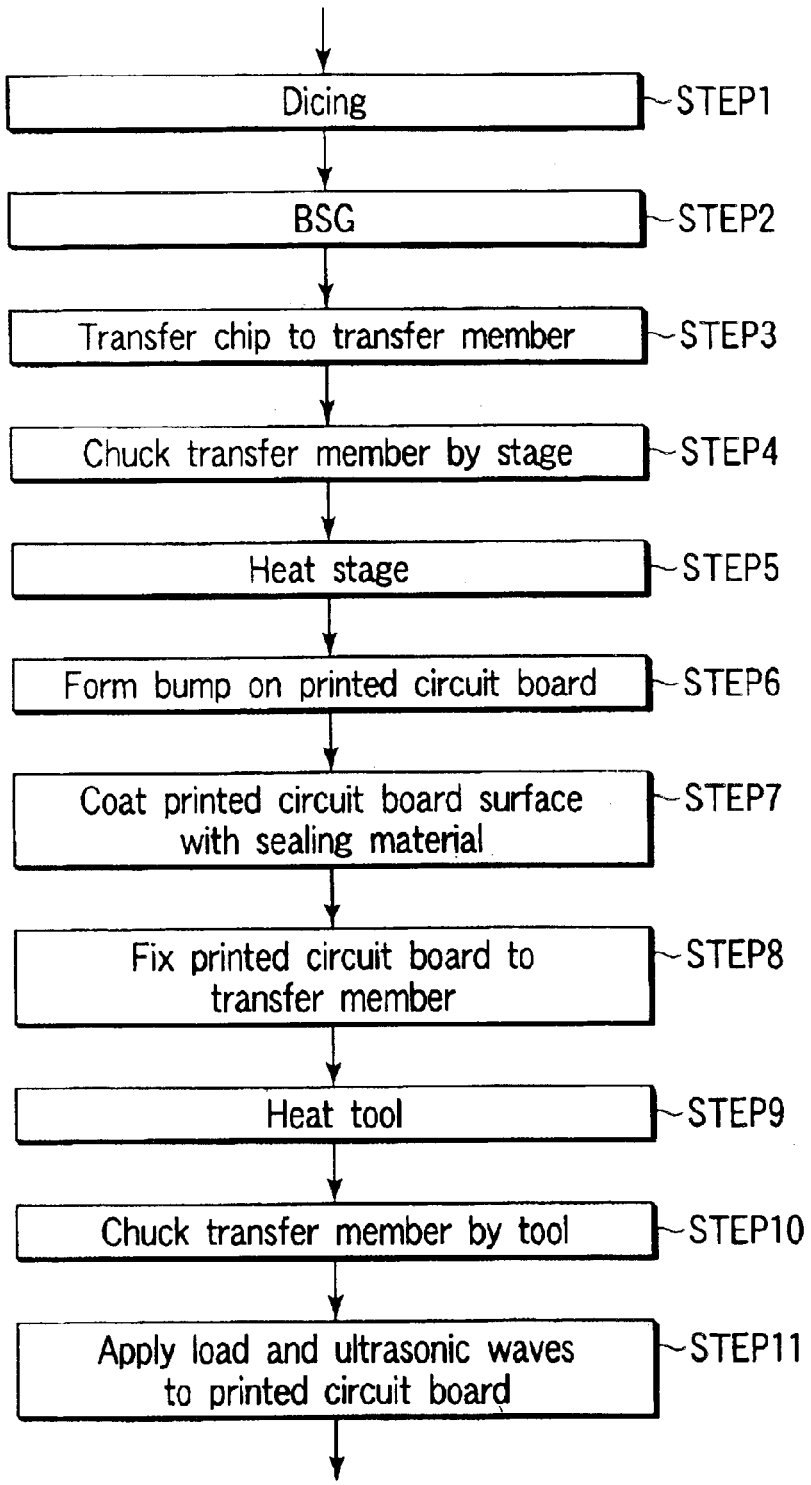
FIG. 64 is a flow chart showing a manufacturing process regarding the ultrasonic flip chip bonding technique for explaining a semiconductor device manufacturing method according to the 59th embodiment of the present invention.

FIG. 64 is a flow chart showing a manufacturing process regarding the ultrasonic flip chip bonding technique for explaining a semiconductor device manufacturing method according to the 59th embodiment of the present invention. Various elements are formed in a semiconductor substrate (wafer) by a known process. So-called half-cut dicing is performed to form a groove shallow enough not to reach the lower surface of the wafer from its element formation surface along a dicing line or scribe line by using a diamond scriber, diamond blade, laser scriber, or the like (STEP 1).

The lower surface of the wafer is ground with a grindstone (BSG: Back Side Grinding), simultaneously thinning the wafer and dividing it into chips (STEP 2). Even after the wafer is divided into chips, the lower surface is kept ground by at least 5 μm or more. This can remove a layer which is formed at the bottom of the groove and damaged by chipping or the like.

A chip 12 is fixed and transferred to a transfer member (STEP 3). The transfer member is chucked and fixed onto a porous stage 11 (STEP 4). In this state, the porous stage 11 is heated (STEP 5).

A stud bump is formed on a wiring electrode 17 of a printed circuit board 16 (STEP 6). The formation surface of the printed circuit board 16 for the wiring electrode 17 is coated with a sealing material 18 (STEP 7).

The printed circuit board 16 coated with the sealing material 18 is fixed to a transfer member (STEP 8). A tool 15 is heated (STEP 9), and chucks the transfer member (STEP 10).

The tool 15 is moved above the porous stage 11 which holds the chip 12, and aligned (this state corresponds to FIG. 1). As shown in FIG. 2, the tool 15 is moved down with the printed circuit board 16 facing down. While a load is applied to the printed circuit board 16, ultrasonic waves are applied at, e.g., a frequency of 40 kHz and a power of 2,480 W, mounting the printed circuit board 16 on the chip 12 (STEP 11). At this time, the space between the chip 12 and the printed circuit board 16 is filled with the sealing material 18, performing simultaneous flip chip connection including the sealing step.

According to this manufacturing method, ultrasonic waves are applied to the printed circuit board 16 more flexible than the chip 12. A defect in the chip 12 such as a scratch or crack can be suppressed to reduce damage in flip chip connection. Further, a sufficient load and ultrasonic waves having a power and frequency (amplitude) suitable for ultrasonic bonding can be applied, suppressing bump misalignment and improving the connectivity.

Since the chip 12 is chucked by the porous stage 11, damage to the chip in the use of a chuck hole can be avoided. Simultaneous connection including not only electrical connection between the chip 12 and the printed circuit board 16 but also the sealing step by setting of a sealing resin (liquid resin or resin sheet) can be realized.

Since the entire lower surface of the chip 12 is chucked and fixed using the porous stage 11, the chip warpage which readily occurs in thinning by grinding a lower wafer surface (BSG: Back Side Grinding) can be straightened. In fixing using a chuck hole, the corner of the chip 12 cannot be fully straightened. However, the use of a porous material enables perfect warpage straightening.

Since both the porous stage 11 and tool 15 are heated, bonding can be further improved.

The printed circuit board 16 is fixed to the transfer member, and the transfer member is chucked and fixed to the tool 15. The step of picking up the printed circuit board 16 in order to chuck the printed circuit board 16 by the tool 15 can be omitted.

[60th Embodiment]

Figure 65:
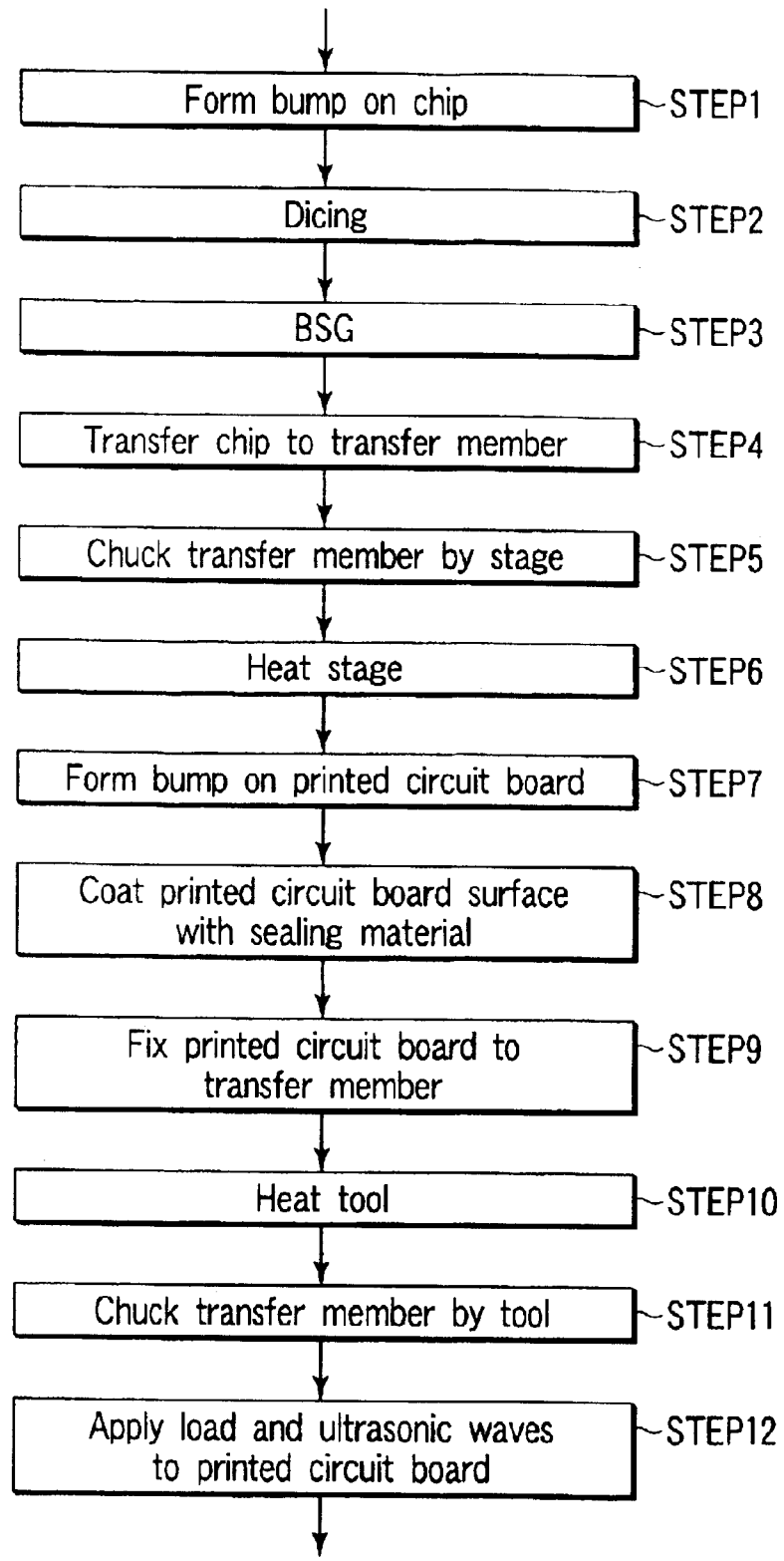
FIG. 65 is a flow chart showing a manufacturing process regarding the ultrasonic flip chip bonding technique for explaining a semiconductor device manufacturing method according to the 60th embodiment of the present invention.

FIG. 65 is a flow chart showing a manufacturing process regarding the ultrasonic flip chip bonding technique for explaining a semiconductor device manufacturing method according to the 60th embodiment of the present invention. Various elements are formed in a semiconductor substrate (wafer) by a known process. A stud bump 14 is formed on an electrode 13 of each semiconductor chip 12 of the wafer (STEP 1).

So-called half-cut dicing is performed to form a groove shallow enough not to reach the lower surface of the wafer from its element formation surface along a dicing line or scribe line by using a diamond scriber, diamond blade, laser scriber, or the like (STEP 2).

The lower surface of the wafer is ground with a grindstone (BSG: Back Side Grinding), simultaneously thinning the wafer and dividing it into chips (STEP 3). Even after the wafer is divided into chips, the lower surface is kept ground by at least 5 μm or more. This can remove a layer which is formed at the bottom of the groove and damaged by chipping or the like.

The chip 12 is fixed and transferred to a transfer member (STEP 4). The transfer member is chucked and fixed onto a porous stage 11 (STEP 5). In this state, the porous stage 11 is heated (STEP 6).

A stud bump is formed on a wiring electrode 17 of a printed circuit board 16 (STEP 7). The formation surface of the printed circuit board 16 for the wiring electrode 17 is coated with a sealing material 18 (STEP 8).

The printed circuit board 16 coated with the sealing material 18 is fixed to a transfer member (STEP 9). A tool 15 is heated (STEP 10), and chucks the transfer member (STEP 11).

The tool 15 is moved above the porous stage 11 which holds the chip 12, and aligned (this state corresponds to FIG. 1). As shown in FIG. 2, the tool 15 is moved down with the printed circuit board 16 facing down. While a load is applied to the printed circuit board 16, ultrasonic waves are applied at, e.g., a frequency of 40 kHz and a power of 2,480 W, mounting the printed circuit board 16 on the chip 12 (STEP 12). At this time, the space between the chip 12 and the printed circuit board 16 is filled with the sealing material 18, performing simultaneous flip chip connection including the sealing step.

According to this manufacturing method, ultrasonic waves are applied to the printed circuit board 16 more flexible than the chip 12. A defect in the chip 12 such as a scratch or crack can be suppressed to reduce damage in flip chip connection. Further, a sufficient load and ultrasonic waves having a power and frequency (amplitude) suitable for ultrasonic bonding can be applied, suppressing bump misalignment and improving the connectivity.

Since the chip 12 is chucked by the porous stage 11, damage to the chip in the use of a chuck hole can be avoided. Simultaneous connection including not only electrical connection between the chip 12 and the printed circuit board 16 but also the sealing step by setting of a sealing resin (liquid resin or resin sheet) can be realized.

Since the entire lower surface of the chip 12 is chucked and fixed using the porous stage 11, the chip warpage which readily occurs in thinning by grinding a lower wafer surface (BSG: Back Side Grinding) can be straightened. In fixing using a chuck hole, the corner of the chip 12 cannot be fully straightened. However, the use of a porous material enables perfect warpage straightening.

Since both the porous stage 11 and tool 15 are heated, bonding can be further improved.

The printed circuit board 16 is fixed to the transfer member, and the transfer member is chucked and fixed to the tool 15. The step of picking up the printed circuit board 16 in order to chuck the printed circuit board 16 by the tool 15 can be omitted.

The present invention has been described by the first to 60th embodiments. The present invention is not limited to the above-described embodiments, and can be variously modified without departing from the scope of the present invention in practical use.

For example, in each embodiment, a printed circuit board is supplied after a semiconductor chip is supplied. A semiconductor chip may be supplied after a printed circuit board is supplied. That is, the supply order of a semiconductor chip and printed circuit board can be properly changed depending on an apparatus which performs flip chip packaging.

In each embodiment, ultrasonic waves are applied to only a printed circuit board. Flip chip connection may be done by applying ultrasonic waves low enough not to damage a semiconductor chip at a power lower than that of ultrasonic waves applied to the printed circuit board. At this time, the directions and phases of ultrasonic waves applied to the printed circuit board and those applied to the semiconductor chip can be changed to increase the friction speed and improve connectivity. Not only the printed circuit board but also the semiconductor chip may be pressed. Flip chip connection can also be achieved by only ultrasonic vibrations without any pressure in accordance with the material and shape of a bump and the thicknesses of a semiconductor chip and printed circuit board.

The first to 24th embodiments and the 37th to 48th embodiments can also adopt the pre-dicing step as described in the 25th to 36th embodiments. A chip thinned in the pre-dicing step is readily damaged to a crack or the like in flip chip connection by applying ultrasonic waves. The application of the present invention can minimize the damage.

All bumps formed on the electrode 13 of the chip 12 and the wiring electrode 17 of the printed circuit board 16 are stud bumps. A plated bump, ball bump, printed bump, and the like can be used. When bumps are to be formed on the electrode 13 and wiring electrode 17, a combination of different types of bumps can also be employed. A stud bump can be formed at a low cost, a plated bump can suppress the connection height, and a ball bump and printed bump can increase the connection height. These bumps are selected in accordance with the purpose of use.

In each embodiment, a printed circuit board is faced down and mounted on a semiconductor chip on the stage. The present invention can also be applied to a case wherein a semiconductor chip is faced down and mounted on a printed circuit board on the stage. Also in this case, flip chip connection is performed by applying ultrasonic waves to the printed circuit board. Alternatively, flip chip connection is done by applying ultrasonic waves to the printed circuit board and applying, to the semiconductor chip, ultrasonic waves low enough not to generate any damage such as a scratch or crack in the semiconductor chip at a power lower than that of ultrasonic waves applied to the printed circuit board. Also in this case, the same operation effects can be obtained.

As described above, according to one aspect of this invention, a semiconductor device manufacturing method capable of improving the connectivity while reducing damage to a semiconductor chip can be provided.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device manufacturing method comprising:
    forming a bump on at least one of a semiconductor chip and a printed circuit board;
    applying a sealing material to a surface of one of the semiconductor chip and the printed circuit board;
    fixing a surface of the semiconductor chip opposite to an element formation surface to a porous stage by porous chucking;
    chucking a surface of the printed circuit board opposite to a wiring electrode formation surface by a tool;
    moving down the tool toward the porous stage, facing down the printed circuit board on the semiconductor chip, and thereby opposing the semiconductor chip to the printed circuit board via the bump; and
    flip-chip-connecting the printed circuit board to the semiconductor chip via the sealing material while applying ultrasonic waves to the printed circuit board to promote bonding by the bump,
    wherein the flip-chip-connecting includes electrically connecting the semiconductor chip and the printed circuit board via the bump, and sealing the semiconductor chip and the printed circuit board by the sealing material.

2. The method according to claim 1, wherein flip chip connection is executed by pressing at least one of the printed circuit board and the semiconductor chip.

3. The method according to claim 1, further comprising heating at least one of the stage and the tool.

4. The method according to claim 1, which further comprises fixing the semiconductor chip to a transfer member, and in which the transfer member is chucked and fixed to the stage.

5. The method according to claim 1, which further comprises fixing the printed circuit board to a transfer member, and in which, in flip chip connection, the transfer member is chucked and fixed to the tool to fix the semiconductor chip.

6. The method according to claim 1, wherein the bump includes any one of a plated bump, a stud bump, a ball bump, and a printed bump.

7. The method according to claim 1, further comprising, before the forming the bump:
    forming an element on a wafer;
    forming a groove along a dicing line or a scribing line of the wafer, the groove being shallow enough not to reach, from the element formation surface, the surface opposite to the element formation surface of the wafer; and
    grinding the surface opposite to the element formation surface of the wafer, and simultaneously thinning the wafer and dividing it into chips.

8. A semiconductor device manufacturing method comprising:
    forming a bump on at least one of a semiconductor chip and a printed circuit board;
    applying a sealing material to a surface of one of the semiconductor chip and the printed circuit board; and
    flip-chip-connecting the printed circuit board to the semiconductor chip via the sealing material while applying a first ultrasonic wave to the printed circuit board and applying a second ultrasonic wave to the semiconductor chip at a power lower than a power of the first ultrasonic wave to promote bonding by the bump.

9. The method according to claim 8, wherein flip chip connection is executed by facing down the printed circuit board on the semiconductor chip.

10. The method according to claim 8, wherein the semiconductor chip is fixed on a stage.

11. The method according to claim 8, wherein flip chip connection is executed by pressing at least one of the printed circuit board and the semiconductor chip.

12. The method according to claim 8, which further comprises chucking by a stage a surface of the semiconductor chip opposite to an element formation surface to fix the semiconductor chip, and chucking by a tool a surface of the printed circuit board opposite to a wiring electrode formation surface, and in which flip chip connection includes moving down the tool toward the stage, electrically connecting the semiconductor chip and the printed circuit board via the bump, and sealing the semiconductor chip and the printed circuit board by the sealing material.

13. The method according to claim 12, further comprising heating at least one stage and the tool.

14. The method according to claim 12, wherein the chucking by stage is chucking by porous chucking.

15. The method according to claim 12, which further comprises fixing the semiconductor chip to a transfer member, and in which the transfer member is chucked and fixed to the stage.

16. The method according to claim 12, which further comprises fixing the printed circuit board to a transfer member, and in which, in flip chip connection, the transfer member is chucked and fixed to the tool to fix the semiconductor chip.

17. The method according to claim 8, wherein the bump includes any one of a plated bump, a stud bump, a ball bump, and a printed bump.

* * * * *